US010062840B2

(12) United States Patent
Sim et al.

(10) Patent No.: US 10,062,840 B2
(45) Date of Patent: Aug. 28, 2018

(54) VARIABLE RESISTANCE MEMORY DEVICES AND METHODS OF MANUFACTURING THE SAME

(71) Applicant: Samsung Electronics Co., Ltd., Suwon-si, Gyeonggi-do (KR)

(72) Inventors: Kyu-Rie Sim, Hwaseong-si (KR); Dae-Hwan Kang, Seoul (KR); Gwan-Hyeob Koh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/332,042

(22) Filed: Oct. 24, 2016

(65) Prior Publication Data
US 2017/0250339 A1    Aug. 31, 2017

(30) Foreign Application Priority Data

Feb. 25, 2016 (KR) .......................... 10-2016-0022344

(51) Int. Cl.
| | |
|---|---|
| H01L 45/00 | (2006.01) |
| H01L 43/08 | (2006.01) |
| H01L 43/10 | (2006.01) |
| H01L 27/24 | (2006.01) |

(52) U.S. Cl.
CPC .......... *H01L 45/1233* (2013.01); *H01L 43/08* (2013.01); *H01L 43/10* (2013.01); *H01L 45/06* (2013.01); *H01L 45/141* (2013.01); *H01L 45/1608* (2013.01)

(58) Field of Classification Search
CPC ..... H01L 27/2481; H01L 45/06; H01L 43/08; H01L 27/2463; H01L 27/2427; H01L 45/1233; H01L 45/141; H01L 45/144; G11C 13/0002
USPC ........................................................ 257/4, 5
See application file for complete search history.

(56) References Cited

U.S. PATENT DOCUMENTS

| | | | |
|---|---|---|---|
| 6,914,255 B2 | 7/2005 | Lowrey | |
| 8,093,577 B2 * | 1/2012 | Lowrey | ............... H01L 27/2409 257/4 |
| 8,288,752 B2 | 10/2012 | Park | |
| 8,536,559 B2 | 9/2013 | Chen | |
| 8,569,733 B2 | 10/2013 | Yasutake | |
| 8,586,443 B2 | 11/2013 | Lee | |
| 9,153,777 B2 | 10/2015 | Boniardi et al. | |
| 2008/0304308 A1 * | 12/2008 | Stipe | ................. G11C 13/0007 365/51 |
| 2010/0227449 A1 * | 9/2010 | Kim | .................... H01L 27/1021 438/382 |

(Continued)

*Primary Examiner* — Johannes P Mondt
(74) *Attorney, Agent, or Firm* — Harness, Dickey, & Pierce, P.L.C.

(57) ABSTRACT

A variable resistance memory device includes first memory cells and second memory cells. The first memory cells are between first and second conductive lines, and at areas at which the first and second conductive lines overlap. The second memory cells are between the second and third conductive lines, and at areas at which the second and third conductive lines overlap. Each first memory cell includes a first variable resistance pattern and a first selection pattern. Each second memory cell includes a second variable resistance pattern and a second selection pattern. At least one of the second memory cells is shifted from a closest one of the first memory cells.

16 Claims, 59 Drawing Sheets

(56) References Cited

U.S. PATENT DOCUMENTS

| | | |
|---|---|---|
| 2010/0327251 A1 | 12/2010 | Park |
| 2011/0068314 A1 | 3/2011 | Takahashi et al. |
| 2012/0161096 A1 | 6/2012 | Pellizzer et al. |
| 2012/0201073 A1* | 8/2012 | Berger .................... G11C 11/16 365/158 |
| 2014/0374686 A1 | 12/2014 | Pangal et al. |
| 2015/0280118 A1 | 10/2015 | Lee et al. |

* cited by examiner

VARIABLE RESISTANCE MEMORY DEVICES AND METHODS OF MANUFACTURING THE SAME

CROSS-REFERENCE TO RELATED APPLICATION

This application claims priority under 35 USC § 119 to Korean Patent Application No. 10-2016-0022344, filed on Feb. 25, 2016 in the Korean Intellectual Property Office (KIPO), the contents of which are herein incorporated by reference in their entirety.

BACKGROUND

Field

One or more example embodiments relate to variable resistance memory devices and/or methods of manufacturing the same. For example, at least some example embodiments relate to variable resistance memory devices including a plurality of memory cells and/or methods of manufacturing the same.

Description of the Related Art

Recently, memory devices having variable resistance characteristics have been developed. Such memory devices include, for example, phase-change random access memory (PRAM) devices, resistive random access memory (Re-RAM) devices, and magnetic random access memory (MRAM) devices.

In the memory devices mentioned above, memory cells including selection elements and variable resistance elements may be formed between lower and upper electrodes or between lower and upper conductive lines.

SUMMARY

One or more example embodiments provide variable resistance memory devices having improved and/or enhanced operational reliability.

One or more example embodiments provide methods of manufacturing variable resistance memory devices having improved and/or enhanced operational reliability.

At least one example embodiment provides a variable resistance memory device, comprising: first conductive lines arranged in a first direction on a substrate, each of the first conductive lines extending in a second direction crossing the first direction, and the first and second directions being parallel to an upper surface of the substrate; second conductive lines arranged in the second direction on the first conductive lines, each of the second conductive lines extending in the first direction; third conductive lines arranged in the first direction on the second conductive lines, each of the third conductive lines extending in the second direction; first memory cells between the first and second conductive lines, the first memory cells at respective areas at which the first and second conductive lines overlap in a third direction, the third direction substantially perpendicular to the upper surface of the substrate, and each of the first memory cells including a first variable resistance pattern and a first selection pattern; and second memory cells between the second and third conductive lines, the second memory cells at respective areas at which the second and third conductive lines overlap in the third direction, and each of the second memory cells including a second variable resistance pattern and a second selection pattern. At least one of the second memory cells is shifted from a closest one of the first memory cells in the first direction or in the second direction in a plan view.

At least one other example embodiment provides a variable resistance memory device, comprising: first conductive lines arranged in a first direction on a substrate, each of the first conductive lines extending in a second direction crossing the first direction, and the first and second directions being parallel to an upper surface of the substrate; second conductive lines arranged in the second direction on the first conductive lines, each of the second conductive lines extending in the first direction; third conductive lines arranged in the first direction on the second conductive lines, each of the third conductive lines extending in the second direction; first memory cells between the first and second conductive lines, the first memory cells at respective areas at which the first and second conductive lines overlap in a third direction, the third direction substantially perpendicular to the upper surface of the substrate, and each of the first memory cells including a first variable resistance pattern; and second memory cells between the second and third conductive lines, the second memory cells at respective areas at which the second and third conductive lines overlap in the third direction, and each of the second memory cells including a second variable resistance pattern. The second memory cells do not overlap the first memory cells in the third direction.

At least one other example embodiment provides a variable resistance memory device, comprising: first conductive lines arranged in a first direction on a substrate, each of the first conductive lines extending in a second direction crossing the first direction, and the first and second directions being parallel to an upper surface of the substrate; second conductive lines arranged in the second direction on the first conductive lines, each of the second conductive lines extending in the first direction; third conductive lines arranged in the first direction on the second conductive lines, each of the third conductive lines extending in the second direction; first memory cells between the first and second conductive lines, the first memory cells at respective areas at which the first and second conductive lines overlap in a third direction, the third direction substantially perpendicular to the upper surface of the substrate, and each of the first memory cells including a first variable resistance pattern and a first selection pattern; and second memory cells between the second and third conductive lines, the second memory cells at respective areas at which the second and third conductive lines overlap in the third direction, and each of the second memory cells including a second variable resistance pattern and a second selection pattern. A portion of a lower surface of at least one of the second memory cells overlaps a portion of an upper surface of at least one of the first memory cells in the third direction.

At least one other example embodiment provides a semiconductor device comprising: a plurality of memory cells arranged in a plurality of rows and columns on a surface of a substrate, the plurality of rows of memory cells arranged in a first direction parallel to the surface of the substrate and the plurality of columns of memory cells arranged in a second direction parallel to the surface of the substrate, at least a first of the plurality of rows of memory cells including a plurality of upper memory cells and a plurality of lower memory cells, the plurality of upper memory cells arranged at a first distance from the surface of the substrate in a third direction, and the plurality of lower memory cells arranged at a second distance from the surface of the substrate in the third direction. The first direction, the second direction and the third direction are perpendicular to one another. The plurality of upper memory cells are not aligned with the plurality of lower memory cells in the third direction. The first distance is greater than the second distance.

In variable resistance memory devices including a plurality of memory cells vertically stacked in accordance with example embodiments, the upper and lower memory cells may be shifted from each other or may be disposed in a zigzag pattern. Thus, the physical distances between the upper and lower memory cells may be increased without increasing the height of the metal wirings. Accordingly, the thermal disturbance between the upper and lower memory cells may be reduced and/or prevented, and the variable resistance memory device may have improved and/or enhanced operational reliability.

BRIEF DESCRIPTION OF THE DRAWINGS

Example embodiments will be more clearly understood from the following detailed description taken in conjunction with the accompanying drawings.

FIG. 1 is a plan view illustrating a variable resistance memory device in accordance with example embodiments;

FIGS. 32A and 32B to 40A and 40B are cross-sectional views illustrating stages of another method of manufacturing a variable resistance memory device according to example embodiments;

FIGS. 43A and 43B to 50A and 50B are cross-sectional views illustrating stages of another method of manufacturing a variable resistance memory device according to example embodiments;

FIG. 53 is a cross-sectional view illustrating another variable resistance memory device in accordance with example embodiments.

DETAILED DESCRIPTION

Figure 1:
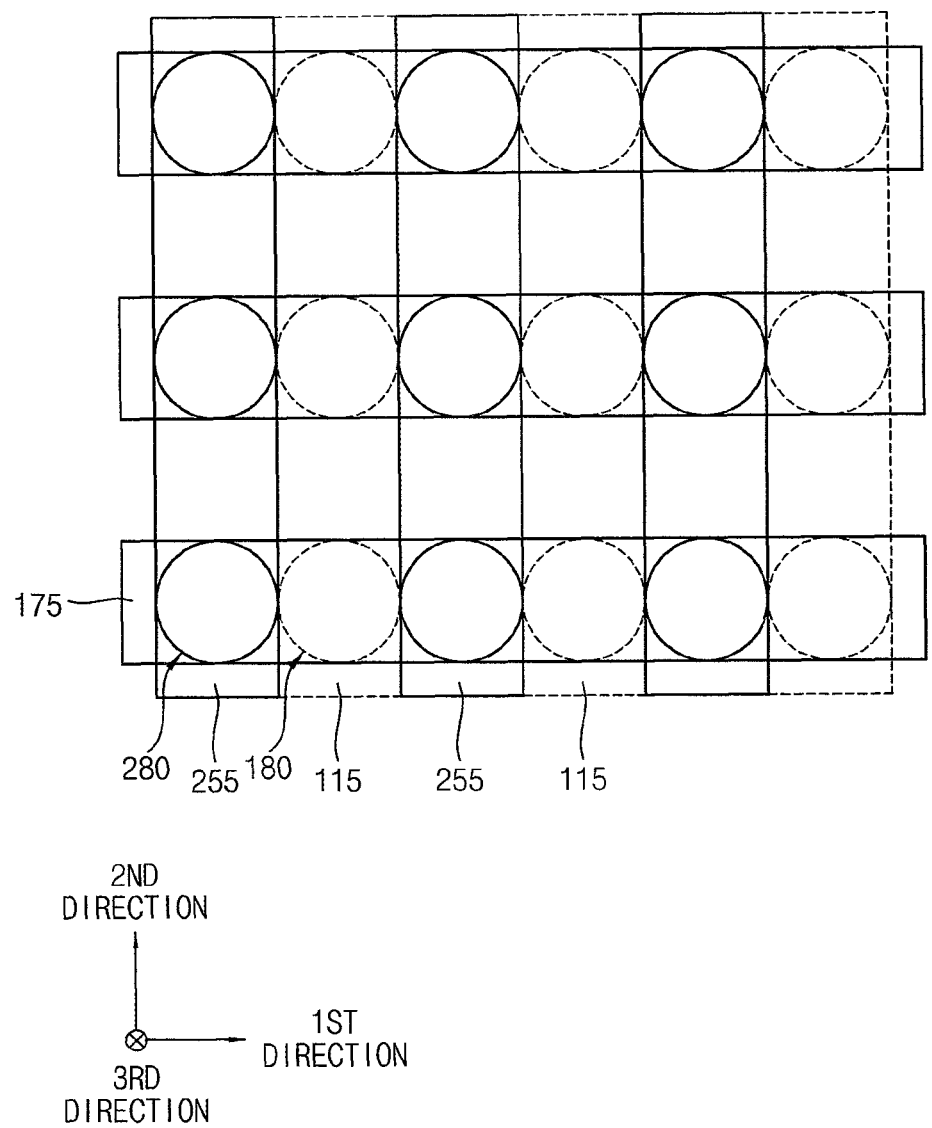
FIGS. 1 to 53 represent non-limiting, example embodiments as described herein.
Figure 2:
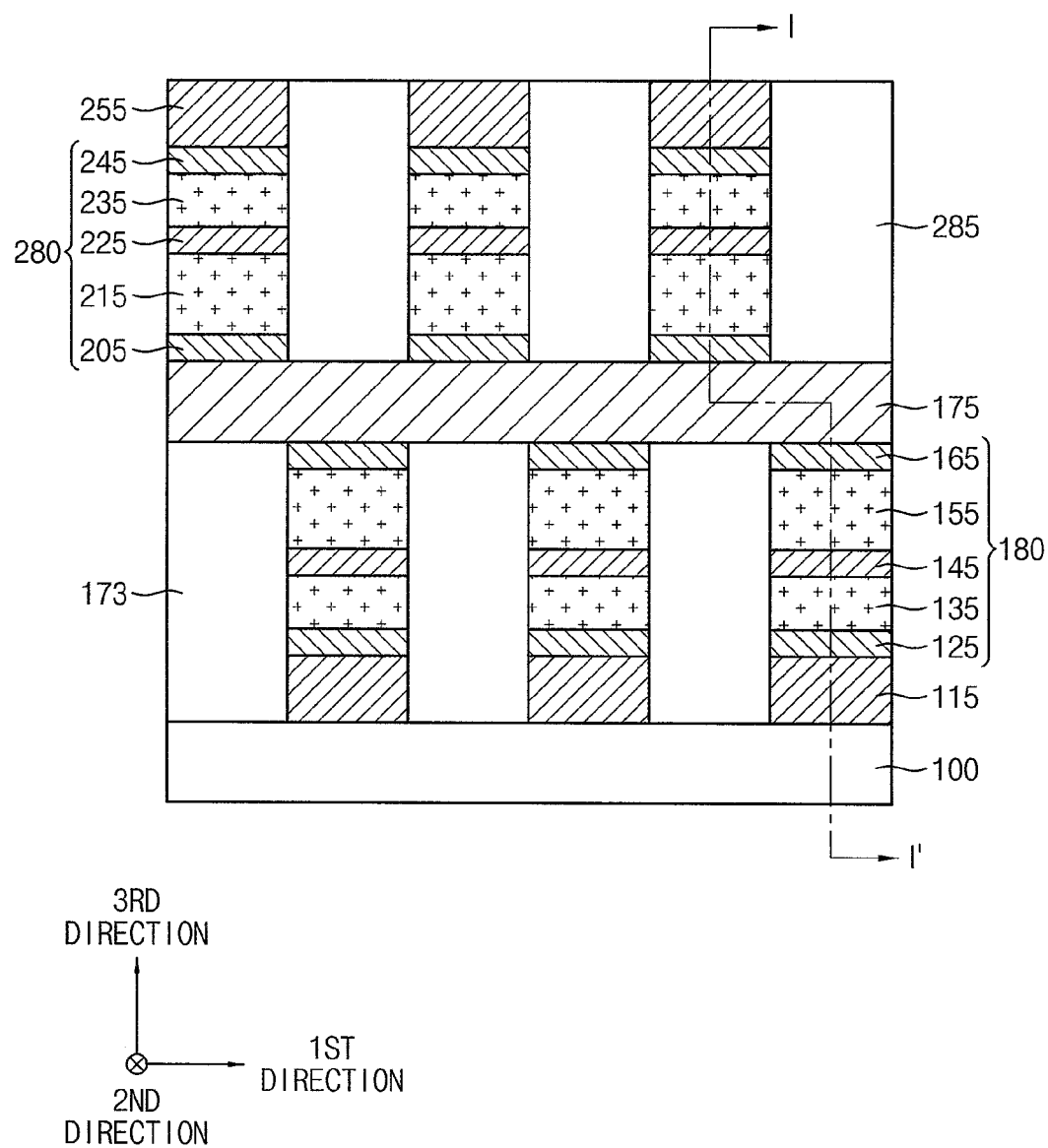
FIGS. 2 and 3 are cross-sectional views of the variable resistance memory device shown in FIG. 1.
Figure 3:
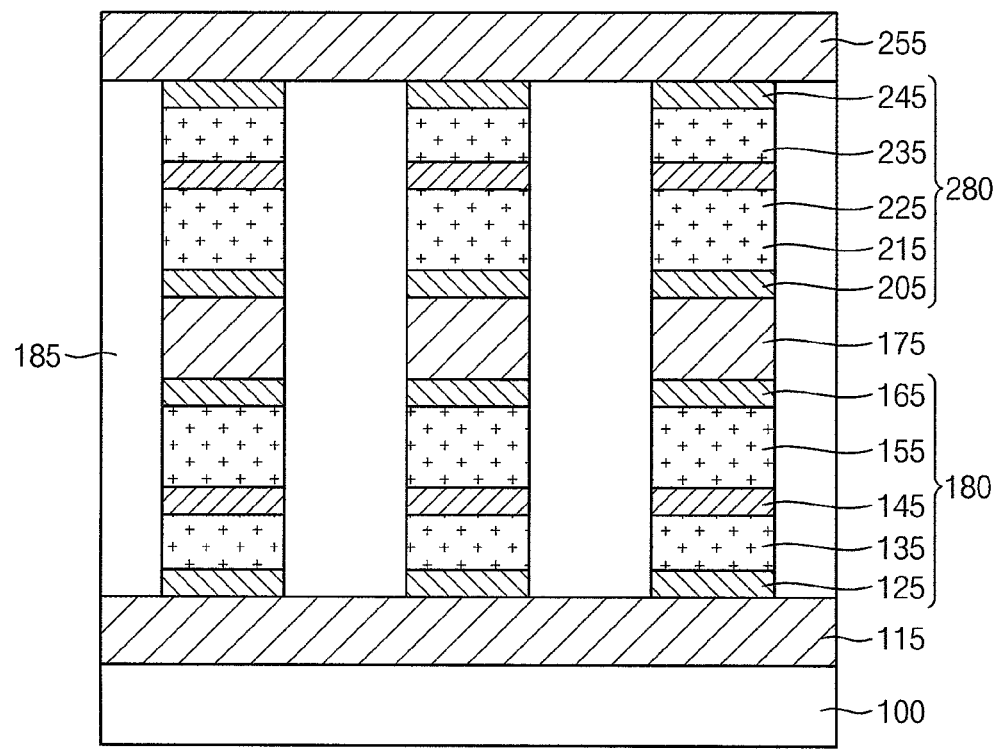

FIG. 1 is a plan view illustrating a variable resistance memory device in accordance with example embodiments. FIGS. 2 and 3 are cross-sectional views of the variable resistance memory device shown in FIG. 1. More specifically, FIG. 2 is a cross-sectional view taken along a first direction, and FIG. 3 is a cross-sectional view taken along a line I-I' in FIG. 2.

Hereinafter, two directions parallel or substantially parallel to an upper surface of a substrate and crossing each other may be defined as first and second directions, respectively, and a direction perpendicular or substantially perpendicular to the upper surface of the substrate may be defined as a third direction. In example embodiments, the first and second directions may cross each other at a right angle so as to be perpendicular or substantially perpendicular to each other.

FIGS. 1 to 3 show a variable resistance memory device having a stacked structure of a cross-point cell array in which memory cells are disposed at respective areas where conductive lines overlap with each other in the third direction. FIGS. 1 to 3 show the variable resistance memory device having a stacked structure in which the memory cells are stacked in two levels, however, inventive concepts may not be limited thereto, and thus, for example, the variable resistance memory device may have a stacked structure in which the memory cells are stacked in more than two levels.

Referring to FIGS. 1 to 3, the variable resistance memory device may include a first conductive line 115, a second conductive line 175, and a third conductive line 255 spaced apart from each other in the third direction. A first memory cell 180 may be disposed at each area where the first and second conductive lines 115 and 175 overlap with each other in the third direction, and a second memory cell 280 may be disposed at each area where the second and third conductive lines 175 and 255 overlap with each other in the third direction.

In example embodiments, the first and third conductive lines 115 and 255 may serve as word lines of the variable resistance memory device, and the second conductive line 175 may serve as a bit line of the variable resistance memory device. Alternatively, the first and third conductive lines 115 and 255 may serve as bit lines of the variable resistance memory device, and the second conductive line 175 may serve as a word line of the variable resistance memory device.

The substrate 100 may include a semiconductor material, e.g., silicon, germanium, silicon-germanium, etc., or III-V semiconductor compounds, e.g., GaP, GaAs, GaSb, etc. In at least some example embodiments, the substrate 100 may be a silicon-on-insulator (SOI) substrate, or a germanium-on-insulator (GOI) substrate. A well region (not shown) doped with p-type impurities or n-type impurities may be formed at an upper portion of the substrate 100.

Peripheral circuits (not shown) including, e.g., transistors, contact plugs, wirings, etc. may be formed on the substrate 100, and may be at least partially covered by a lower insulation layer (not shown) on the substrate 100.

The first conductive line 115 may be disposed on the substrate 100. For example, the first conductive line 115 may be formed on the lower insulation layer, and may be electrically connected to the peripheral circuits.

The first conductive line 115 may extend in the second direction, and a plurality of first conductive lines 115 may be formed to be spaced apart from each other in the first direction.

The second conductive line 175 may be disposed over the first conductive line 115 and spaced apart from the first conductive line 115 in the third direction. The second conductive line 175 may extend in the first direction, and a plurality of second conductive lines 175 may be spaced apart from each other in the second direction.

The third conductive line 255 may be disposed over the second conductive line 175 and spaced apart from the second conductive line 175 in the third direction. The third conductive line 255 may extend in the second direction, and a plurality of third conductive lines 255 may be spaced apart from each other in the first direction.

The first to third conductive lines 115, 175 and 255 may include a metal, e.g., tungsten, copper, aluminum, titanium, tantalum, etc.

The first memory cell 180 may be formed between the first and second conductive lines 115 and 175, specifically, at each area where the first and second conductive lines 115 and 175 overlap with each other in the third direction. Thus, a plurality of first memory cells 180 may be formed in each of the first and second directions to define a first cross-point cell array.

For example, a plurality of first memory cells 180 disposed in the first direction may define a first memory cell row. Additionally, a plurality of first memory cells 180 disposed in the second direction may define a first memory cell column.

In example embodiments, the first memory cell 180 may include a first lower electrode 125, a first selection pattern 135, a first intermediate electrode 145, a first variable resistance pattern 155 and a first upper electrode 165 sequentially stacked. In example embodiments, the first lower electrode 125 or the first upper electrode 165 may not be formed, but omitted.

The first lower electrode 125 may contact an upper surface of the first conductive line 115. The first lower electrode 125 may include a metal or a metal nitride, e.g., titanium, titanium nitride, etc.

The first selection pattern 135 may be formed on an upper surface of the first lower electrode 125. In example embodiments, the first selection pattern 135 may include a material having a changing resistance in an amorphous state between the first lower electrode 125 and the first intermediate electrode 145. For example, a relatively high resistance state, e.g., an off-state and a relatively low resistance state, e.g., an on-state may be reversibly repeated in the first selection pattern 135.

In example embodiments, the first selection pattern 135 may include an ovonic threshold switch (OTS) material. In an example embodiment, the first selection pattern 135 may include arsenic, and may further include at least two of silicon, germanium, antimony, tellurium, selenium, indium and tin. In an example embodiment, the first selection pattern 135 may include selenium, and may further include at least two of arsenic, silicon, germanium, antimony, tellurium, indium and tin.

In an example embodiment, the first selection pattern 135 may include, e.g., AsTeGeSiIn, GeTe, SnTe, GeSe, SnSe, AsTeGeSiSbS, AsTeGeSiP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSb-TeSe, GeBiTeSe, GeAsSbSe, GeAsBiTe, GeAsBiSe, $Ge_xSe_{1-x}$, etc. In an example embodiment, the first selection pattern 135 may further include dopants, e.g., nitrogen and/or sulfur.

Alternatively, the first selection pattern 135 may include a polysilicon layer doped with n-type impurities and a polysilicon layer doped with p-type impurities sequentially stacked, e.g., a diode.

The first intermediate electrode 145 may heat the first variable resistance pattern 155. The first intermediate electrode 145 may include a conductive material having a resistance greater than that of the first lower electrode 125.

The first intermediate electrode 145 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc. In example embodiments, the first intermediate electrode 145 may include carbon, a metal containing carbon, or a metal nitride containing carbon. For example, the first intermediate electrode 145 may include carbon, carbonitride, titanium carbonitride and/or tantalum carbonitride.

The first variable resistance pattern 155 may include a material whose phase may be changed due to the temperature difference caused by the Joule heat transferred from the first intermediate electrode 145, and thus the phase of the first variable resistance pattern 155 may be changed due to the temperature difference. A resistance of the first variable resistance pattern 155 may be changed by the phase change of the first variable resistance pattern 155, and thus the first variable resistance pattern 155 or the first memory cell 180 may be converted from a set state into a reset state, or vice versa. In this case, the variable resistance memory device may be a phase-change random access memory (PRAM) device.

In an example embodiment, the first variable resistance pattern 155 may include a chalcogenide material containing germanium, antimony and/or tellurium. In an example embodiment, the first variable resistance pattern 155 may include a super lattice having a germanium-tellurium layer and an antimony-tellurium layer alternately stacked. In an example embodiment, the first variable resistance pattern 155 may include IST containing indium-antimony-tellurium or BST containing bismuth-antimony-tellurium.

In example embodiments, the first variable resistance pattern 155 may include a material whose resistance may be changed by a magnetic field or a spin transfer torque (STT). In this case, the variable resistance memory device may be a magnetic random access memory (MRAM) device.

For example, the first variable resistance pattern 155 may include a ferromagnetic material, e.g., iron (Fe), nickel (Ni), cobalt (Co), dysprosium (Dy), gadolinium (Gd) or the like.

In example embodiments, the first variable resistance pattern 155 may include a perovskite-based material or a transition metal oxide. In this case, the variable resistance memory device may be a resistive random access memory (ReRAM) device.

The perovskite-based material may include, e.g., STO ($SrTiO_3$), BTO ($BaTiO_3$), PCMO ($Pr_{1-x}Ca_xMnO_3$) or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx). These may be used alone or in combination.

The first upper electrode 165 may be formed on the first variable resistance pattern 155, and may contact a lower surface of the second conductive line 175. The first upper electrode 165 may include a material that is the same as, substantially the same as, or similar to, that of the first lower electrode 125.

As illustrated in FIG. 2, a first insulation pattern 173 may be formed between neighboring ones of the first memory cell columns in the first direction. For example, the first insulation pattern 173 may extend in the second direction between the first memory cell columns. The first insulation pattern 173 may include, e.g., silicon oxide.

A second cross-point cell array including a plurality of second memory cells 280 may be formed over the first cross-point cell array. In example embodiments, the plurality of second memory cells 280 may be formed at respective areas where the second and third conductive lines 175 and 255 overlap with each other in the third direction.

For example, a plurality of second memory cells 280 disposed in the first direction may define a second memory cell row. Additionally, a plurality of second memory cells 280 disposed in the second direction may define a second memory cell column.

In example embodiments, the second memory cell 280 may include a second lower electrode 205, a second selection pattern 215, a second intermediate electrode 225, a second variable resistance pattern 235 and a second upper electrode 245 sequentially stacked. In example embodiments, the second lower electrode 205 or the second upper electrode 245 may not be formed but omitted.

The second lower electrode 205, the second selection pattern 215, the second intermediate electrode 225, the second variable resistance pattern 235 and the second upper electrode 245 may include materials that are the same or substantially the same as those of the first lower electrode 125, the first selection pattern 135, the first intermediate electrode 145, the first variable resistance pattern 155 and the first upper electrode 165, respectively.

As illustrated in FIG. 2, a third insulation pattern 285 may be formed between neighboring ones of the second memory cell columns in the first direction. For example, the third insulation pattern 285 may extend in the second direction between the first memory cell columns. The third insulation pattern 285 may include, e.g., silicon oxide.

In example embodiments, the first memory cells 180 and the second memory cells 280 may be disposed in a zigzag pattern or offset or shifted from each other in the third direction.

In an example embodiment, at least one of the second memory cells 280 and a closest one of the first memory cells 180 thereto may be disposed in a zigzag pattern or offset or shifted from each other in the third direction.

In an example embodiment, as shown in FIGS. 1 and 2, one of the first memory cell rows and one of the second memory cell rows may share one of the second conductive lines 175. The first and second memory cell rows sharing the second conductive line 175 may define a memory cell row.

In the memory cell row, the first memory cells 180 and the second memory cells 280 may be alternately disposed in a row direction, e.g., in the first direction. Thus, the first memory cells 180 and the second memory cells 280 may be disposed in a zigzag pattern in the first direction.

As shown in FIGS. 1 and 2, the first memory cells 180 may be disposed between the second memory cells 280 in a plan view. For example, the first memory cells 180 and the second memory cells 280 may not overlap with each other in the third direction or in a plan view.

In an example embodiment, the second memory cell row on the second conductive line 175 may be shifted from the first memory cell row by a given distance. For example, the given distance may be a width in the first direction of one of the first memory cells 180 or one of the second memory cells 280.

As illustrated above, in the stacked cross-point cell array structure, the first and second memory cells 180 and 280 may be disposed in a zigzag pattern, so that physical distances between the first and second memory cells 180 and 280 may be increased.

If the first and second memory cells 180 and 280 are disposed to overlap with each other in the third direction, for example, the Joule heat generated from the second memory cell 280 may be directly transferred to the underlying first memory cell 180. Thus, the operations of the first and second memory cells 180 and 280 may be disturbed by a thermal disturbance in the third direction.

However, in accordance with example embodiments, the first and second memory cells 180 and 280 may be disposed in a zigzag pattern so that the physical distances or thermal distances between the first and second memory cells 180 and 280 may be increased to enhance the operational reliability of the first and second memory cells 180 and 280 disposed in the stacked cross-point array structure.

As shown in FIG. 3, a second insulation pattern 185 may be formed between neighboring memory cell rows in the second direction. In an example embodiment, the second insulation pattern 185 may penetrate through the first and second cross-point cell arrays, and may extend in the first direction. The second insulation pattern 185 may penetrate through the second conductive lines 175.

The second insulation pattern 185 may include, e.g., silicon oxide, and may be merged with the first and third insulation patterns 173 and 285. Sidewalls of the first memory cells 180 may be covered by the first and second insulation patterns 173 and 185, and sidewalls of the second memory cells 280 may be covered by the second and third insulation patterns 185 and 285.

FIGS. 4 to 11 are cross-sectional views illustrating stages of a method of manufacturing a variable resistance memory device, e.g., the variable resistance memory device shown in FIGS. 1 to 3, in accordance with example embodiments.

Particularly, FIGS. 4, 5, 6A, 7A, 9A, 10 and 11 are cross-sectional views taken along the first direction, and FIGS. 6B, 7B, 8 and 9B are cross-sectional views taken along a line I-I' of FIG. 2.

Figure 4:
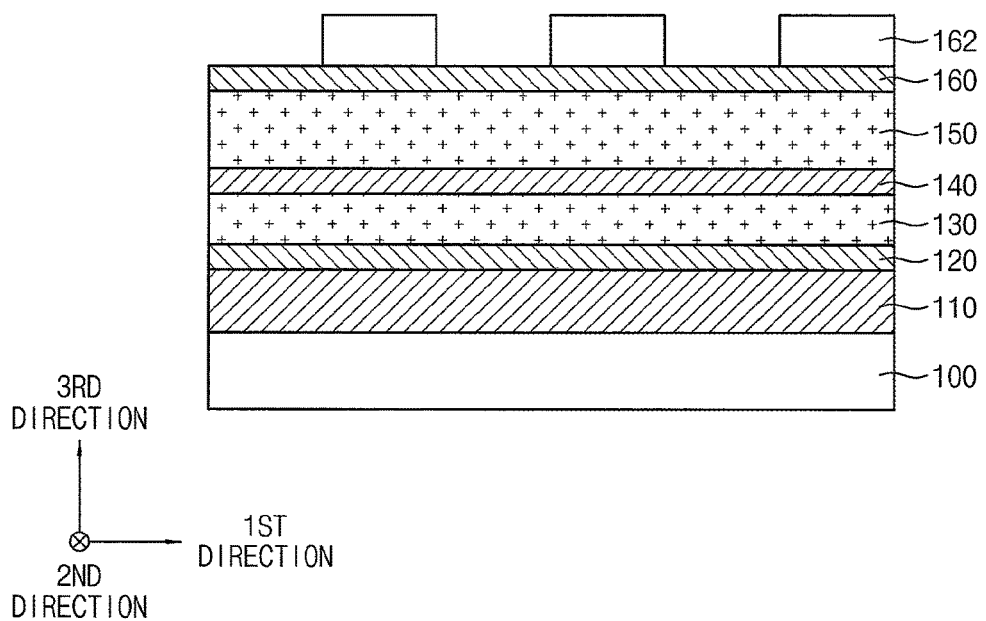
FIGS. 4 to 11 are cross-sectional views illustrating stages of a method of manufacturing a variable resistance memory device according to example embodiments.

Referring to FIG. 4, a first conductive layer 110, a first lower electrode layer 120, a first selection material layer 130, a first intermediate electrode layer 140, a first variable resistance material layer 150, and a first upper electrode layer 160 may be sequentially formed on a substrate 100. A first mask pattern 162 may be formed on the first upper electrode layer 160.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be an SOI substrate, or a GOI substrate.

In example embodiments, peripheral circuits (not shown) including, e.g., transistors, contact plugs, wirings, etc. may be formed on the substrate 100, and may be at least partially covered by a lower insulation layer (not shown) on the substrate 100.

The first conductive layer 110 may be formed of a metal, e.g., tungsten, copper, aluminum, titanium, tantalum, etc. The first lower electrode layer 120 and the first upper electrode layer 160 may be formed of a metal or a metal nitride, e.g., titanium or titanium nitride.

The first intermediate electrode layer 140 may be formed of a metal, a metal nitride or a metal silicon nitride having a resistance greater than those of the first lower electrode layer 120 and the first upper electrode layer 160. The first intermediate electrode layer 140 may be formed of carbon, a metal containing carbon, or a metal nitride containing carbon, e.g., carbon, carbonitride, titanium carbonitride and/or tantalum carbonitride.

The first selection material layer 130 may be formed of the above-mentioned OTS material. Alternatively, the first selection material layer 130 may be formed by sequentially stacking a polysilicon layer doped with n-type impurities and a polysilicon layer doped with p-type impurities.

The first variable resistance material layer 150 may be formed of a phase-change material, e.g., GST, IST, BST, etc. In an example embodiment, the first variable resistance material layer 150 may be formed of a ferromagnetic material. In an example embodiment, the first variable resistance material layer 150 may be formed of a perovskite-based material or a transition metal oxide.

The first conductive layer 110, the first lower electrode layer 120, the first selection material layer 130, the first intermediate electrode layer 140, the first variable resistance material layer 150, and the first upper electrode layer 160 may be formed by, e.g., a physical vapor deposition (PVD) process, a sputtering process, an atomic layer deposition (ALD) process, or a chemical vapor deposition (CVD) process, etc.

The first mask pattern 162 may extend in the second direction, and a plurality of first mask patterns 162 may be formed to be spaced apart from each other in the first direction. The first mask pattern 162 may be formed of, e.g., silicon nitride, spin-on-hardmask (SOH) and/or a photoresist material.

Figure 5:
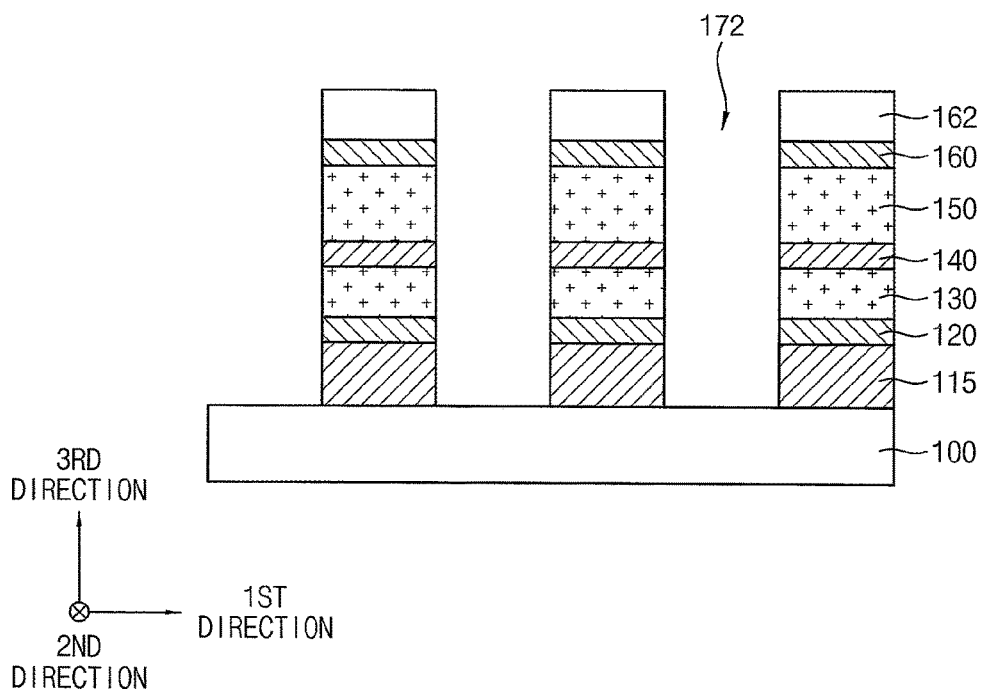

Referring to FIG. 5, the first upper electrode layer 160, the first variable resistance material layer 150, the first intermediate electrode layer 140, the first selection material layer 130, the first lower electrode layer 120 and the first conductive layer 110 may be sequentially etched using the first mask pattern 162 as an etching mask.

Thus, each of the first upper electrode layer 160, the first variable resistance material layer 150, the first intermediate electrode layer 140, the first selection material layer 130, and the first lower electrode layer 120 may be transformed into a line pattern extending in the second direction. Additionally, a plurality of first conductive lines 115 each extending in the second direction may be formed in the first direction from the first conductive layer 110.

A plurality of stacked structures each including the line patterns may be formed between the first conductive line 115 and the first mask pattern 162 in the first direction, and a first opening 172 may be formed between neighboring ones of the stacked structures in the first direction.

The first mask pattern 162 may be removed by, e.g., an ashing process and/or a stripping process.

Figure 6A:
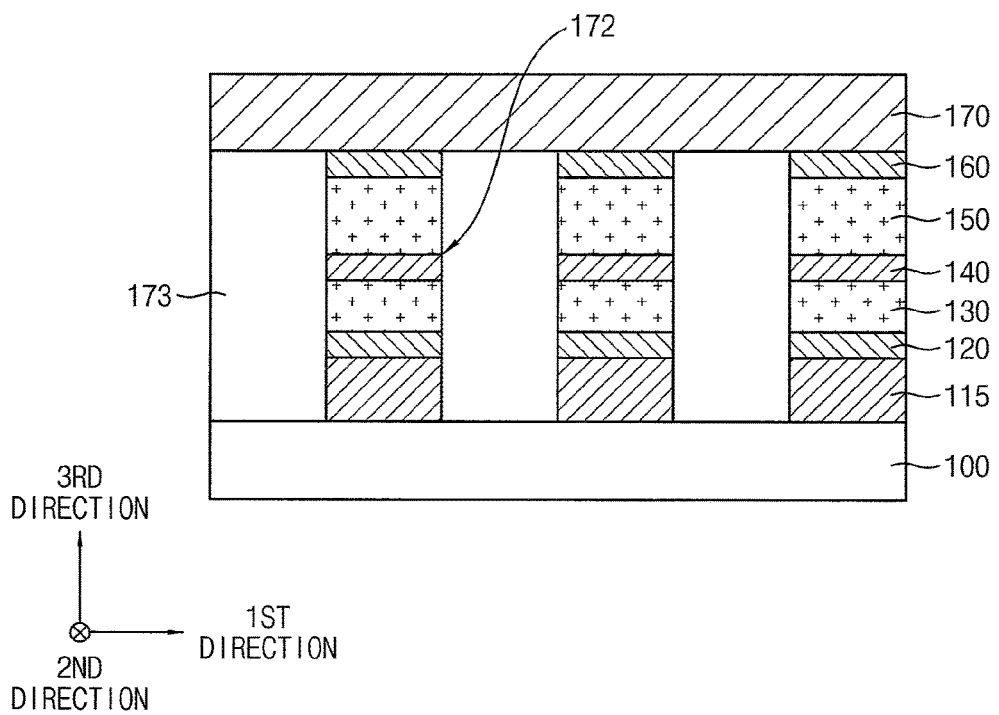
Figure 6B:
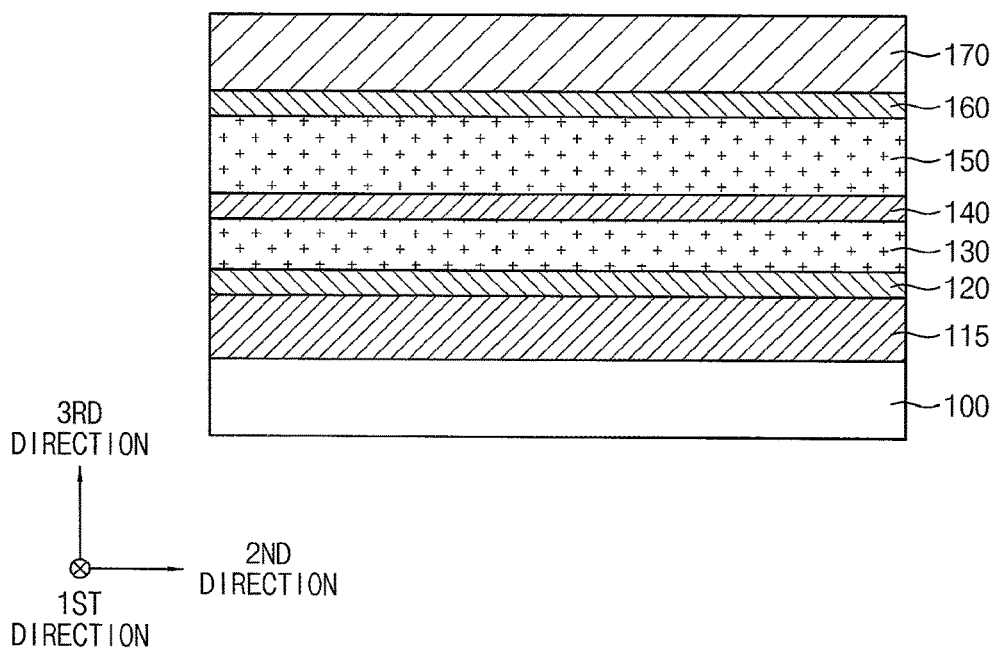

Referring to FIGS. 6A and 6B, a first insulation pattern 173 may be formed to fill the first opening 172, and a second conductive layer 170 may be formed on the first insulation pattern 173 and the first upper electrode layer 160.

For example, a first insulation layer may be formed of silicon oxide on the substrate 100 and the first upper electrode layer 160 to sufficiently fill the first opening 172, and may be planarized until an upper surface of the first upper electrode layer 160 may be exposed. The planarization process may be performed by a chemical mechanical polishing (CMP) process. The first insulation pattern 173 may extend in the second direction, and may divide neighboring ones of the first conductive lines 115 and neighboring ones of the stacked structures.

The second conductive layer 170 may be formed of, e.g., a metal or a metal nitride. In an example embodiment, the second conductive layer 170 may be formed of a material that is the same or substantially the same as that of the first conductive layer 110.

Figure 7A:
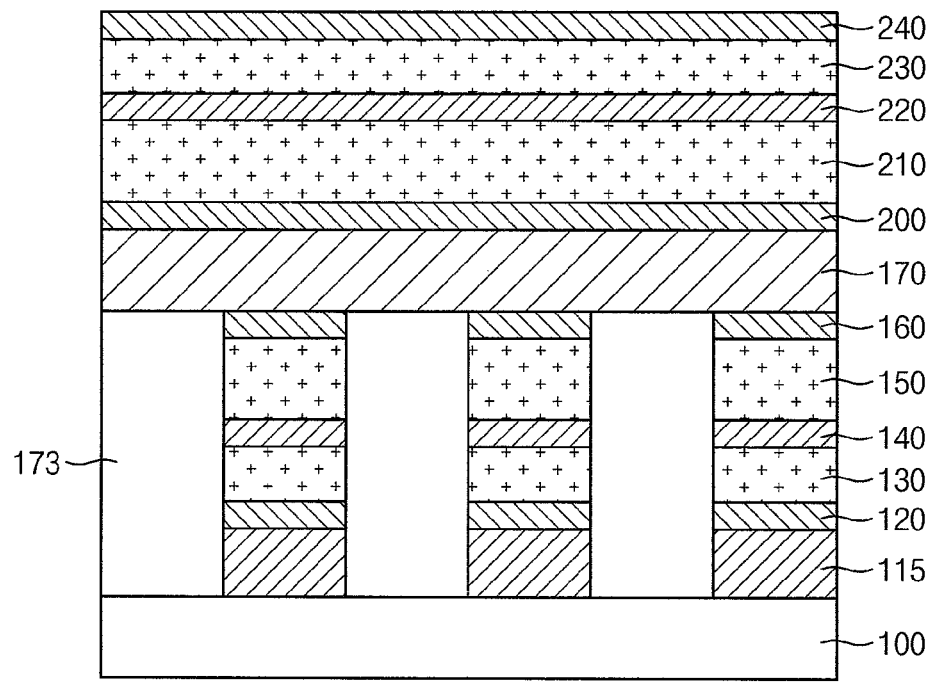
Figure 7A:
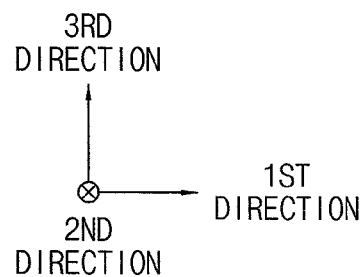
Figure 7B:
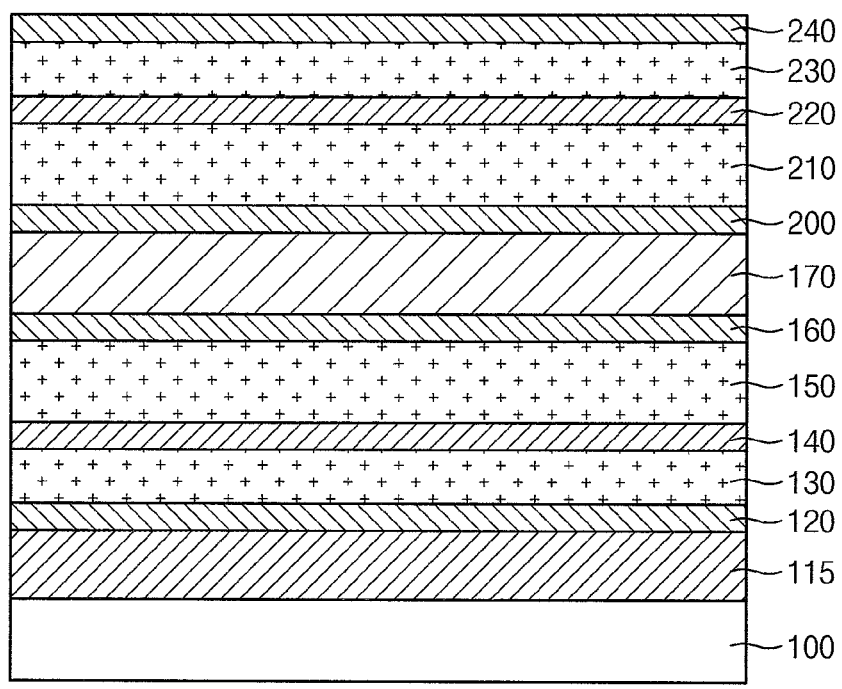
Figure 7B:
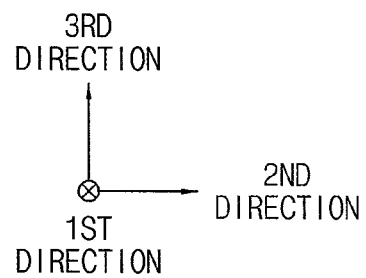

Referring to FIGS. 7A and 7B, a second lower electrode layer 200, a second selection material layer 210, a second intermediate electrode layer 220, a second variable resistance material layer 230 and a second upper electrode layer 240 may be sequentially formed on the second conductive layer 170.

The second lower electrode layer 200, the second selection material layer 210, the second intermediate electrode layer 220, the second variable resistance material layer 230 and the second upper electrode layer 240 may be formed of materials that is the same or substantially the same as those of the first lower electrode layer 120, the first selection material layer 130, the first intermediate electrode layer 140, the first variable resistance material layer 150 and the first upper electrode layer 160, respectively.

Figure 8:
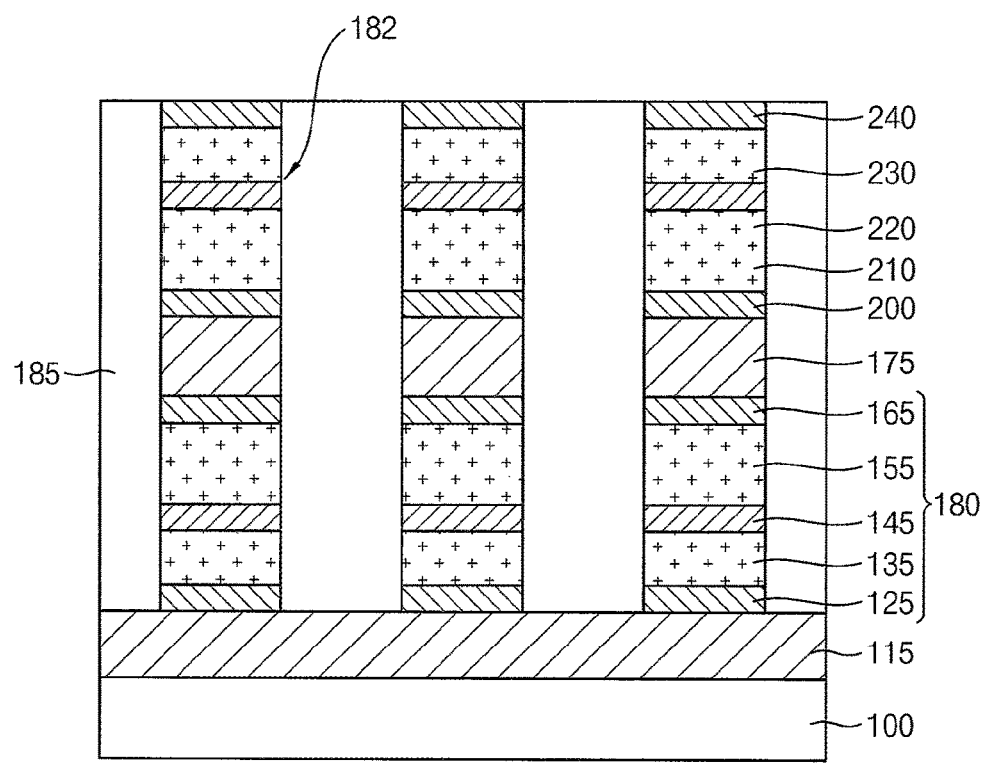
Figure 8:
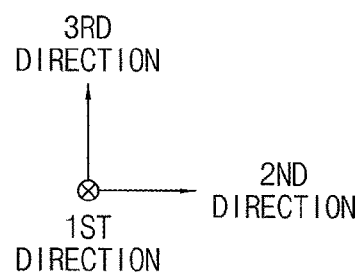

Referring to FIG. 8, the second upper electrode layer 240, the second variable resistance material layer 230, the second intermediate electrode layer 220, the second selection material layer 210, and the second lower electrode layer 200, the second conductive layer 170, the first upper electrode layer 160, the first variable resistance material layer 150, the first intermediate electrode layer 140, the first selection material layer 130 and the first lower electrode layer 120 may be sequentially etched in the first direction. Thus, a plurality of second openings 182 each extending in the first direction may be formed in the second direction.

For example, the etching process may be performed until an upper surface of the first conductive line 115 may be exposed. In an example embodiment, an upper portion of the first conductive line 115 may also be partially removed by the etching process.

By the etching process, a plurality of second conductive lines 175 each extending in the first direction may be formed in the second direction from the second conductive layer 170.

By the etching process, a first memory cell 180 including a first lower electrode 125, a first selection pattern 135, a first intermediate electrode 145, a first variable resistance pattern 155 and a first upper electrode 165 sequentially stacked may be formed at each area where the first and second conductive lines 115 and 175 overlap with each other in the third direction.

By the etching process, each of the second lower electrode layer 200, the second selection material layer 210, the second intermediate electrode layer 220, the second variable resistance material layer 230 and the second upper electrode layer 240 may be transformed into a line pattern extending in the first direction on the second conductive line 175.

A second insulation layer may be formed on the first conductive line 115 and the second upper electrode layer 240 to sufficiently fill the second openings 182, and may be planarized until an upper surface of the second upper electrode layer 240 may be exposed to form a second insulation pattern 185.

The second insulation pattern 185 may extend in the first direction in each of the second openings 182, and may be merged with the first insulation pattern 173.

Figure 9A:
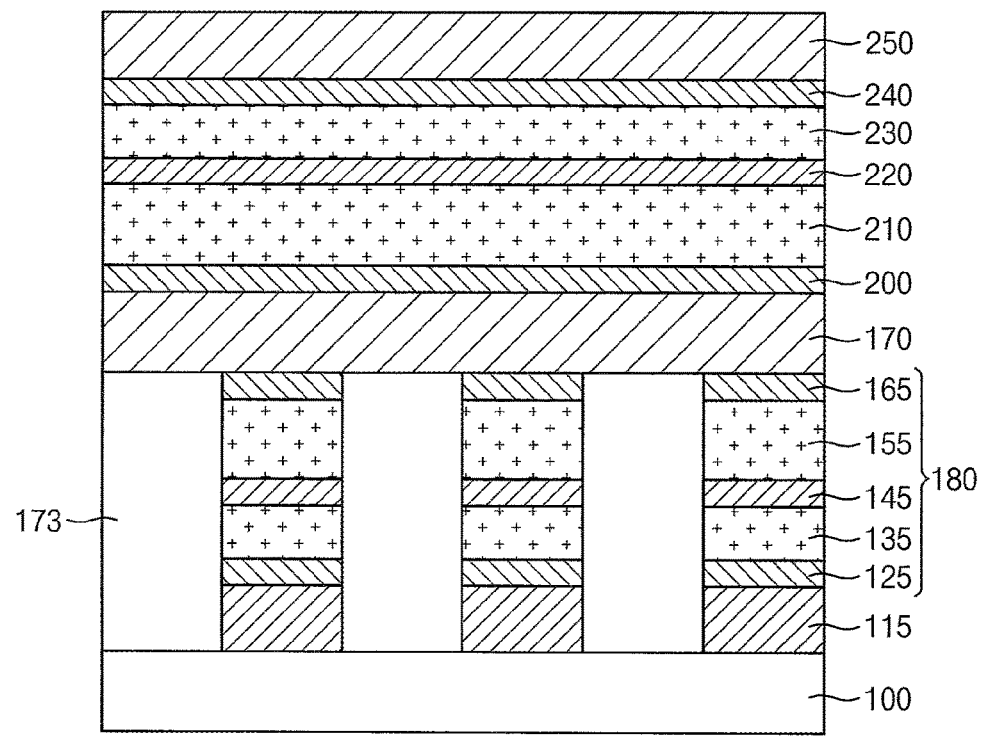
Figure 9A:
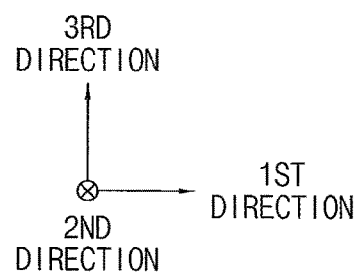
Figure 9B:
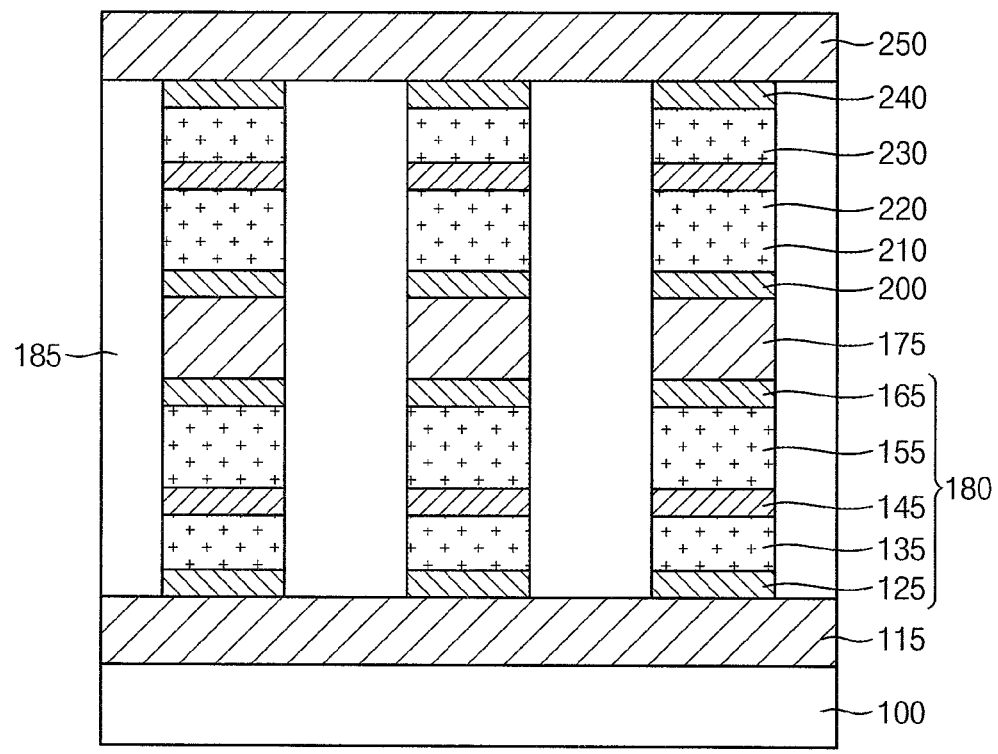
Figure 9B:
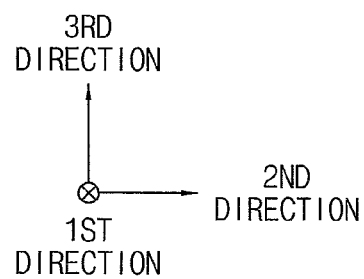

Referring to FIGS. 9A and 9B, a third conductive layer 250 may be formed on the second upper electrode layer 240 and the second insulation pattern 185. The third conductive layer 250 may be formed of a metal or a metal nitride, e.g., a material that is the same or substantially the same as those of the first conductive layer 110 and/or the second conductive layer 170.

Figure 10:
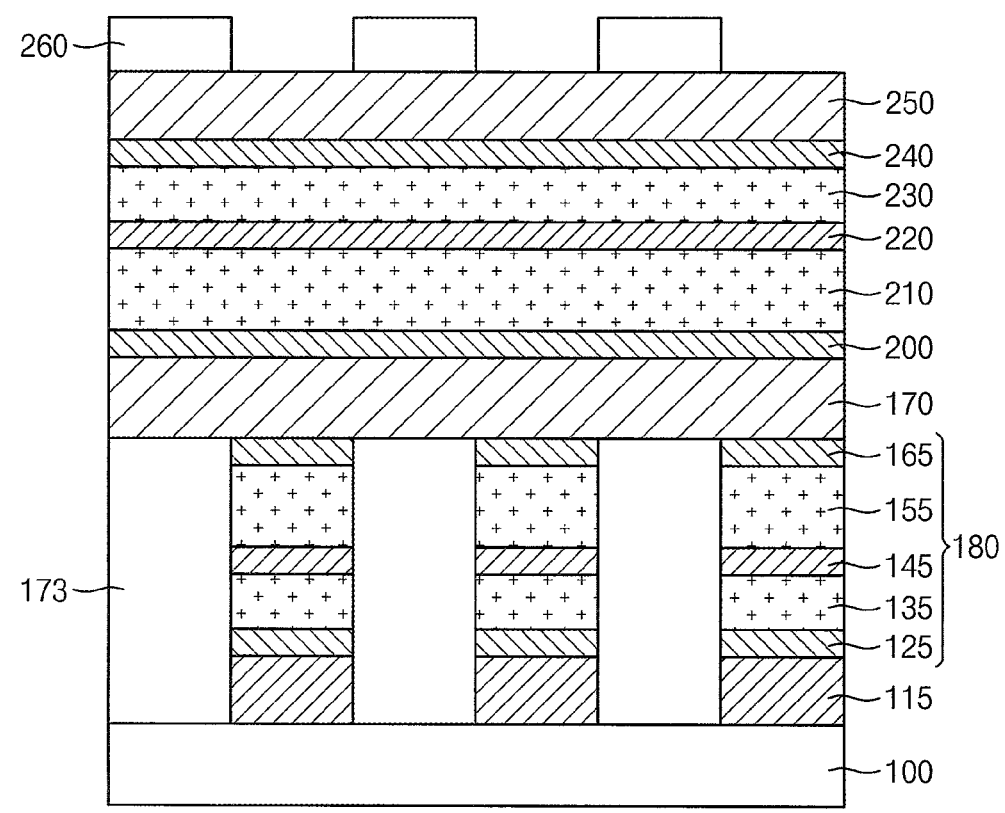

Referring to FIG. 10, a second mask pattern 260 may be formed on the third conductive layer 250.

In example embodiments, a plurality of second mask patterns 260 may be formed in the first direction, and each of the second mask patterns 260 may extend in the second direction. The second mask pattern 260 may be formed of a material that is the same or substantially the same as that of the first mask pattern 162.

In example embodiments, the second mask patterns 260 may be formed to be shifted from the first mask patterns 162 or the first upper electrode 165 along the first direction by a given distance in a plan view. In an example embodiment, the given distance may be equal or substantially equal to a width in the first direction of the first memory cell 180.

Figure 11:
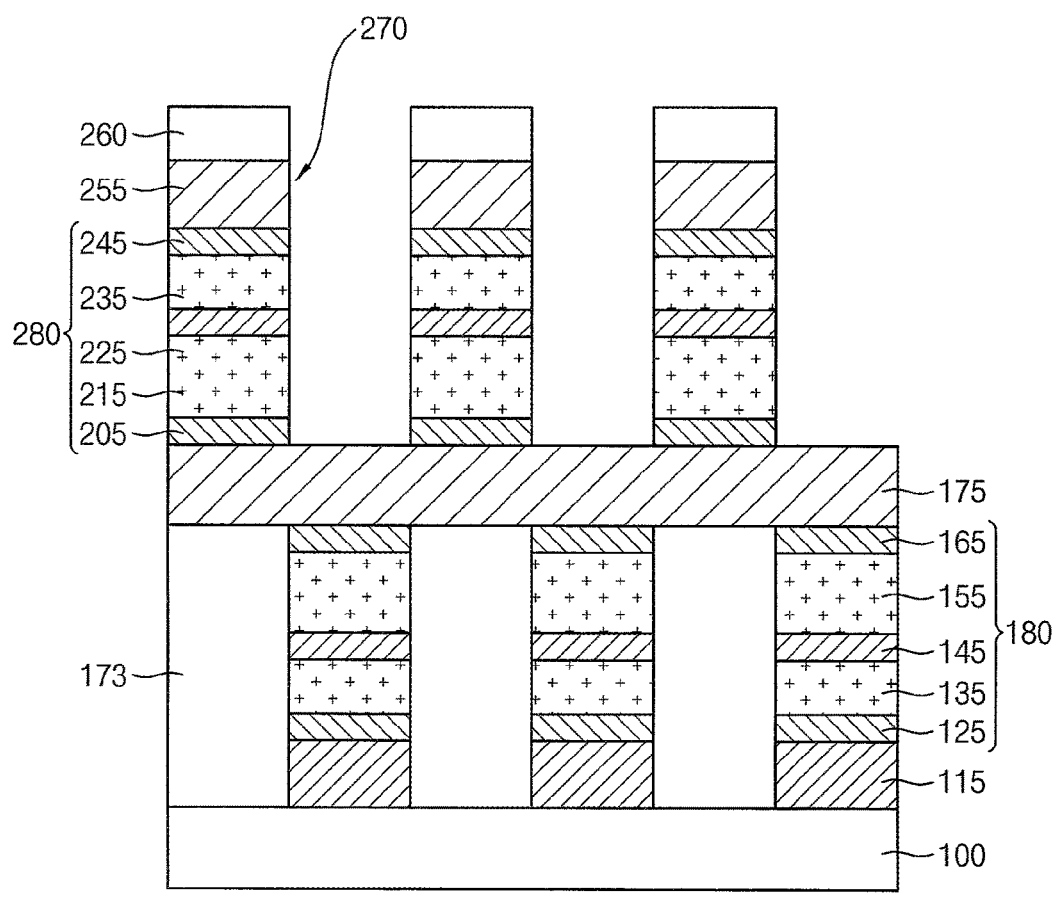
Figure 11:
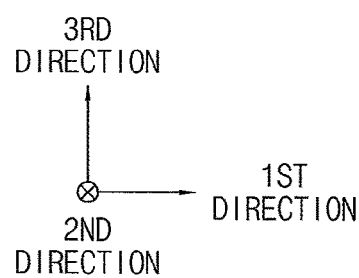

Referring to FIG. 11, the third conductive layer 250, the second upper electrode layer 240, the second variable resistance material layer 230, the second intermediate electrode layer 220, the second selection material layer 210 and the second lower electrode layer 200 may be sequentially etched using the second mask patterns 260 as an etching mask.

The etching process may be performed until an upper surface of the second conductive line 175 may be exposed. By the etching process, a third opening 270 may be formed to extend in the second direction. In an example embodiment, the third opening 270 may extend to an upper portion of the second conductive line 175.

By the etching process, a plurality of third conductive lines 255 each extending in the second direction may be formed in the first direction from the third conductive layer 250. Additionally, a second memory cell 280 including a second lower electrode 205, a second selection pattern 215, a second intermediate electrode 225, a second variable resistance pattern 235 and a second upper electrode 245 sequentially stacked may be formed at each area where the second and third conductive lines 175 and 255 overlap with each other in the third direction.

By the arrangement of the mask patterns 162 and 260, the first and second memory cells 180 and 280 may be formed to be shifted from each other in the third direction. In an example embodiment, the first memory cells 180 may be formed between neighboring ones of the second memory cells 280 in a plan view.

The second mask patterns 260 may be removed by an ashing process and/or a stripping process.

Referring to FIGS. 2 and 3 again, a third insulation pattern 285 may be formed to fill the third opening 270.

For example, a third insulation layer may be formed of, e.g., silicon oxide on the second conductive line 175 and the third conductive line 255 to sufficiently fill the third opening 270, and may be planarized until an upper surface of the third conductive line 255 may be exposed.

The third insulation pattern 285 may extend in the second direction in each of the third openings 270, and may be merged with the second insulation pattern 185.

Figure 12:
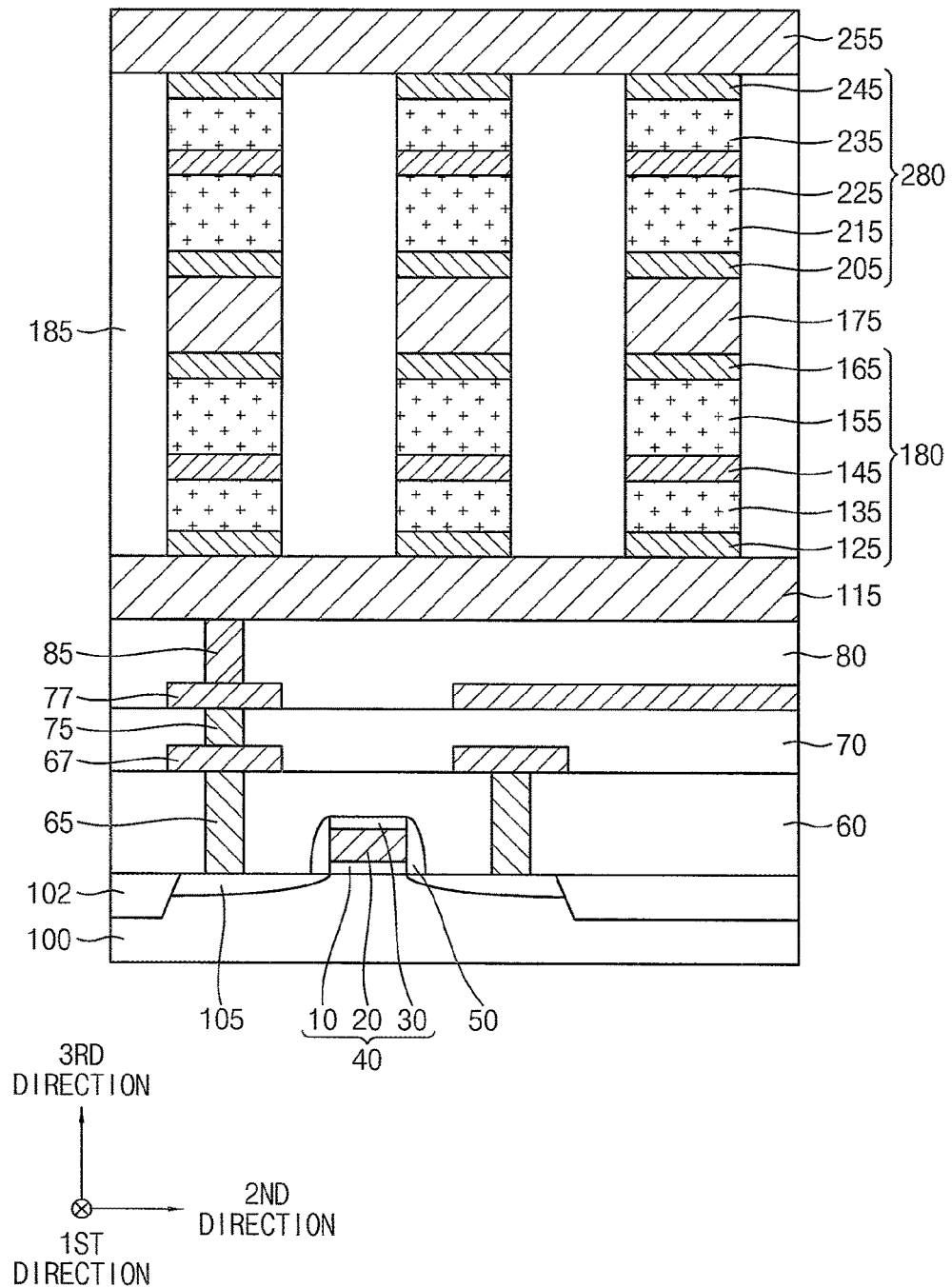
FIG. 12 is a cross-sectional view illustrating another variable resistance memory device in accordance with example embodiments.

FIG. 12 is a cross-sectional view illustrating another variable resistance memory device in accordance with example embodiments.

FIG. 12 shows a variable resistance memory device having a cell over peri (COP) structure in which peripheral circuits and memory cells are sequentially stacked.

Referring to FIG. 12, a peripheral circuit region may be defined by a gate structure 40, first to third insulating interlayers 60, 70 and 80, first to third contact plugs 65, 75 and 85, and first and second wirings 67 and 77 on the substrate 100. The cross-point cell array including the first conductive line 115, the second conductive line 175, the third conductive line 255, the first memory cells 180 and the second memory cells 280 as shown in FIGS. 1 to 3 may be stacked on the peripheral circuit region.

An isolation layer 102 may be formed on the substrate 100, and thus an active region and a field region may be defined in the substrate 100.

The gate structure 40 may include a gate insulation pattern 10, a gate electrode 20, and a gate mask 30 sequentially stacked.

The gate insulation pattern 10 may include, e.g., silicon oxide, a metal oxide, etc., the gate electrode 20 may include, e.g., doped polysilicon, a metal, a metal silicide, a metal nitride, etc., and the gate mask 30 may include, e.g., silicon nitride. In an example embodiment, a gate spacer 50 may be further formed on a sidewall of the gate structure 40.

An impurity region 105 may be formed at an upper portion of the substrate 100 adjacent the gate structure 40. The impurity region 105 may include n-type impurities, e.g., phosphorus, arsenic, etc. In this case, the gate structure 40 and the impurity region 105 may define an NMOS transistor, and the portion of the substrate 100 shown in FIG. 12 may serve as an NMOS region.

In an example embodiment, the substrate 100 may further include a PMOS region in which a PMOS transistor including a gate structure and an impurity region doped with p-type impurities may be formed. In this case, the variable resistance memory device may include a complementary metal oxide semiconductor (CMOS) transistor.

In an example embodiment, the gate structure 40 may be a buried gate structure of which a portion may be buried in the substrate 100. In this case, an upper portion of the substrate 100 may be removed to form a recess, and a gate insulation pattern and a gate electrode may be formed in the recess.

The first insulating interlayer 60 may cover the gate structure 40, the gate spacer 50 and the impurity region 105 on the substrate 100, and the first contact plug 65 may extend through the first insulating interlayer 60 to contact the impurity region 105. The first wiring 67 may be formed on the first insulating interlayer 60, and may be electrically connected to the first contact plug 65.

The second insulating interlayer 70 may be formed on the first insulating interlayer 60, and the second contact plug 75 may extend through the second insulating interlayer 70 to contact the first wiring 67. The second wiring 77 may be formed on the second insulating interlayer 70, and may be electrically connected to the second contact plug 75. In an example embodiment, a portion of the second wiring 77 may extend to the PMOS region, and may be electrically connected to the impurity region of the PMOS transistor.

The third insulating interlayer 80 may be formed on the second insulating interlayer 70, and may cover the second wiring 77. The third contact plug 85 may extend through the third insulating interlayer 80 to contact the second wiring 77.

The first to third insulating interlayers 60, 70 and 80 may include silicon oxide. The first to third contact plugs 65, 75 and 85, and the first and second wirings 67 and 77 may include a metal, e.g., tungsten, aluminum, copper, titanium, etc., and/or a metal nitride.

The cross-point cell array may be formed on the third insulating interlayer 80. For example, the first conductive line 115 may be electrically connected to the third contact plug 85.

FIG. 12 shows the first and second wirings 67 and 77 in respective two levels in the peripheral circuit region, however, inventive concepts may not be limited thereto. For example, the wirings may be formed in a single level, or more wirings may be formed in more than two levels in the peripheral circuit region.

Figure 13:
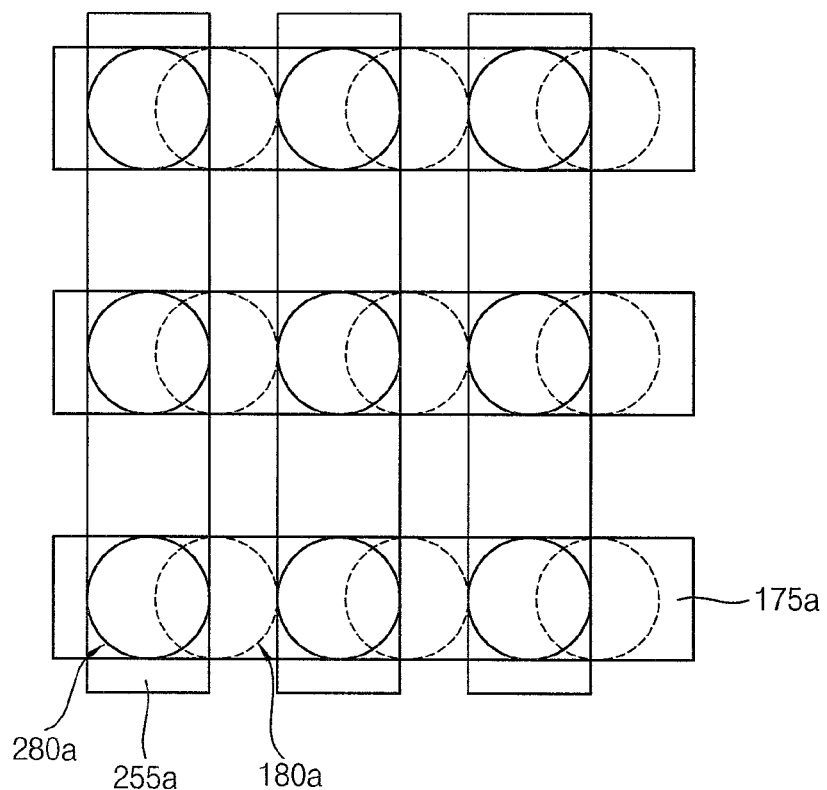
FIG. 13 is a plan view illustrating another variable resistance memory device in accordance with example embodiments.
Figure 14:
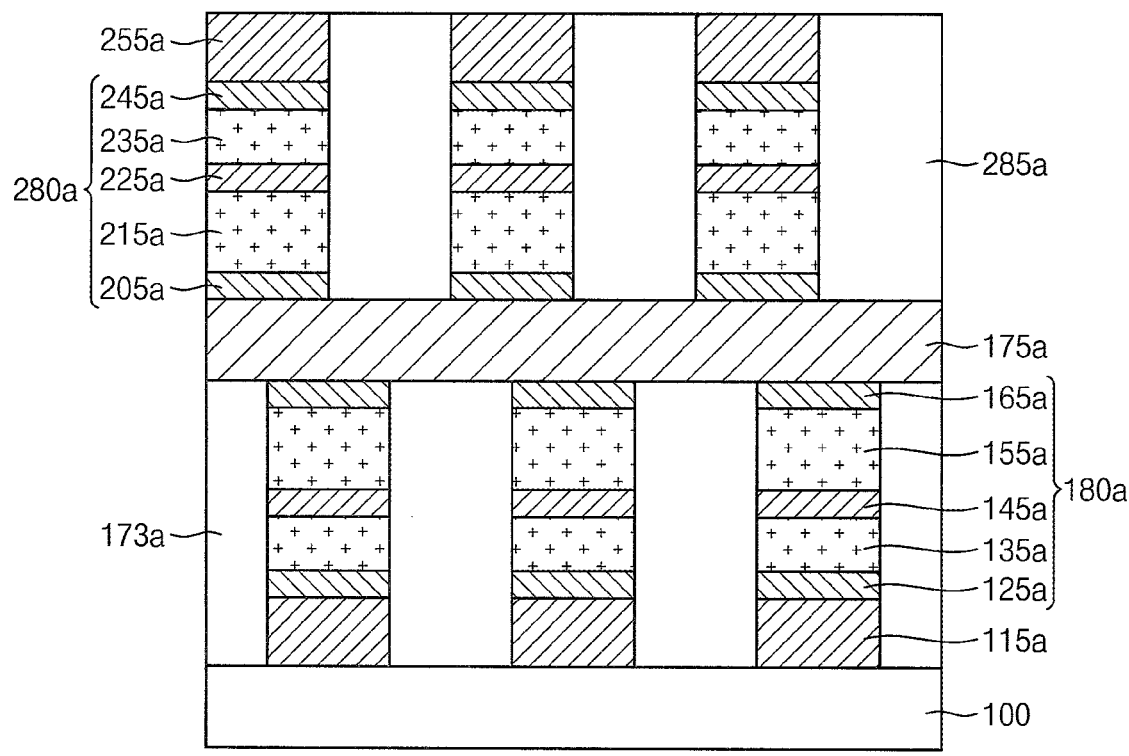
FIG. 14 is a cross-sectional view of the variable resistance memory device shown in FIG. 13.
Figure 14:
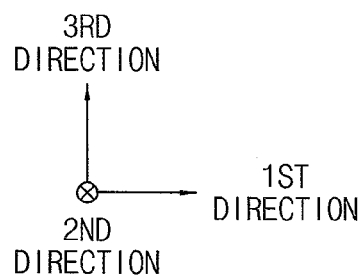

FIG. 13 is a plan view illustrating another variable resistance memory device in accordance with example embodiments, and FIG. 14 is a cross-sectional view of the variable resistance memory device shown in FIG. 13. More particularly, FIG. 14 is a cross-sectional view of the variable resistance memory device shown in FIG. 13 taken along the first direction.

The variable resistance memory device may be the same as, substantially the same as, or similar to, that illustrated with reference to FIGS. 1 to 3, except for the layout of the memory cells. Thus, like reference numerals refer to like elements, and detailed descriptions thereon may be omitted below in the interest of brevity.

Referring to FIGS. 13 and 14, the variable resistance memory device may include first conductive lines 115a, second conductive lines 175a, and third conductive lines 255a that may be spaced apart from each other and cross each other in the third direction.

A first memory cell 180a may be disposed at each area where the first and second conductive lines 115a and 175a overlap with each other in the third direction. The first memory cell 180a may include a first lower electrode 125a, a first selection pattern 135a, a first intermediate electrode 145a, a first variable resistance pattern 155a and a first upper electrode 165a sequentially stacked between the first and second conductive lines 115a and 175a.

A second memory cell 280a may be disposed at each area where the second and third conductive lines 175a and 255a overlap with each other in the third direction. The second memory cell 280a may include a second lower electrode 205a, a second selection pattern 215a, a second intermediate electrode 225a, a second variable resistance pattern 235a and a second upper electrode 245a sequentially stacked between the second and third conductive lines 175a and 255a.

A plurality of first memory cells 180a disposed in the first direction may define a first memory cell row, and a plurality of first memory cells 180a disposed in the second direction may define a first memory cell column.

A plurality of second memory cells 280a disposed in the first direction may define a second memory cell row, and a plurality of second memory cells 280a disposed in the second direction may define a second memory cell column.

One of the first memory cell rows and one of the second memory cell rows may share one of the second conductive lines 175a. The first memory cells 180a and the second memory cells 280a may be disposed in a zigzag pattern or offset or shifted from each other in the third direction.

In example embodiments, in the memory cell row, the first and second memory cells 180a and 280a may partially overlap with each other in the third direction or in a plan view. For example, a lower surface of at least one of the second memory cells 280a and an upper surface of a closest one of the first memory cells 180a thereto may partially overlap with each other in the third direction or in a plan view.

In an example embodiment, an overlapping area of the first and second memory cells 180a and 280a may be equal to or less than half of an area of each of the first and second memory cells 180a and 280a.

As illustrated above, the first and second memory cells 180a and 280a may partially overlap with each other so that the horizontal distance between the first and second memory cells 180a and 280a at the respective levels may be reduced, while the number of heat transfer paths between the first and second memory cells 180a and 280a may be increased.

Accordingly, deterioration of the operational reliability of the variable resistance memory device due to the thermal disturbance may be suppressed and/or prevented, and the integration degree thereof may be increased.

Figure 15:
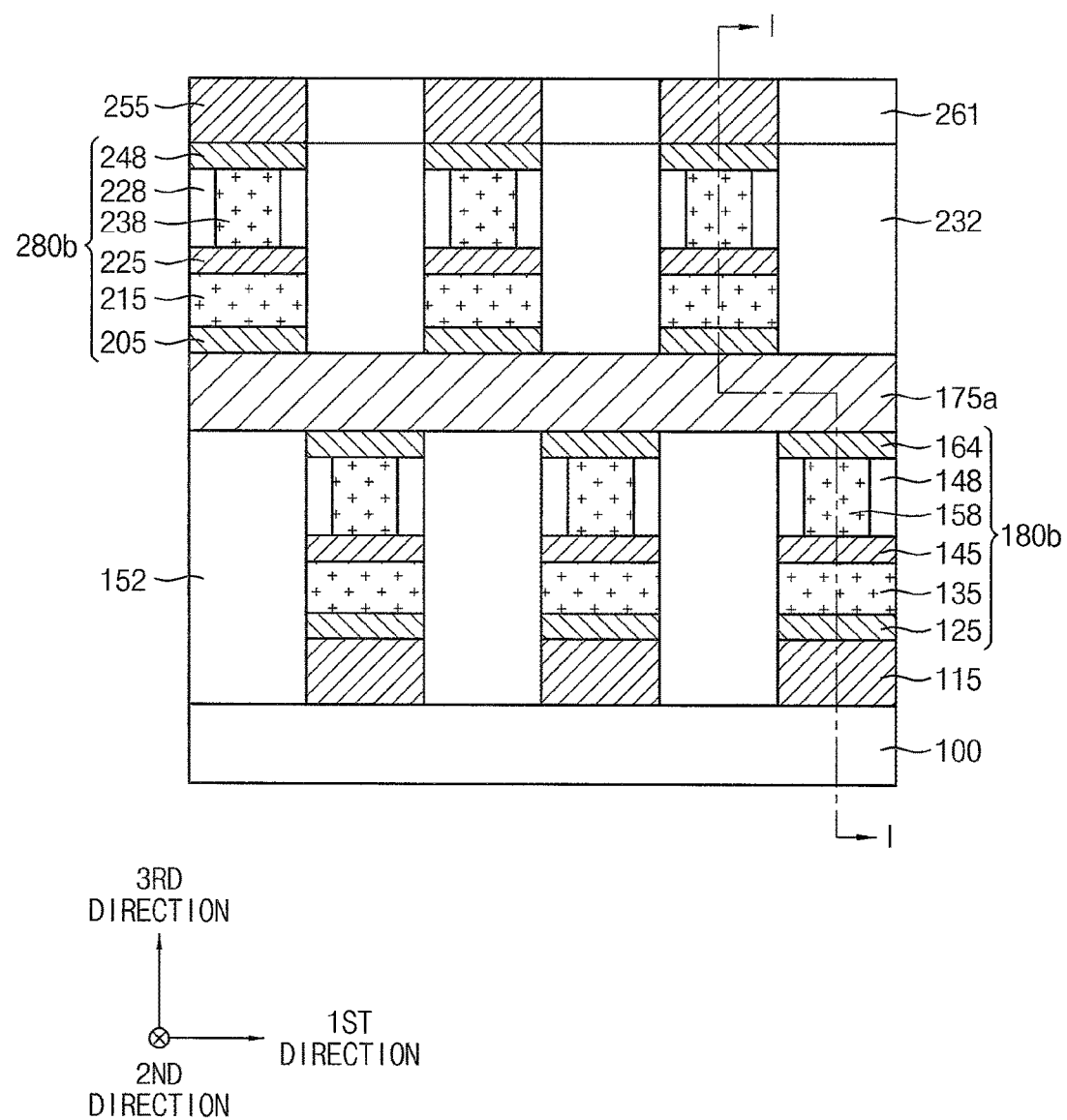
FIGS. 15 and 16 are cross-sectional views illustrating another variable resistance memory device in accordance with example embodiments.
Figure 16:
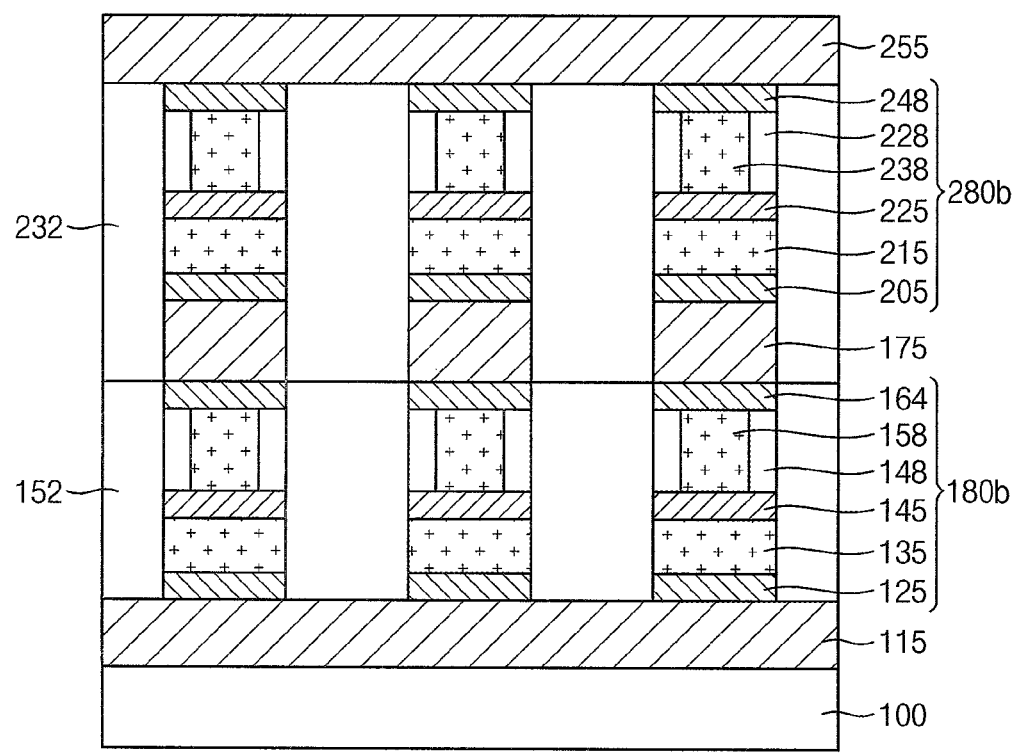
Figure 16:
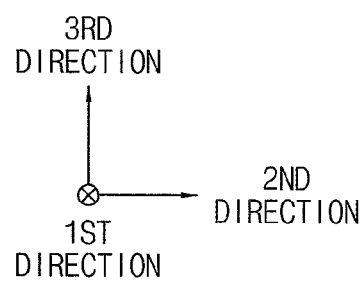

FIGS. 15 and 16 are cross-sectional views illustrating another variable resistance memory device in accordance with example embodiments. Particularly, FIG. 15 is a cross-sectional view of the variable resistance memory device taken along the first direction, and FIG. 16 is a cross-sectional view taken along a line I-I' of FIG. 15.

The variable resistance memory device may be substantially the same as or similar to that illustrated with reference to FIGS. 1 to 3, except for the structure and shape of the variable resistance pattern. Thus, like reference numerals refer to like elements, and detailed descriptions thereon may be omitted below in the interest of brevity.

Referring to FIGS. 15 and 16, as illustrated with reference to FIGS. 1 to 3, the first to third conductive lines 115, 175 and 255 may be spaced apart from each other and cross each other in the third direction. A first memory cell 180b may be disposed at each area where the first and second conductive lines 115 and 175 overlap with each other in the third direction, and a second memory cell 280b may be disposed at each area where the second and third conductive lines 175 and 255 overlap with each other in the third direction.

The first memory cell 180b may include the first lower electrode 125, the first selection pattern 135, the first intermediate electrode 145, a first variable resistance pattern 158 and a first upper electrode 164 sequentially stacked between the first and second conductive lines 115 and 175.

The second memory cell 280b may include the second lower electrode 205, the second selection pattern 215, the second intermediate electrode 225, a second variable resistance pattern 238 and a second upper electrode 248 sequentially stacked between the second and third conductive lines 175 and 255.

In example embodiments, a width of the first variable resistance pattern 158 in the first direction may be less than those of the first selection pattern 135 and/or the first intermediate electrode 145. In an example embodiment, an area of the first variable resistance pattern 158 may be less than those of the first selection pattern 135 and/or the first intermediate electrode 145 in a plan view.

A first spacer 148 may be formed on a sidewall of the first variable resistance pattern 158. For example, the first spacer 148 may surround a sidewall of the first variable resistance pattern 158.

In example embodiments, a width of the second variable resistance pattern 238 in the first direction may be less than those of the second selection pattern 215 and/or the second intermediate electrode 225. In an example embodiment, an area of the second variable resistance pattern 238 may be less than those of the second selection pattern 215 and/or the second intermediate electrode 225 in a plan view.

A second spacer 228 may be formed on a sidewall of the second variable resistance pattern 238. For example, the second spacer 228 may surround a sidewall of the second variable resistance pattern 238.

The first and second spacers 148 and 228 may include, e.g., silicon nitride, silicon oxynitride, etc.

As illustrated above, the first and second variable resistance patterns 158 and 238 may have reduced width and/or areas by the first and second spacers 148 and 228, respectively. Thus, the efficiency of heat transfer from the intermediate electrodes 145 and 225 to the variable resistance patterns 158 and 238 may be improved and/or enhanced.

The first upper electrode 164 may cover upper surfaces of the first spacer 148 and the first variable resistance pattern 158. The second upper electrode 248 may cover upper surfaces of the second spacer 228 and the second variable resistance pattern 238.

The first memory cells 180b and the first conductive lines 115 may be divided and insulated from each other by a first insulation layer 152. The second memory cells 280b and the second conductive lines 175 may be divided and insulated from each other by a second insulation layer 232. The third conductive lines 255 may be divided and insulated from each other by an upper insulation layer 261.

The first and second insulation layers 152 and 232 and the upper insulation layer 261 may include, e.g., silicon oxide.

In example embodiments, as illustrated with reference to FIGS. 1 to 3, the first and second memory cells 180b and 280b may be disposed in a zigzag pattern in the first direction.

In an example embodiment, as illustrated with reference to FIGS. 13 and 14, the first and second memory cells 180b and 280b may partially overlap with each other in the third direction or in a plan view.

FIGS. 17 to 27 are cross-sectional views illustrating stages of a method of manufacturing a variable resistance memory device, e.g., the variable resistance memory device shown in FIGS. 15 and 16, in accordance with example embodiments.

Figure 24:
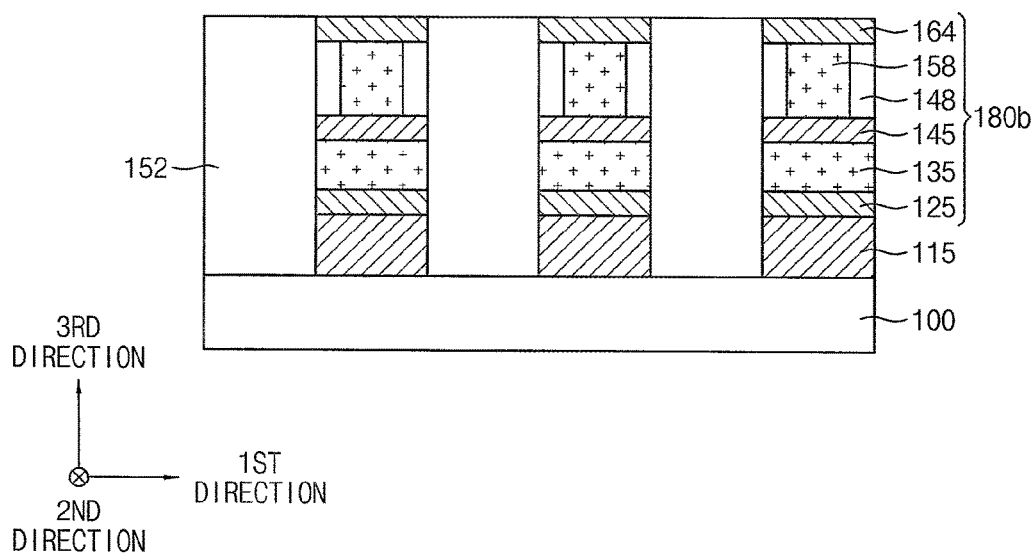
Figure 25:
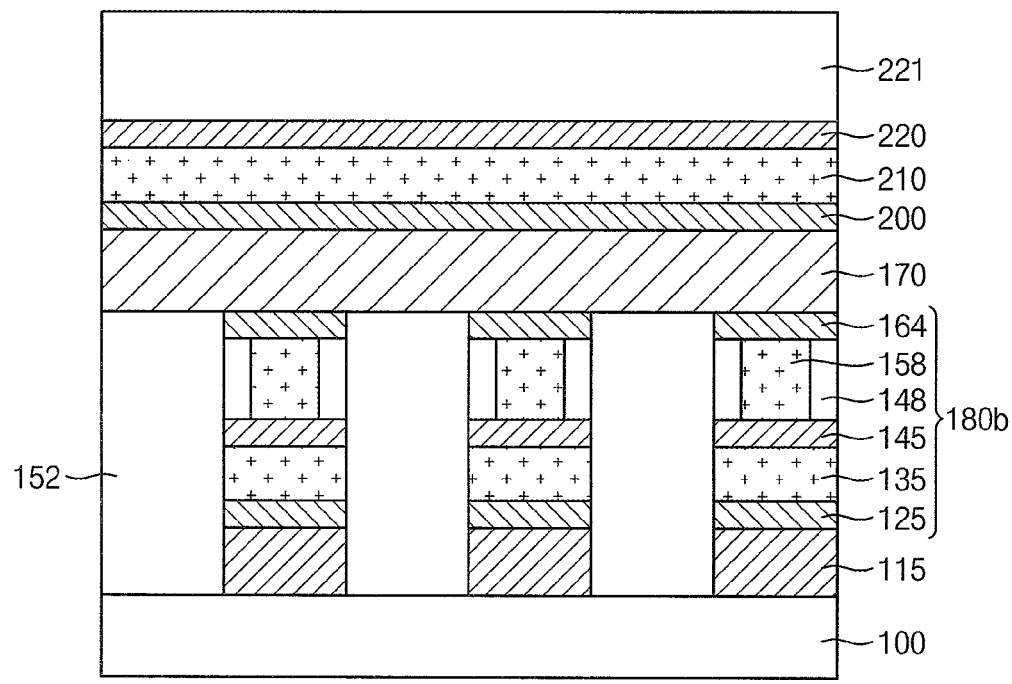
Figure 25:
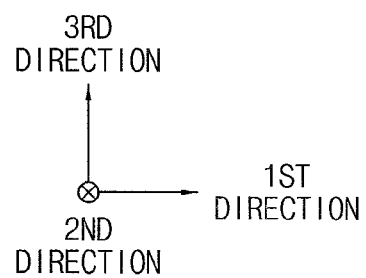
Figure 26A:
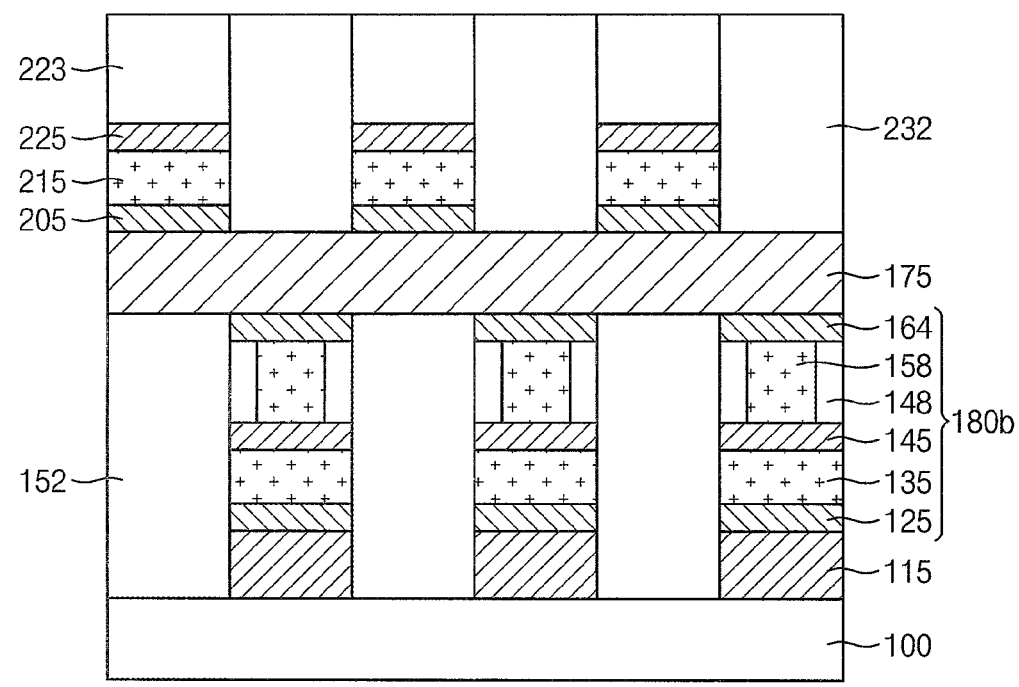
Figure 26A:
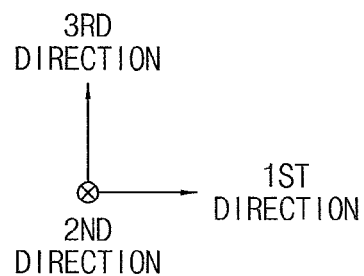
Figure 26B:
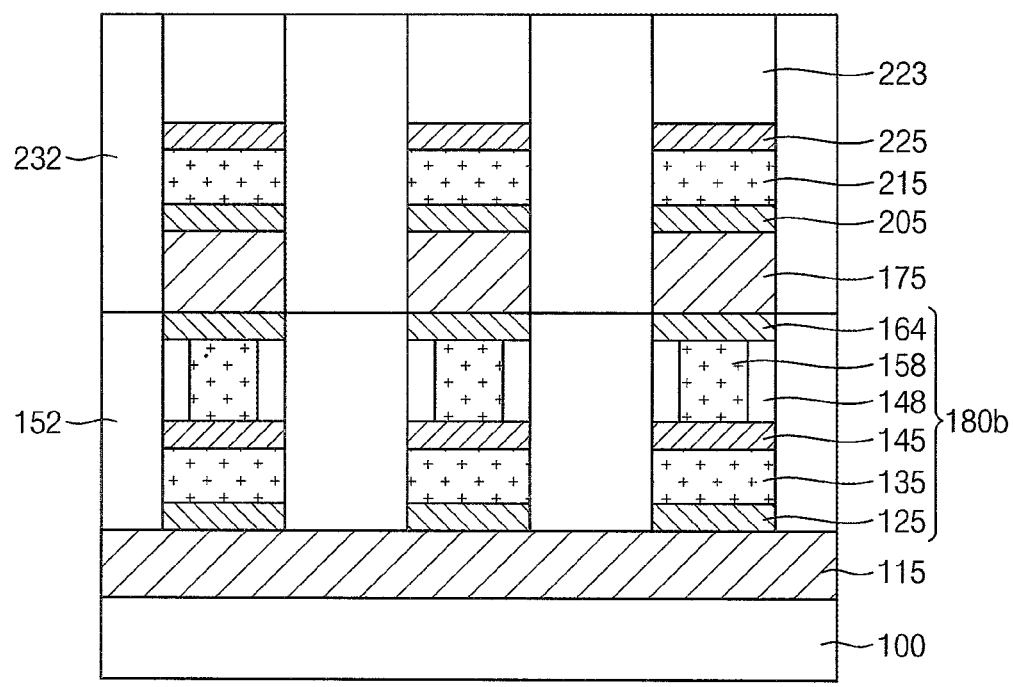
Figure 26B:
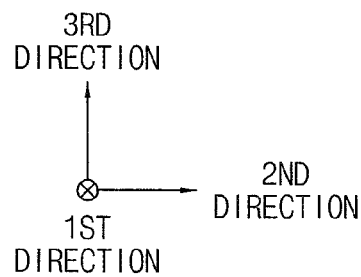

More particularly, FIGS. 17 to 25, 26A and 27 are cross-sectional views taken along the first direction, and FIG. 26B is a cross-sectional view taken along a line I-I' of FIG. 15.

Processes that are the same as, substantially the same as, or similar to, that illustrated with reference to FIGS. 4 to 11 are omitted herein.

Figure 17:
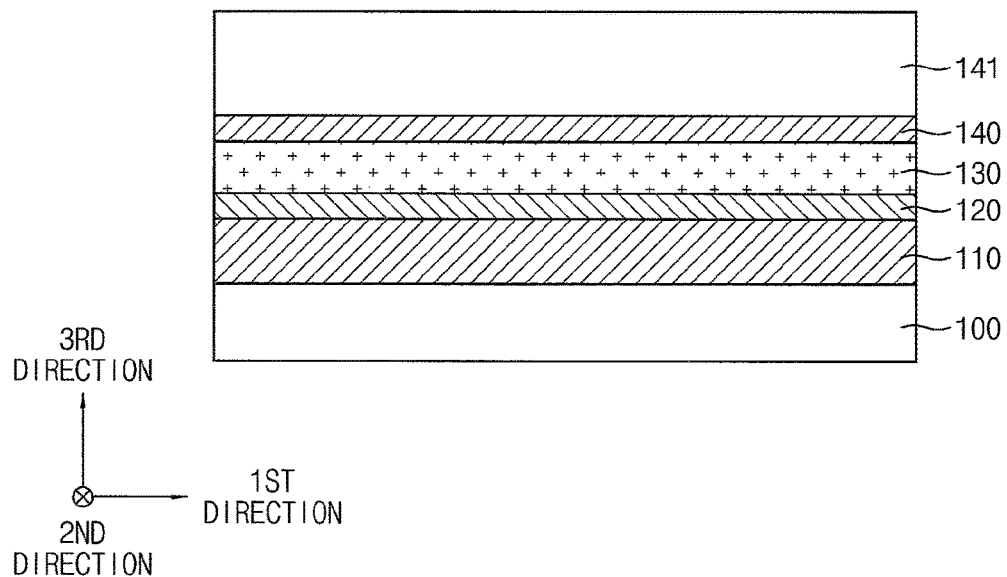
FIGS. 17 to 27 are cross-sectional views illustrating stages of another method of manufacturing a variable resistance memory device according to example embodiments.

Referring to FIG. 17, the first conductive layer 110, the first lower electrode layer 120, the first selection material layer 130, the first intermediate electrode layer 140, and a first sacrificial layer 141 may be sequentially formed on the substrate 100.

The first sacrificial layer 141 may be formed of a nitride, e.g., silicon nitride by a CVD process, an ALD process or a PVD process.

Figure 18:
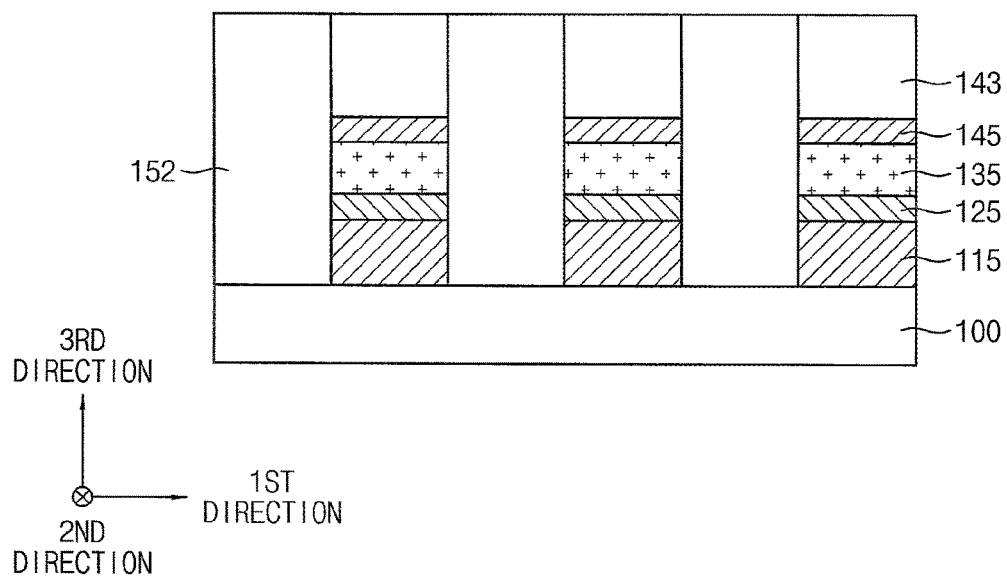

Referring to FIG. 18, the first sacrificial layer 141, the first intermediate electrode layer 140, the first selection material layer 130, the first lower electrode layer 120 and the first conductive layer 110 may be partially etched to form the first conductive line 115, the first lower electrode 125, the first selection pattern 135, the first intermediate electrode 145 and a first sacrificial pattern 143 sequentially stacked on the substrate 100.

For example, the first intermediate electrode layer 140, the first selection material layer 130, the first lower electrode layer 120 and the first conductive layer 110 may be etched along the second direction. Thus, the first conductive lines 115 may be formed from the first conductive layer 110, and each of the first sacrificial layer 141, the first intermediate electrode layer 140, the first selection material layer 130 and the first lower electrode layer 120 may be transformed into a line pattern extending in the second direction. A first filling insulation layer may be formed between the first conductive lines 115 and between the line patterns.

The line patterns and the first filling insulation layer may be etched along the first direction. Thus, a first pillar structure including the first lower electrode 125, the first selection pattern 135, the first intermediate electrode 145 and the first sacrificial pattern 143 sequentially stacked may be formed on the first conductive line 115.

A second filling insulation layer may be formed to fill spaces between the first pillar structures. The second filling insulation layer may be formed to extend in the second direction. The first and second filling insulation layers may be merged with each other to define a first insulation layer 152.

Figure 19:
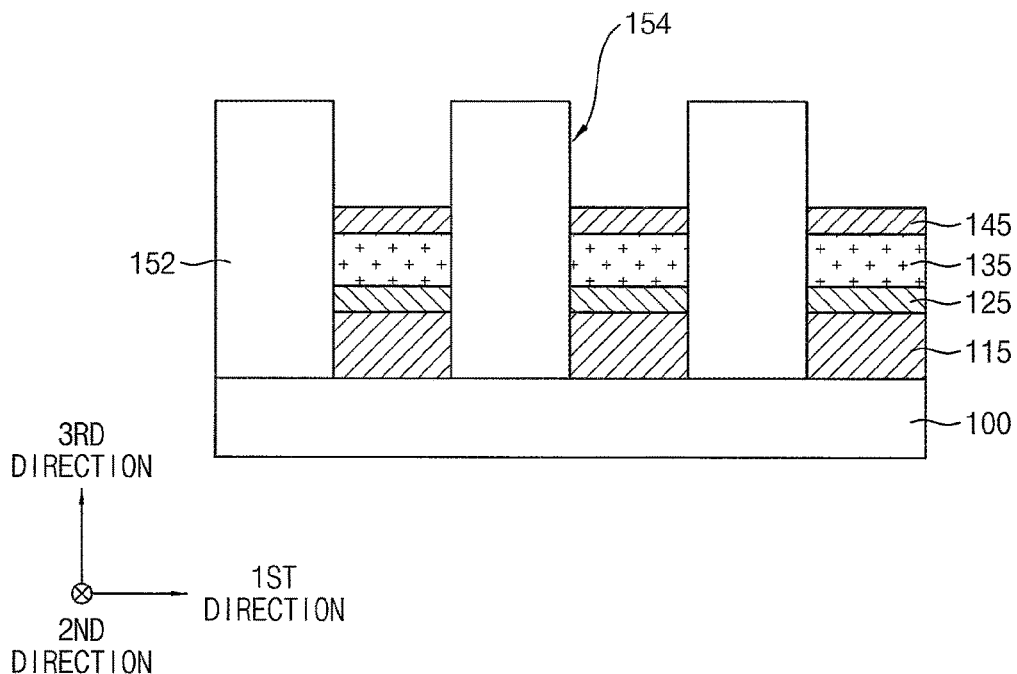

Referring to FIG. 19, the first sacrificial pattern 143 may be removed from the first pillar structure, and a first hole 154 may be formed to expose an upper surface of the first intermediate electrode 145.

For example, the first sacrificial pattern 143 may be removed by a wet etching process using an etching solution having an etching selectivity with respect to nitride, e.g., phosphoric acid or nitric acid.

Figure 20:
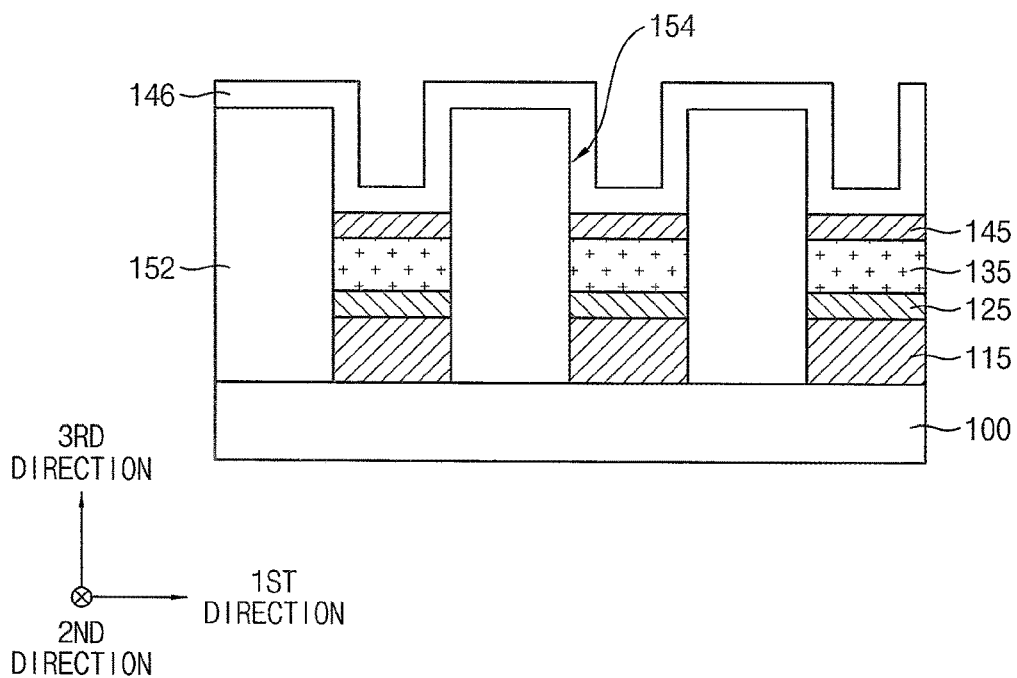

Referring to FIG. 20, a first spacer layer 146 may be conformally formed on the exposed upper surface of the first intermediate electrode 145, a sidewall of the first hole 154 and an upper surface of the first insulation layer 152.

For example, the first spacer layer 146 may be formed of, e.g., silicon nitride, silicon oxynitride, etc., by an ALD process.

Figure 21:
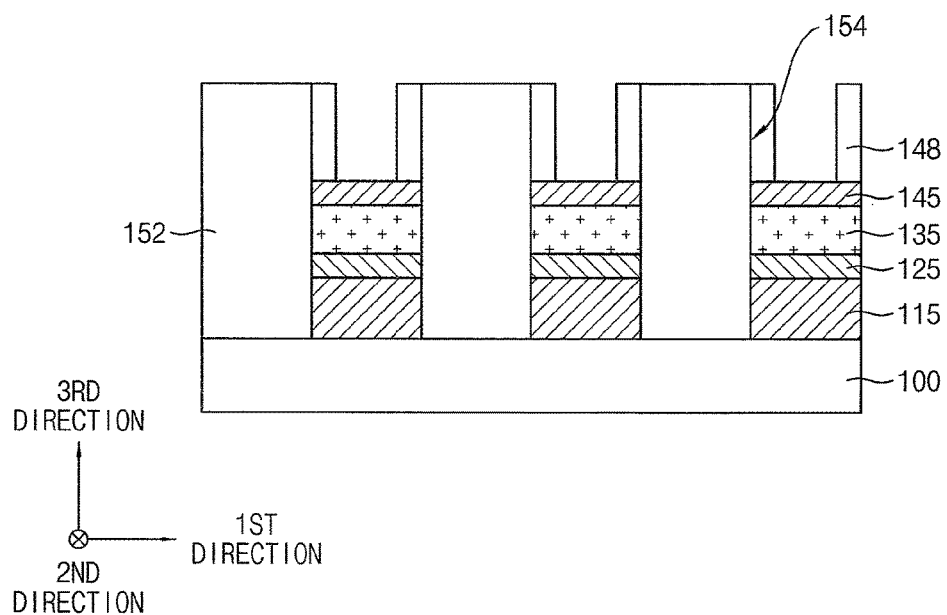

Referring to FIG. 21, the first spacer layer 146 may be partially etched by an anisotropic etching process to form a first spacer 148.

In example embodiments, portions of the first spacer layer 146 on the upper surfaces of the first intermediate electrode 145 and the first insulation layer 152 may be removed. Thus, the first spacer 148 may be formed on the sidewall of the first hole 154.

Figure 22:
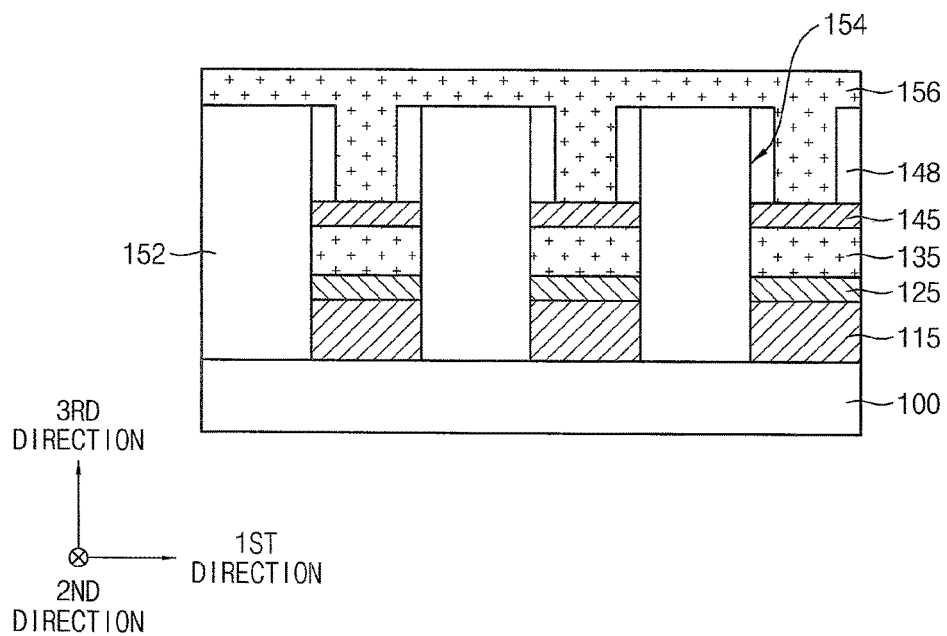

Referring to FIG. 22, a first variable resistance material layer 156 may be formed on the first intermediate electrode 145 and the first insulation layer 152 to sufficiently fill the first hole 154.

Figure 23:
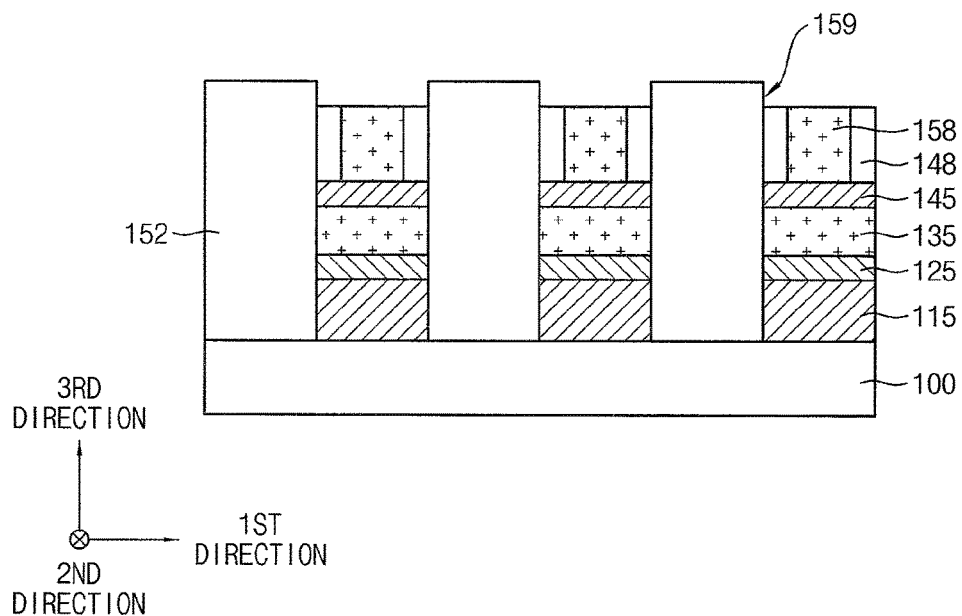

Referring to FIG. 23, the first variable resistance material layer 156 may be planarized until an upper surface of the first insulation layer 152 may be exposed by, e.g., a CMP process.

Portions of the first spacer 148 and the first variable resistance material layer 156 at an upper portion of the first hole 154 may be removed by an etch back process. Thus, a first variable resistance pattern 158 of which a sidewall may be covered by the first spacer 148 may be formed. Additionally, a first recess 159 may be defined by the upper portion of the first hole 154.

Referring to FIG. 24, a first upper electrode 164 may be formed in the first recess 159 to cover upper surfaces of the first spacer 148 and the first variable resistance pattern 158.

In example embodiments, a first upper electrode layer may be formed on the first spacer 148, the first variable resistance pattern 158 and the first insulation layer 152 to sufficiently fill the first recess 159, and may be planarized until an upper surface of the first insulation layer 152 may be exposed by a CMP process, so that the first upper electrode 164 may be formed to fill the first recess 159.

As illustrated above, the first variable resistance pattern 158 having a reduced width and/or area by the first spacer 148 may be formed by a damascene process. The first upper electrode 164 may be self-aligned by the first recess 159.

The first lower electrode 125, the first selection pattern 135, the first intermediate electrode 145, the first variable resistance pattern 158 and the first upper electrode 164 between the first and second conductive lines 115 and 175 may define a first memory cell 180b.

Referring to FIG. 25, the second conductive layer 170, the second lower electrode layer 200, the second selection material layer 210, the second intermediate electrode layer 220 and a second sacrificial layer 221 may be sequentially formed on the first insulation layer 152 and the first upper electrode 164.

The second sacrificial layer 221 may be formed of a material that is the same or substantially the same as that of the first sacrificial layer 141, e.g., nitride.

Referring to FIGS. 26A and 26B, the second sacrificial layer 221, the second intermediate electrode layer 220, the second selection material layer 210, the second lower electrode layer 200 and the second conductive layer 170 may be sequentially etched to form the second conductive line 175, the second lower electrode 205, the second selection pattern 215, the second intermediate electrode 225, and a second sacrificial pattern 223 sequentially stacked on the first insulation layer 152 and the first upper electrode 164.

For example, the second sacrificial layer 221, the second intermediate electrode layer 220, the second selection material layer 210, the second lower electrode layer 200 and the second conductive layer 170 may be etched along the first direction. Thus, the second conductive lines 175 may be formed from the second conductive layer 170, and each of the second sacrificial layer 221, the second intermediate electrode layer 220, the second selection material layer 210 and the second lower electrode layer 200 may be transformed into a line pattern extending in the first direction. A third filling insulation layer may be formed to fill spaces between the second conductive lines 175 and between the line patterns.

The second sacrificial layer 221, the second intermediate electrode layer 220, the second selection material layer 210, the second lower electrode layer 200 and the third filling insulation layer may be etched along the second direction. Thus, a second pillar structure including the second lower electrode 205, the second selection pattern 215, the second intermediate electrode 225 and the second sacrificial pattern 223 sequentially stacked on the second conductive line 175 may be formed.

In example embodiments, the first and second pillar structures may be formed in a zigzag pattern in the first direction. In an example embodiment, the first and second pillar structures may partially overlap with each other in a plan view.

A fourth filling insulation layer may be formed to fill spaces between the second pillar structures. The fourth filling insulation layer may extend in the first direction. The third and fourth filling insulation layers may be merged with each other to form a second insulation layer 232.

Figure 27:
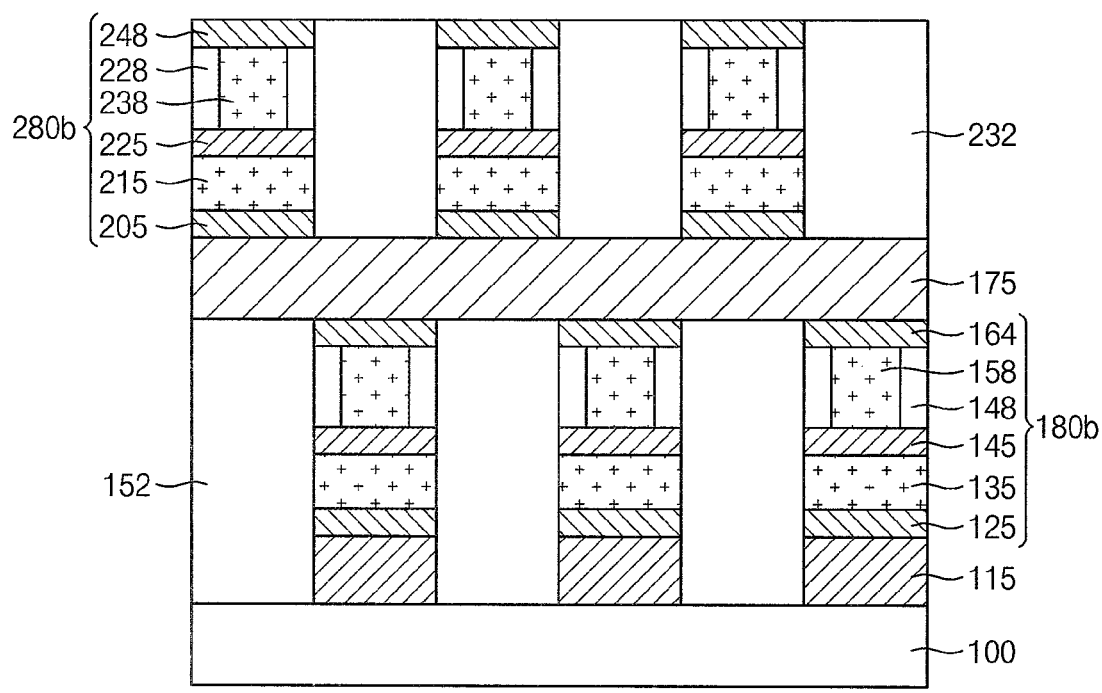
Figure 27:
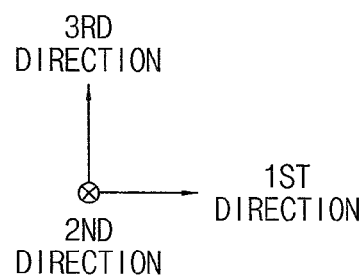

Referring to FIG. 27, processes that are the same as, substantially the same as, or similar to, those illustrated with reference to FIGS. 19 to 24 may be performed.

In example embodiments, the second sacrificial pattern 223 may be removed from the second pillar structure to form a second hole, and a second spacer 228 and a second variable resistance pattern 238 may be formed to partially fill the second hole. A second upper electrode 248 may be formed to cover upper surfaces of the second spacer 228 and the second variable resistance pattern 238.

The second lower electrode 205, the second selection pattern 215, the second intermediate electrode 225, the second variable resistance pattern 238 and the second upper electrode 248 sequentially stacked on the second conductive line 175 may define a second memory cell 280b.

Referring to FIGS. 15 and 16 again, a third conductive layer may be formed on the second insulation layer 232 and the second memory cell 280b. The third conductive layer may be etched along the second direction to form a plurality of third conductive lines 255 each extending in the second direction on a plurality of second memory cells 280b.

An upper insulation layer 261 may be formed of, e.g., silicon oxide on the second insulation layer 232 to fill spaces between the third conductive lines 255.

Figure 28:
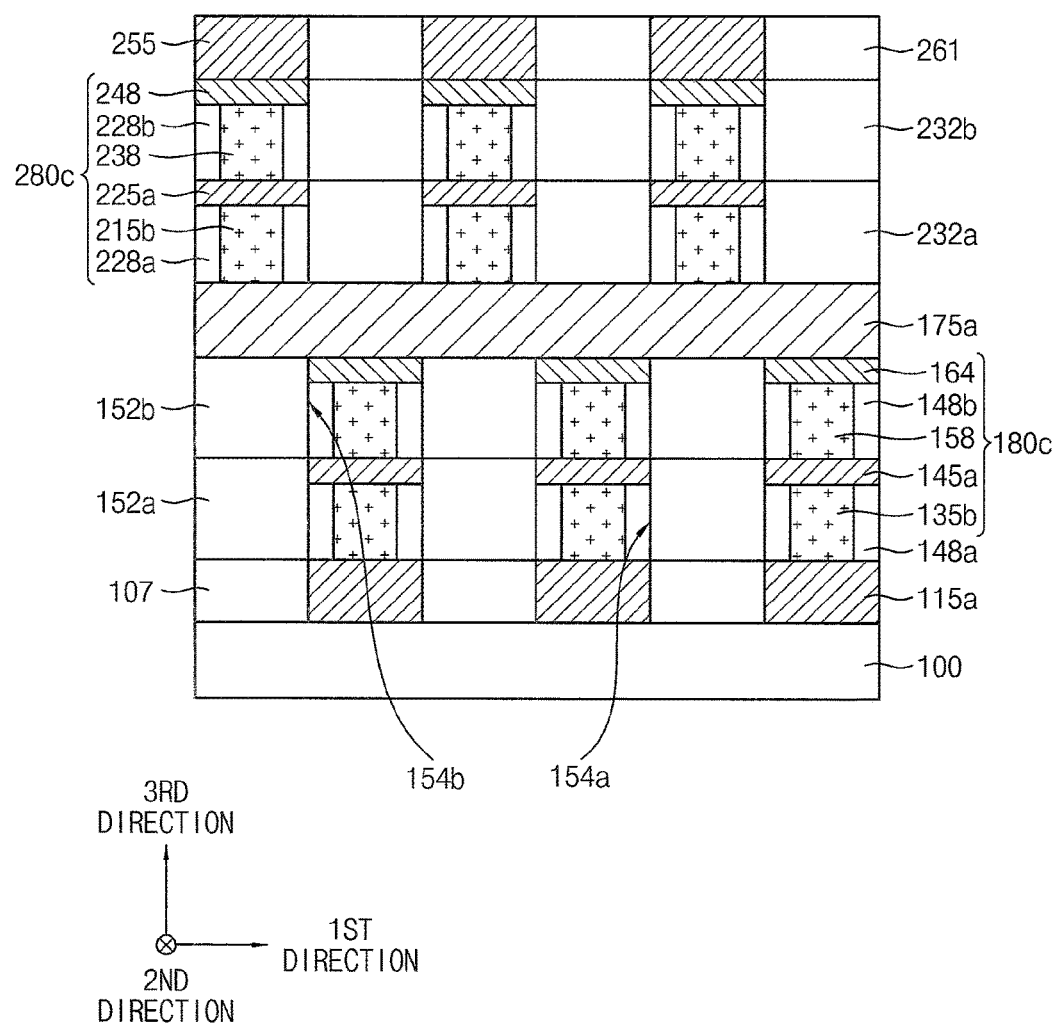
FIGS. 28 and 29 are cross-sectional views illustrating another variable resistance memory device in accordance with example embodiments.
Figure 29:
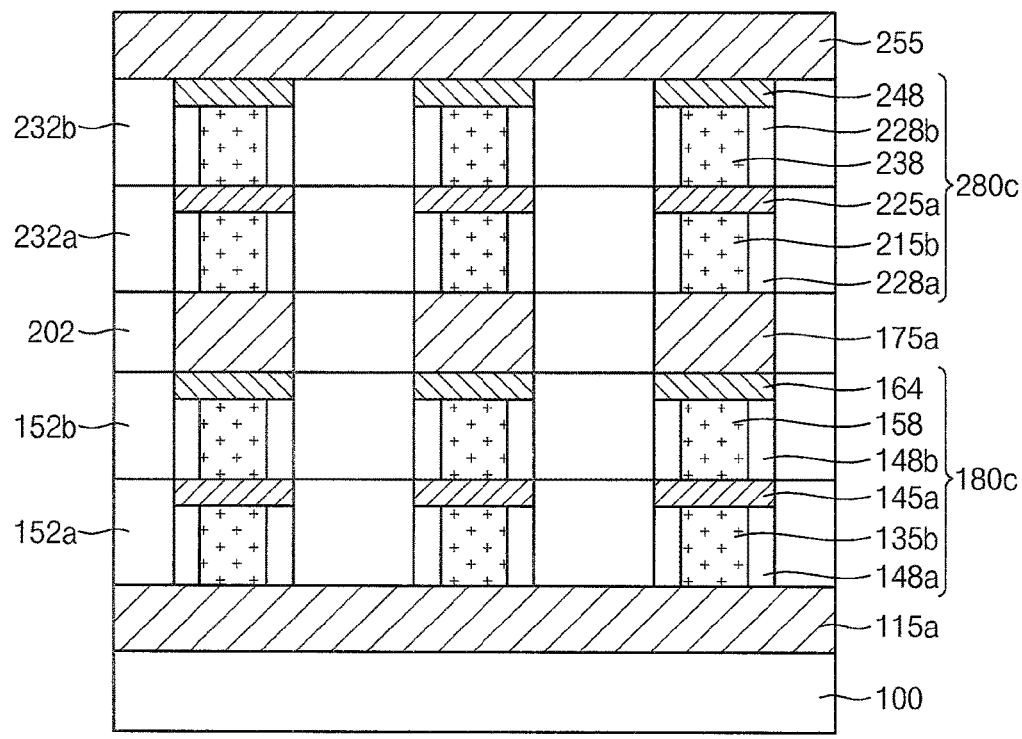
Figure 29:
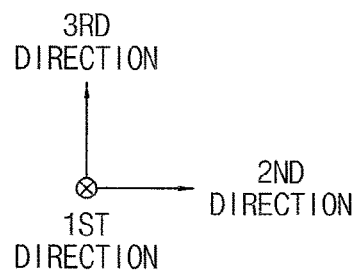

FIGS. 28 and 29 are cross-sectional views illustrating another variable resistance memory device in accordance with example embodiments. More particularly, FIG. 28 is a cross-sectional view of the variable resistance memory device taken along the first direction, and FIG. 29 is a cross-sectional view taken along the second direction, e.g., along a line I-I' of FIG. 15.

The variable resistance memory device may include elements that are substantially the same as or similar to those of the variable resistance memory device illustrated with reference to FIGS. 15 and 16. Thus, like reference numerals refer to like elements, and detailed descriptions thereon may be omitted below in the interest of brevity.

Referring to FIGS. 28 and 29, a first selection pattern 135b included in a first memory cell 180c may be formed by a damascene process.

For example, a lower insulation layer 107 and the first conductive line 115a may be formed on the substrate 100, and a first insulation layer 152a may cover the lower insulation layer 107 and the first conductive line 115a. A plurality of first holes 154a may be formed in the first insulation layer 152a, and each of the first holes 154a may expose an upper surface of the first conductive line 115a.

A first spacer 148a may be formed on a sidewall of the first hole 154a by processes that are the same as, substantially the same as, or similar to, those illustrated with reference to FIGS. 20 and 21. A first selection material layer may be formed to fill the first hole 154a, and an upper portion of the first selection material layer may be removed by a CMP process and an etch back process to form the first selection pattern 135b. By the etching back process, the first spacer 148a may be also partially removed, and a sidewall of the first selection pattern 135b may be covered by the first spacer 148a.

The first intermediate electrode 145a may be formed at an upper portion of the first hole 154a, and may cover upper surfaces of the first selection pattern 135b and the first spacer 148a.

By the damascene process, the first selection pattern 135b may be surrounded by the first spacer 148a, and an area of the first selection pattern 135b may be less than that of the first intermediate electrode 145a in a plan view.

A second insulation layer 152b may be formed on the first insulation layer 152a, and may cover the first intermediate electrodes 145a. The second insulation layer 152b may be partially etched to form a plurality of second holes 154b each exposing an upper surface of the first intermediate electrode 145a.

The first variable resistance pattern 158 may be formed in the second hole 154b. In an example embodiment, the first variable resistance pattern 158 may be formed by processes that are the same as, substantially the same as, or similar to, those illustrated with reference to FIGS. 20 to 24.

For example, a second spacer 148b may be formed on a sidewall of the second hole 154b, and a sidewall of the first variable resistance pattern 158 may be surrounded by the second spacer 148b. The first upper electrode 164 may be formed at an upper portion of the second hole 154b, and may cover upper surfaces of the first variable resistance pattern 158 and the second spacer 148b.

A second selection pattern 215b included in the second memory cell 280c may be formed by a damascene process. For example, a third hole (not shown) may be formed in the third insulation layer 232a, and a third spacer 228a may be formed on a sidewall of the third hole to cover a sidewall of the second selection pattern 215a. The second intermediate electrode 225a may be formed at an upper portion of the third hole, and may cover upper surfaces of the second selection pattern 215b and the third spacer 228a.

In an example embodiment, the second variable resistance pattern 238 may be formed by processes that are the same as, substantially the same as, or similar to, those illustrated with reference to FIGS. 20 to 24.

For example, a fourth insulation layer 232b may be formed on the third insulation layer 232a to cover the second intermediate electrodes 225a. A fourth hole (not shown) may be formed in the fourth insulation layer 232b to expose each of the second intermediate electrodes 225a, and a fourth spacer 228b, the second variable resistance pattern 238 and the second upper electrode 248 may be formed in the fourth hole.

Figure 30:
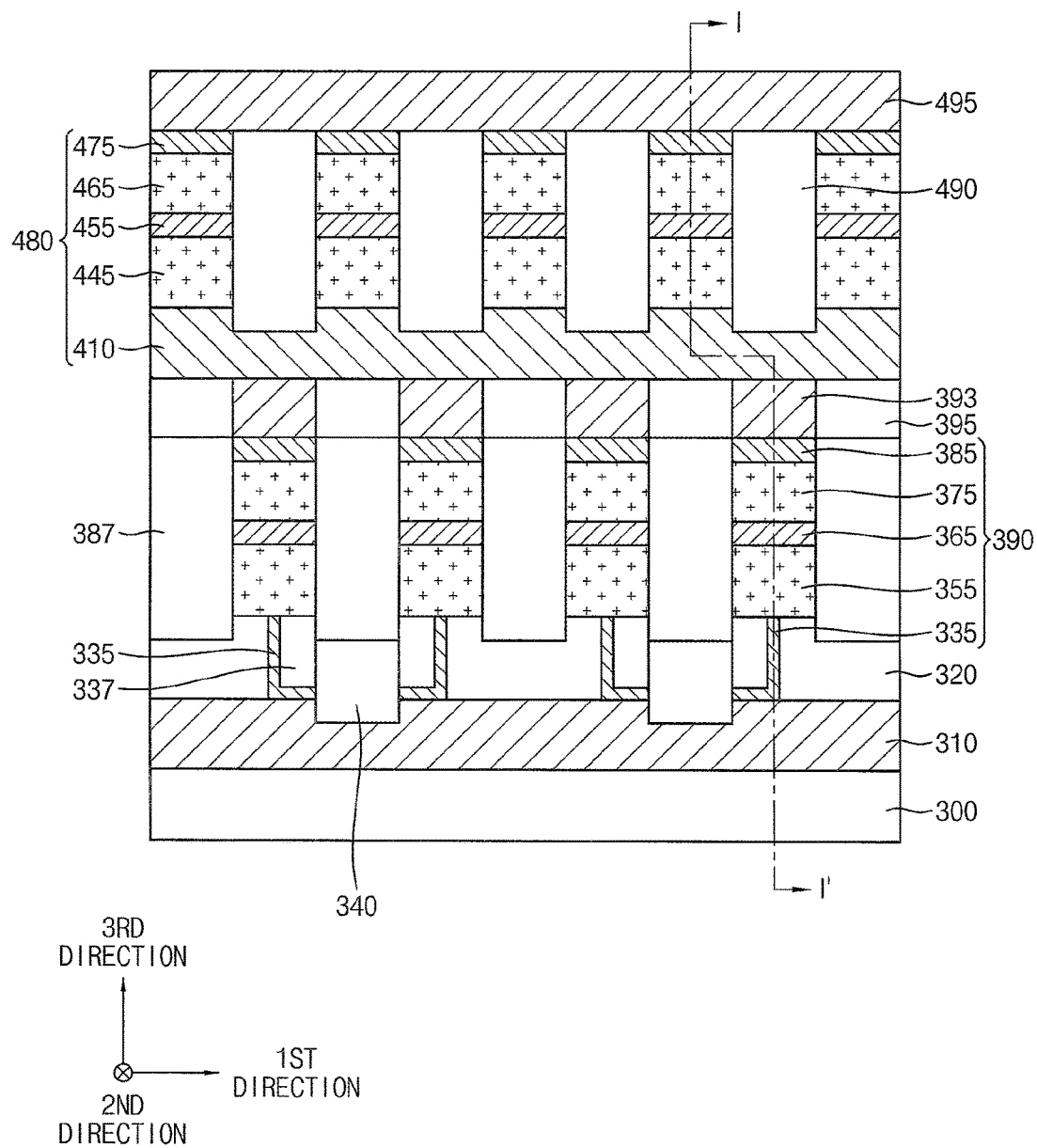
FIGS. 30 and 31 are cross-sectional views illustrating another variable resistance memory device in accordance with example embodiments.
Figure 31:
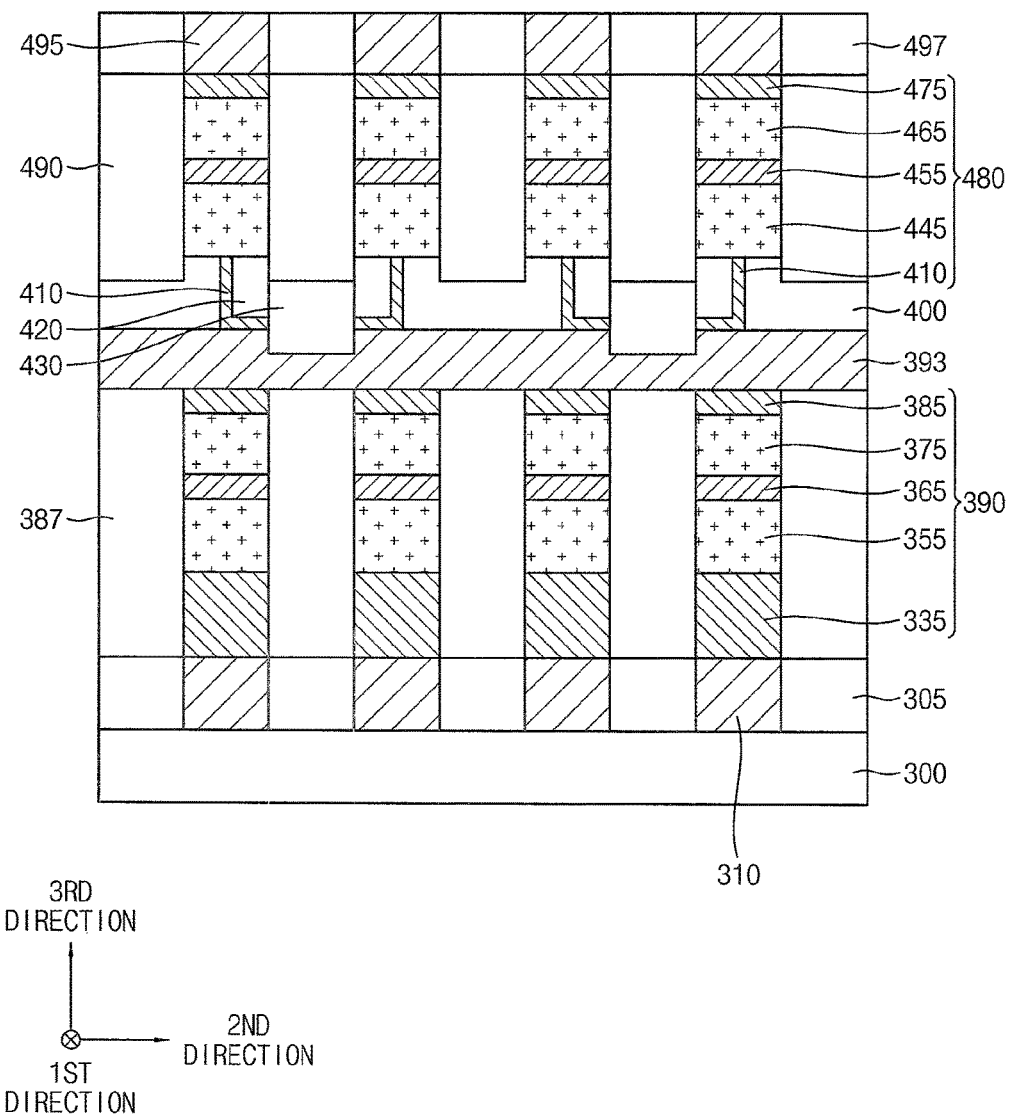

FIGS. 30 and 31 are cross-sectional views illustrating another variable resistance memory device in accordance with example embodiments. More particularly, FIG. 30 is a cross-sectional view of the variable resistance memory device taken along the first direction, and FIG. 31 is a cross-sectional view taken along the second direction, e.g., along a line I-I' of FIG. 30.

The variable resistance memory device may include elements that are the same as, substantially the same as, or similar to, those of the variable resistance memory device illustrated with reference to FIGS. 1 to 3. Thus, detailed descriptions on the common elements may be omitted below in the interest of brevity.

Referring to FIGS. 30 and 31, as illustrated with reference to FIGS. 1 to 3, a first conductive line 310, a second conductive line 393, and a third conductive line 495 may be spaced apart from each other and may cross each other in the third direction.

The first conductive line 310 may extend in the first direction, and a plurality of first conductive lines 310 may be spaced apart from each other in the second direction. The second conductive line 393 may extend in the second direction, and a plurality of second conductive lines 393 may be spaced apart from each other in the first direction. The third conductive line 495 may extend in the first direction, and a plurality of third conductive lines 495 may be spaced apart from each other in the second direction.

The first conductive lines 310 may be insulated from each other by a first insulation pattern 305. The second conductive lines 393 may be insulated from each other by a second insulation pattern 395. The third conductive lines 495 may be insulated from each other by a third insulation pattern 497.

A first memory cell 390 may be formed at each area where the first and second conductive lines 310 and 393 overlap with each other in the third direction, and a second memory cell 480 may be formed at each area where the second and third conductive lines 393 and 495 overlap with each other in the third direction.

In example embodiments, each of the first and second memory cells 390 and 480 may have a structure that may be reverse to that of each of the first and second memory cells 180 and 280 of the variable resistance memory device shown in FIGS. 1 to 3. In the first and second memory cells 390 and 480, the selection pattern may be overlying the variable resistance pattern.

For example, the first memory cell 390 may include a first lower electrode 335, a first variable resistance pattern 355, a first intermediate electrode 365, a first selection pattern 375 and a first upper electrode 385 sequentially stacked on the first conductive line 310.

The second memory cell 480 may include a second lower electrode 410, a second variable resistance pattern 445, a second intermediate electrode 455, a second selection pattern 465 and a second upper electrode 475 sequentially stacked on the second conductive line 393.

In example embodiments, the first lower electrode 335 may have a bent shape. For example, the first lower electrode 335 may have a horizontal portion and a vertical portion. The vertical portion of the first lower electrode 335 may have a pillar shape partially contacting a lower surface of the first variable resistance pattern 355. The horizontal portion of the first lower electrode 335 may have a tile shape contacting an upper surface of the first conductive line 310.

The first lower electrode 335 may have the bent shape so that the contact area between the first lower electrode 335 and the first variable resistance pattern 355 may be reduced. Thus, the efficiency of heating may be improved and/or enhanced.

In an example embodiment, the first lower electrode 335 may be included in the first memory cell 390, and may be buried in the first lower insulation layer 320. As shown in FIG. 30, a pair of first lower electrodes 335 may be formed to be symmetrical or substantially symmetrical to each other around a first filling insulation pattern 340. A first spacer 337 may be formed between the first lower electrode 335 and the first filling insulation pattern 340 under the first variable resistance pattern 355.

The second lower electrode 410 may have a bent shape including a horizontal portion and a vertical portion. The vertical portion of the second lower electrode 410 may partially contact a lower surface of the second variable resistance pattern 445. The horizontal portion of the second lower electrode 410 may contact an upper surface of the second conductive line 393. The second lower electrode 410 may have the bent shape so that the contact area between the second lower electrode 410 and the second variable resistance pattern 445 may be reduced. Thus, the efficiency of heating may be improved and/or enhanced.

In an example embodiment, the second lower electrode 410 may extend in the first direction, and may be commonly connected to a plurality of second memory cells 480. For example, a plurality of second memory cells 480 sharing one of the second lower electrodes 410 may define a second memory cell row.

The second lower electrode 410 may be buried in a second lower insulation layer 400. As shown in FIG. 31, a pair of second lower electrodes 410 may be formed to be symmetrical to each other around a second filling insulation pattern 430. A second spacer 420 may be formed between the second lower electrode 410 and the second filling insulation pattern 430 under the second variable resistance pattern 445.

A first insulation layer 387 may be formed on the first lower insulation layer 320, the first filling insulation pattern 340 and the first insulation pattern 305, and the first memory cells 390 may be divided or insulated from each other by the first insulation layer 387.

A second insulation layer 490 may be formed on the second lower insulation layer 400, the second filling insulation pattern 430 and the second lower electrode 410. The second memory cells 480 may be divided or insulated from each other by the second insulation layer 490.

The first and second lower insulation layers 320 and 400, the first and second filling insulation patterns 340 and 430, the first and second insulation layers 387 and 490, and the first to third insulation patterns 305, 395 and 497 may include, e.g., silicon oxide. The first and second spacers 337 and 420 may include, e.g., silicon nitride or silicon oxynitride.

A plurality of first memory cells 390 sharing one of the first conductive lines 310 may define a first memory cell row. The first and second memory cell rows may define a memory cell row, and as illustrated with reference to FIGS. 1 to 3, the first and second memory cells 390 and 480 of the memory cell row may be disposed in a zigzag pattern or offset or shifted from each other in the third direction.

In an example embodiment, the first and second memory cells of the memory cell row may partially overlap with each other in a plan view.

FIGS. 32A and 32B to 40A and 40B are cross-sectional views illustrating stages of another method of manufacturing a variable resistance memory device, e.g., the variable resistance memory device shown in FIGS. 30 and 31, in accordance with example embodiments.

Figure 34A:
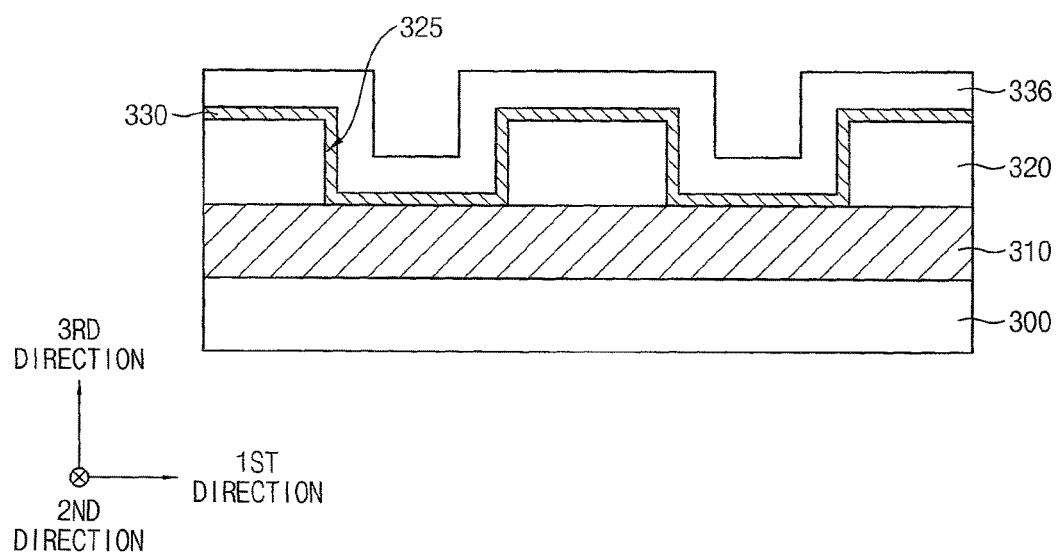
Figure 34B:
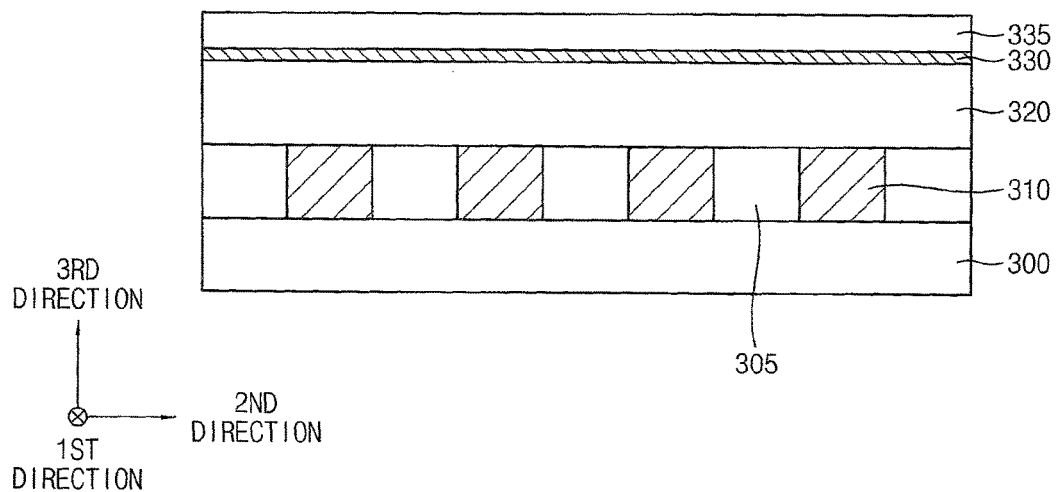
Figure 35A:
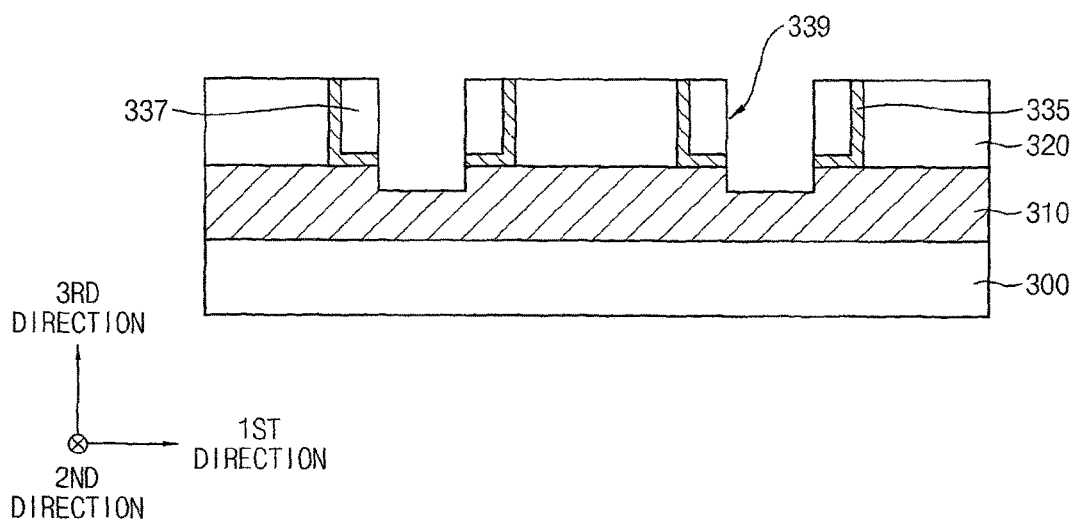
Figure 35B:
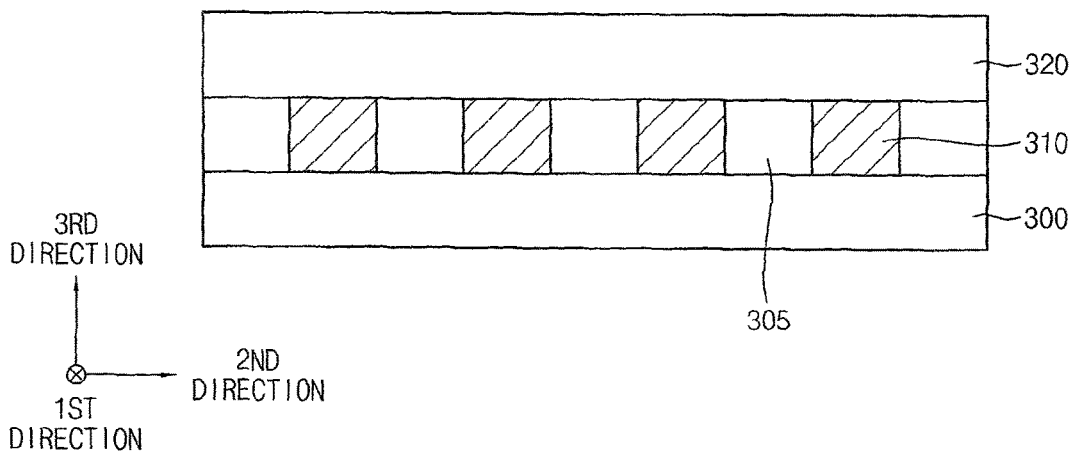
Figure 36A:
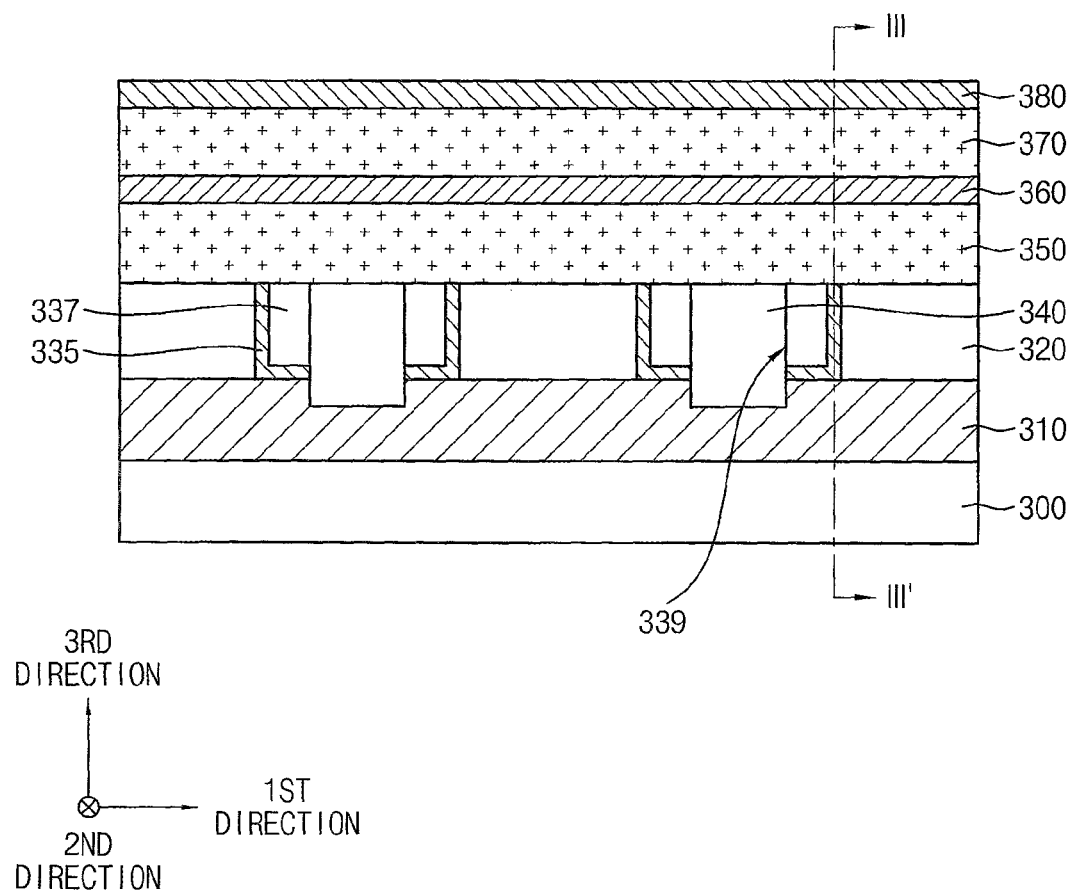

More particularly, FIGS. 32A, 33A, 34A, 35A, 36A, 37A, 38A, 39A and 40A are cross-sectional views taken along the first direction, FIGS. 32B, 33B, 34B and 35B are cross-sectional views taken along the second direction, e.g., along a lines II-IF of FIG. 32A, and FIGS. 36B, 37B, 38B, 39B and 40B are cross-sectional views taken along the second direction, e.g., along a lines III-III' of FIG. 36A or along a line I-I' of FIG. 30.

This method may include processes that are the same as, substantially the same, as or similar to, those illustrated with reference to FIGS. 4 to 11, and detailed descriptions thereof are omitted herein.

Figure 32A:
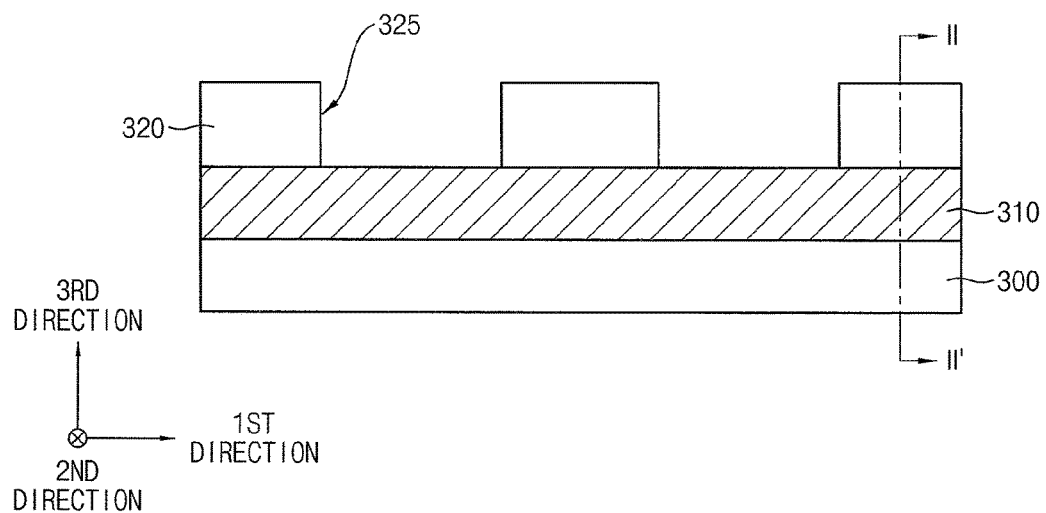
Figure 32B:
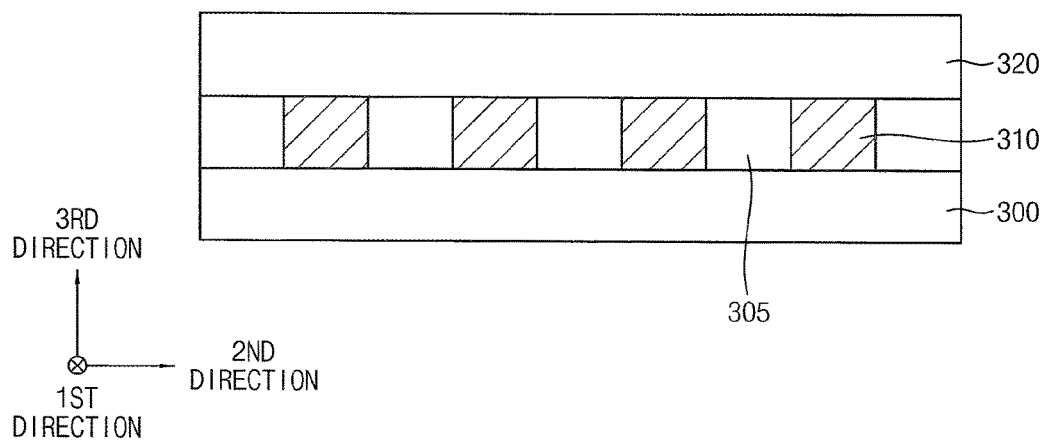

Referring to FIGS. 32A and 32B, a first conductive line 310 and a first insulation pattern 305 may be formed on a substrate 300, and a first lower insulation layer 320 may be formed on the first conductive line 310 and the first insulation pattern 305.

In example embodiments, a first conductive layer may be formed on the substrate 300, and may be etched along the first direction to form a plurality of first conductive lines 310. The first insulation pattern 305 may be formed to fill spaces between the first conductive lines 310.

The first lower insulation layer 320 may be etched to form a first opening 325. The first opening 325 may extend in the second direction, and may expose upper surfaces of the first conductive line 310 and the first insulation pattern 305.

Figure 33A:
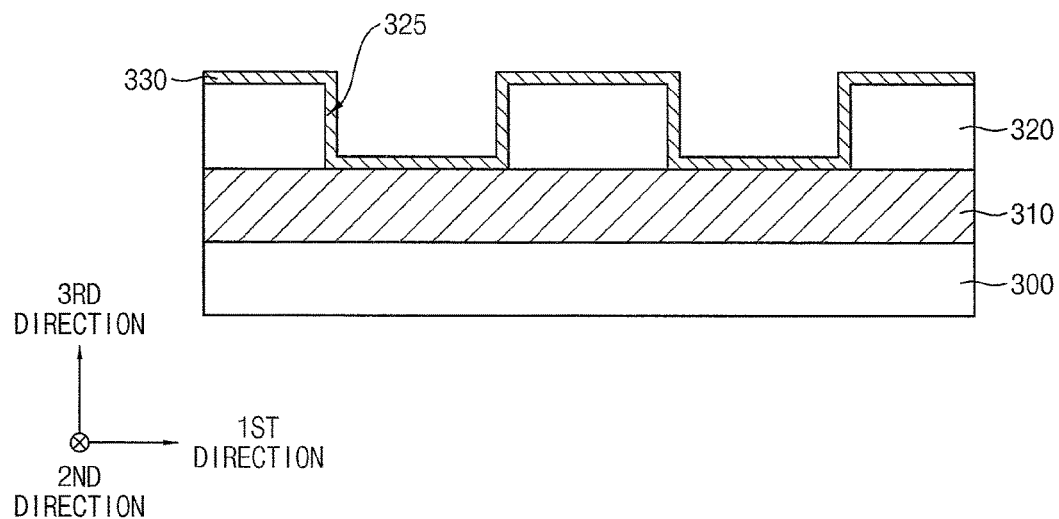
Figure 33B:
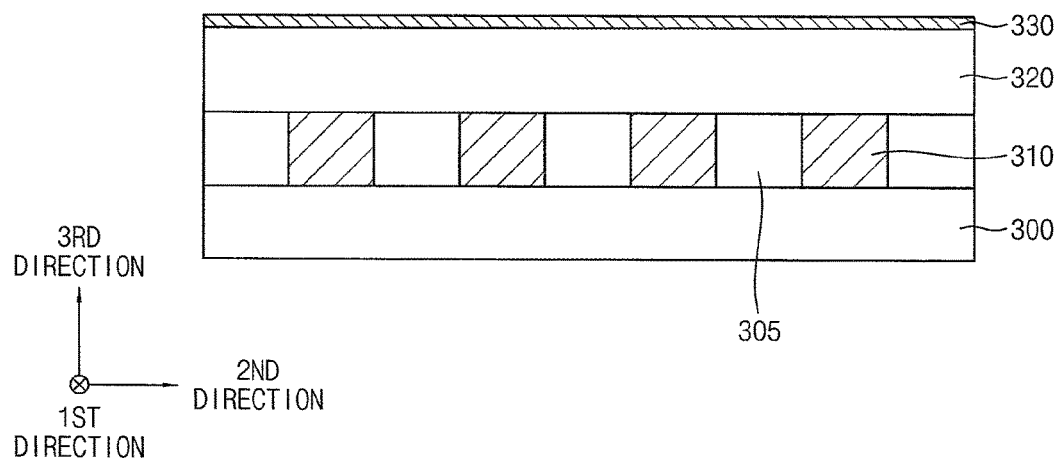

Referring to FIGS. 33A and 33B, a first lower electrode layer 330 may be conformally formed on the exposed upper surfaces of the first conductive line 310 and the first insulation pattern 305, a sidewall of the first opening 325, and an upper surface of the first lower insulation layer 320.

Referring to FIGS. 34A and 34B, a first spacer layer 336 may be formed on the first lower electrode layer 330 to partially fill the first opening 325.

For example, the first spacer layer 336 may be formed of, e.g., silicon oxide or silicon oxynitride by a CVD process or an ALD process.

Referring to FIGS. 35A and 35B, the first spacer layer 336 and the first lower electrode layer 330 may be partially removed to form a first spacer 337 and a first lower electrode 335, respectively.

In example embodiments, the first spacer layer 336 and the first lower electrode layer 330 may be planarized until an upper surface of the first lower insulation layer 320 may be exposed by a CMP process. Portions of the first spacer layer 336 and the first lower electrode layer 330 on a bottom of the first opening 325 may be removed.

Thus, the first lower electrode 335 having a bent shape may be formed to extend in the second direction, and the first spacer 337 may be formed on the first lower electrode 335.

In an example embodiment, a first recess 339 may be formed from the first opening 325. A pair of first lower electrodes 335 and a pair of first spacers 337 adjacent to the first recess 339 may face each other.

Figure 36B:
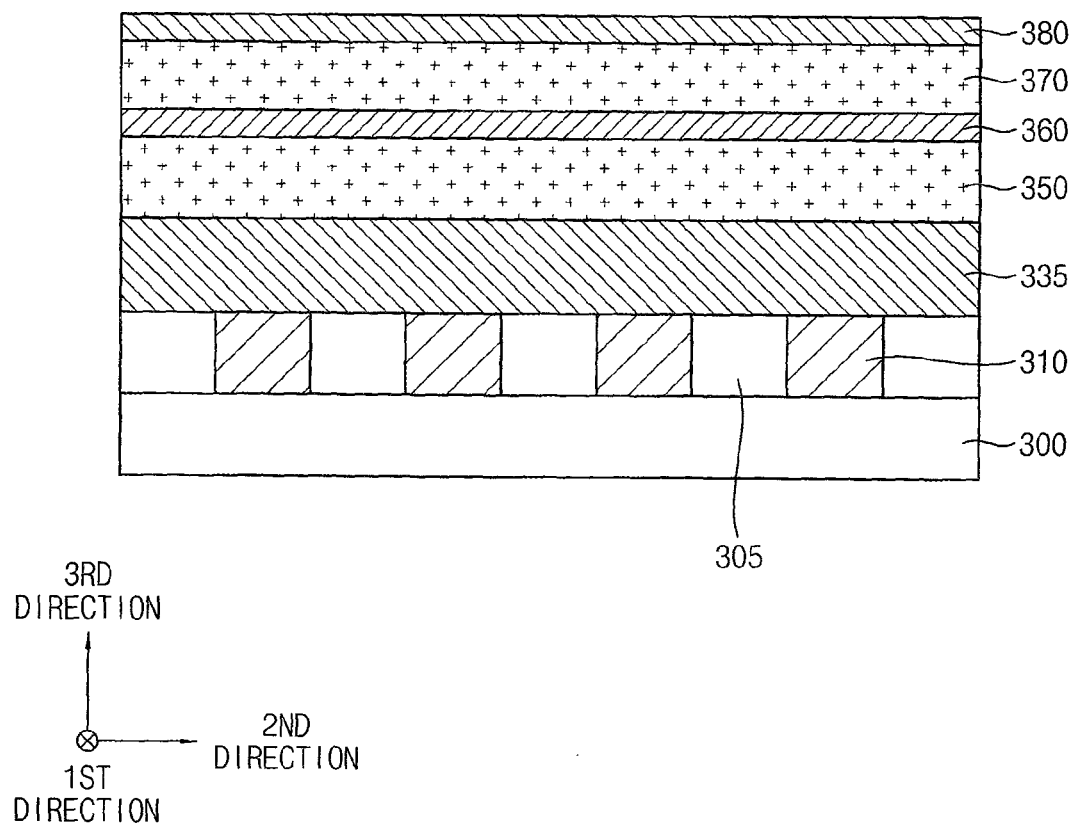

Referring to FIGS. 36A and 36B, a first filling insulation pattern 340 may be formed of, e.g., silicon oxide to fill the first recess 339.

A first variable resistance material layer 350, a first intermediate electrode layer 360, a first selection material layer 370 and a first upper electrode layer 380 may be sequentially formed on the first lower insulation layer 320, the first spacer 337 and the first filling insulation pattern 340.

Figure 37A:
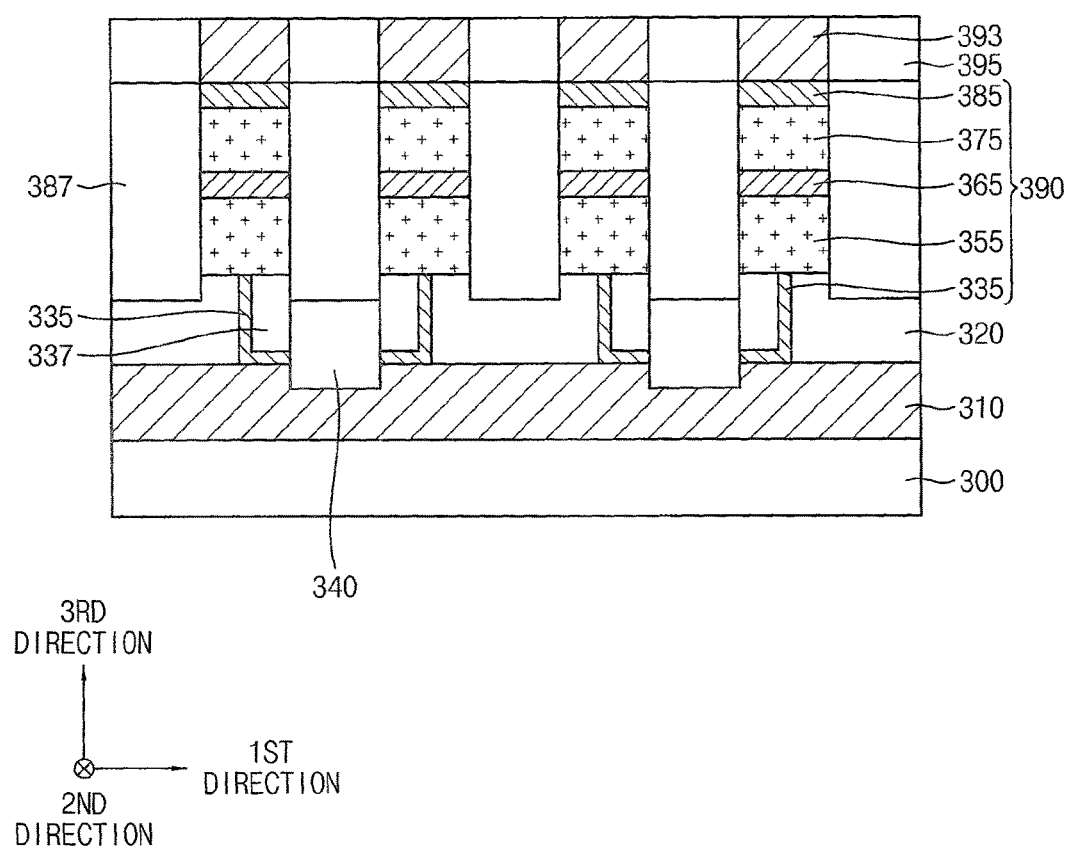
Figure 37B:
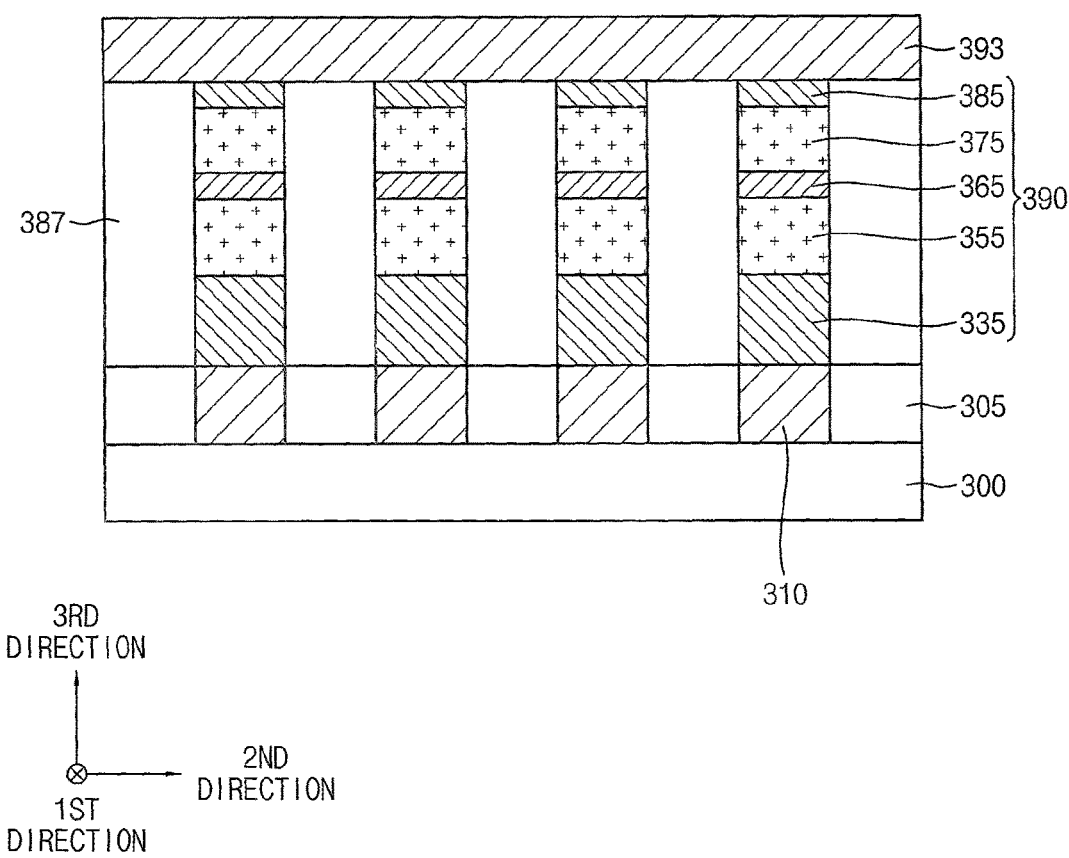

Referring to FIGS. 37A and 37B, the first upper electrode layer 380, the first selection material layer 370, the first intermediate electrode layer 360, the first variable resistance material layer 350 and the first lower electrode 335 may be sequentially etched along the first and second directions.

The etching process along the second direction may be performed until an upper surface of the first filling insulation pattern 340 may be exposed. By the etching process along the second direction, upper portions of the first lower insulation layer 320 and the first filling insulation pattern 340 may be partially etched. The etching process along the first direction may be performed until an upper surface of the first insulation pattern 305 may be exposed.

By the etching process, the first lower electrode 335 may be cut by the unit of memory cell along the second direction. A first variable resistance pattern 355, a first intermediate electrode 365, a first selection pattern 375 and a first upper electrode 385 may be sequentially stacked on the first lower electrode 335.

Thus, a first memory cell 390 including the first lower electrode 335, the first variable resistance pattern 355, the first intermediate electrode 365, the first selection pattern 375 and the first upper electrode 385 sequentially stacked may be formed.

A first insulation layer 387 covering sidewalls of the first memory cells 390 may be formed on the first lower insulation layer 320, the first filling insulation pattern 340 and the first insulation pattern 305. The first insulation layer 387 may be formed of, e.g., silicon oxide by a CVD process.

A plurality of second conductive lines 393 each extending in the second direction to be connected to the plurality of first upper electrodes 385 disposed in the second direction may be formed. A second insulation pattern 395 may be formed of, e.g., silicon oxide on the first insulation layer 387 to fill spaces between the second conductive lines 393.

Figure 38A:
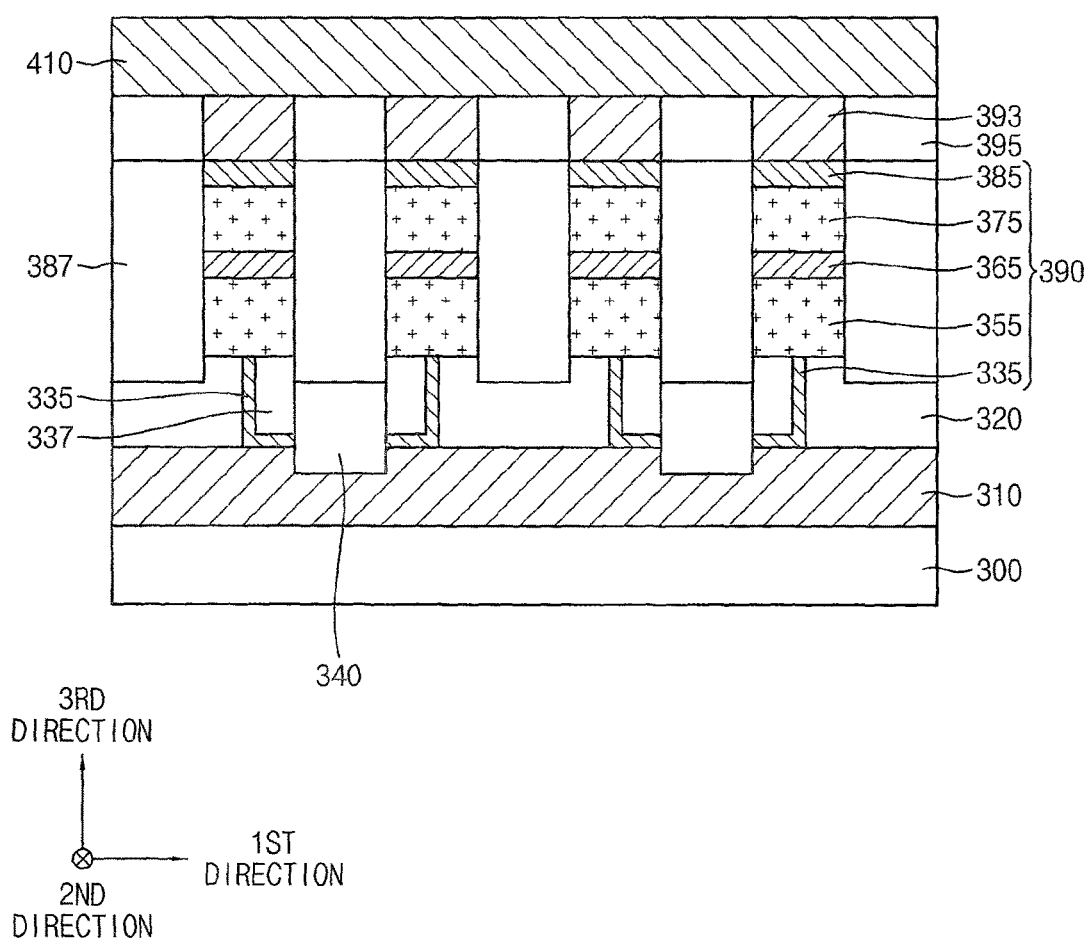
Figure 38B:
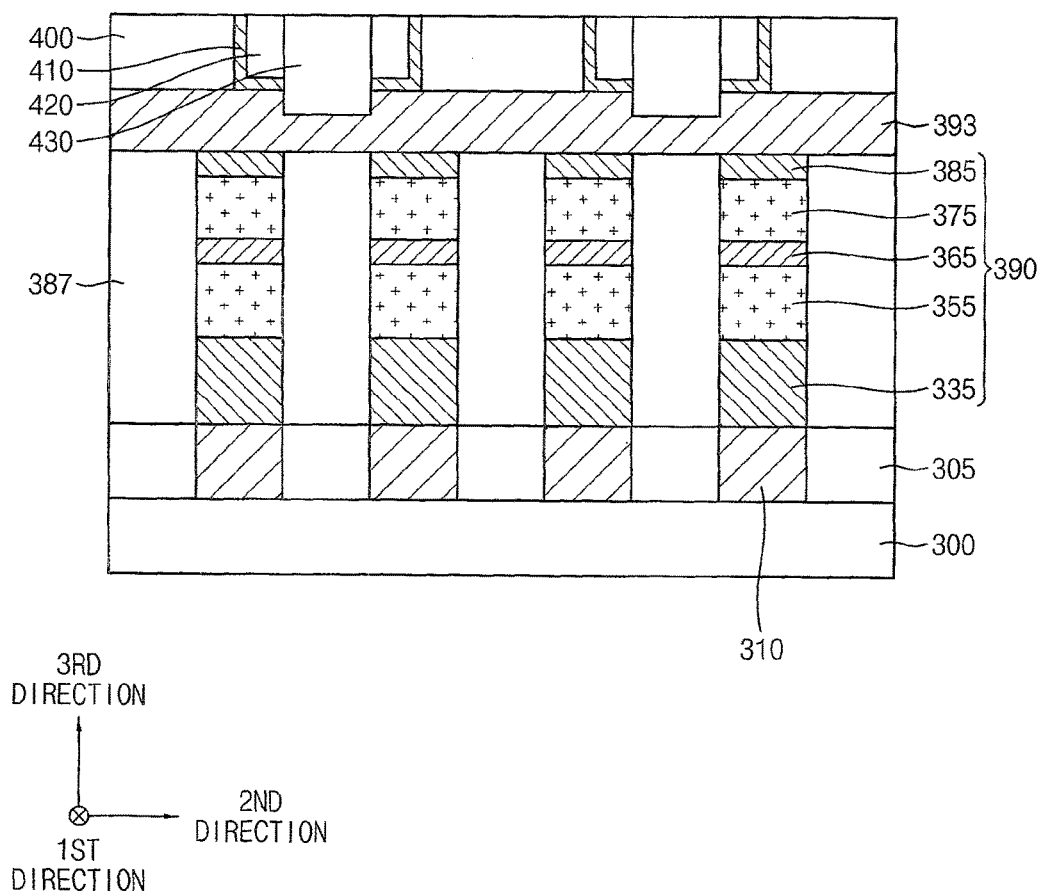

Referring to FIGS. 38A and 38B, processes that are the same as, substantially the same as, or similar to, those illustrated with reference to FIGS. 32A and 32B to 35A and 35B may be performed.

Thus, a second lower insulation layer 400 may be formed on the second conductive line 393 and the second insulation pattern 395, and a second lower electrode 410 may be formed to have a bent shape in the second lower insulation layer 400. The second lower electrode 410 may extend in the first direction to be electrically connected to the plurality of second conductive lines 393 disposed in the first direction.

A second filling insulation pattern 430 may be formed between a pair of second lower electrodes 410, and a second spacer 420 may be formed between the second filling insulation pattern 430 and the second lower electrode 410. Each of the second filling insulation pattern 430 and the second spacer 420 may extend in the first direction.

For example, the lower insulation layer 400 and the second filling insulation pattern 430 may be formed of, e.g., silicon oxide, and the second spacer 420 may be formed of, e.g., silicon nitride or silicon oxynitride.

Figure 39A:
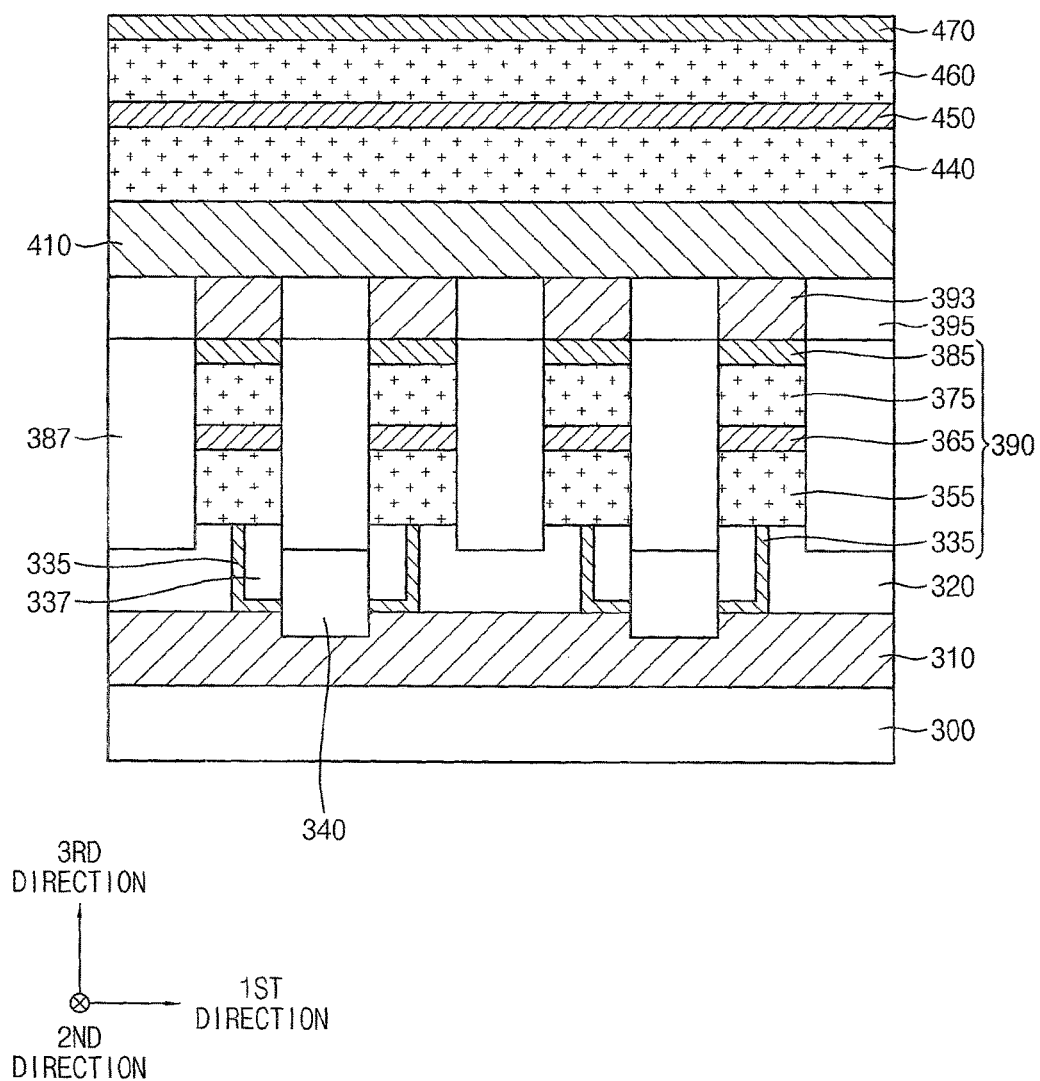
Figure 39B:
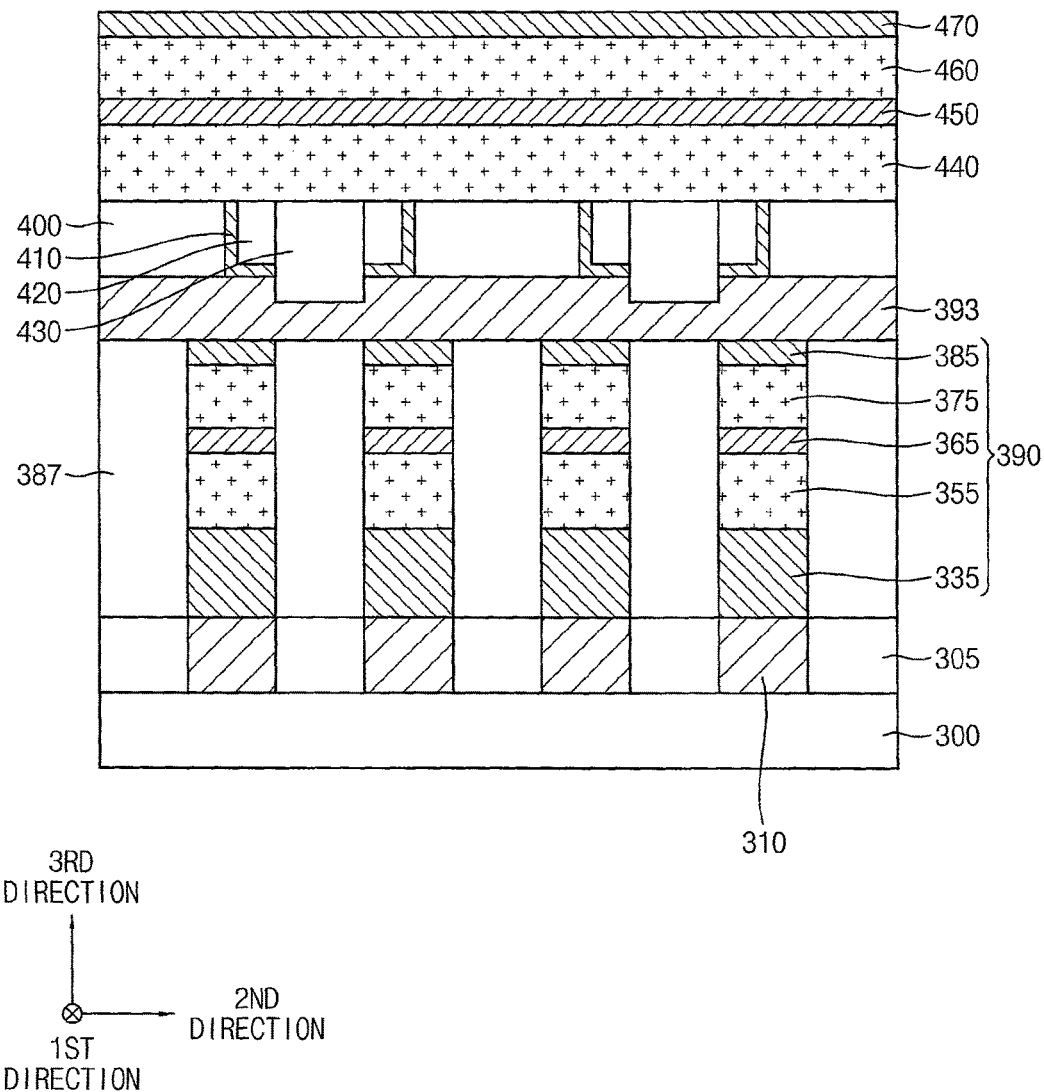

Referring to FIGS. 39A and 39B, a second variable resistance material layer 440, a second intermediate electrode layer 450, a second selection material layer 460 and a second upper electrode layer 470 may be sequentially formed on the second lower insulation layer 400, the second lower electrode 410, the second spacer 420 and the second filling insulation pattern 430.

Figure 40A:
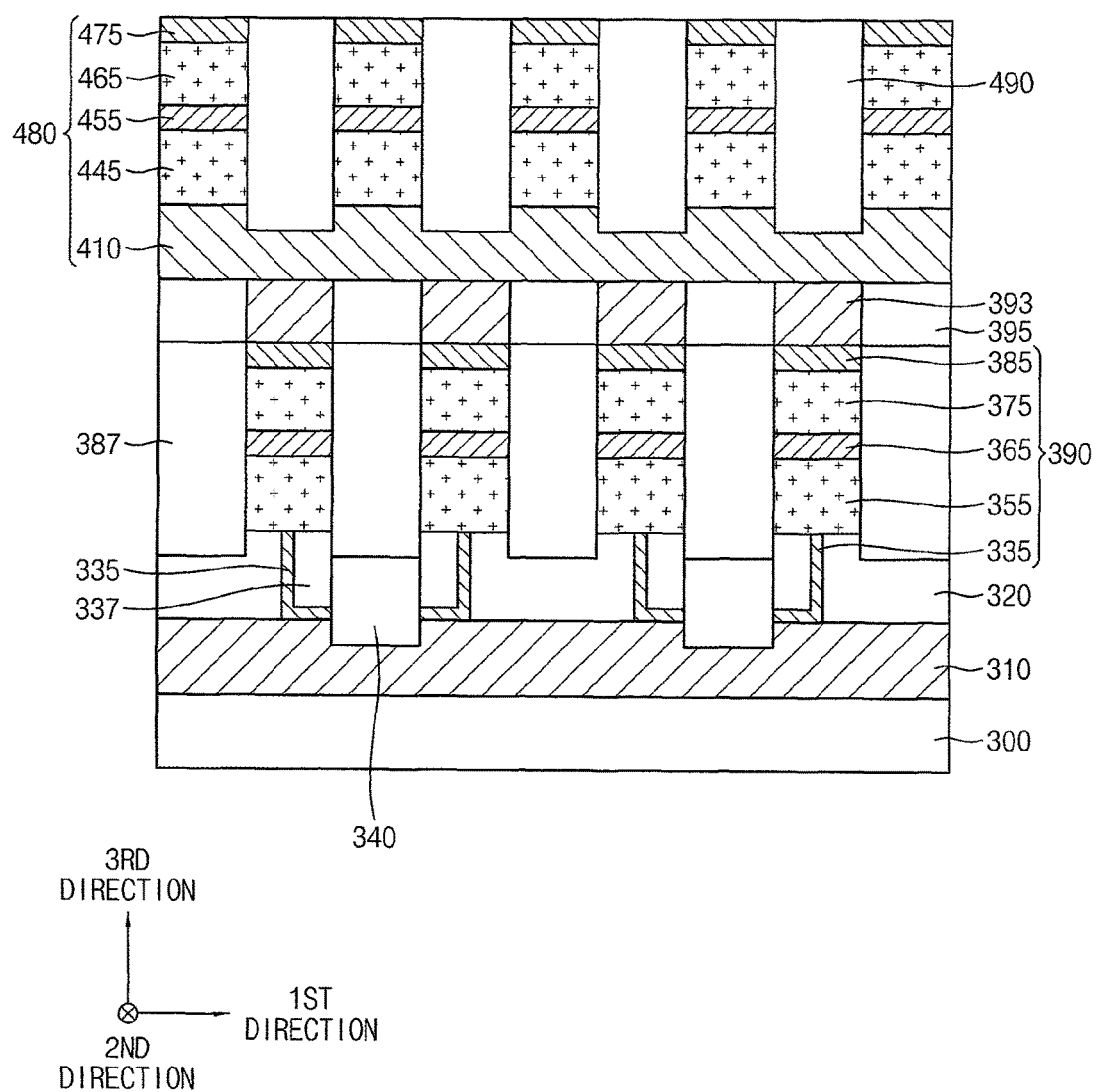
Figure 40B:
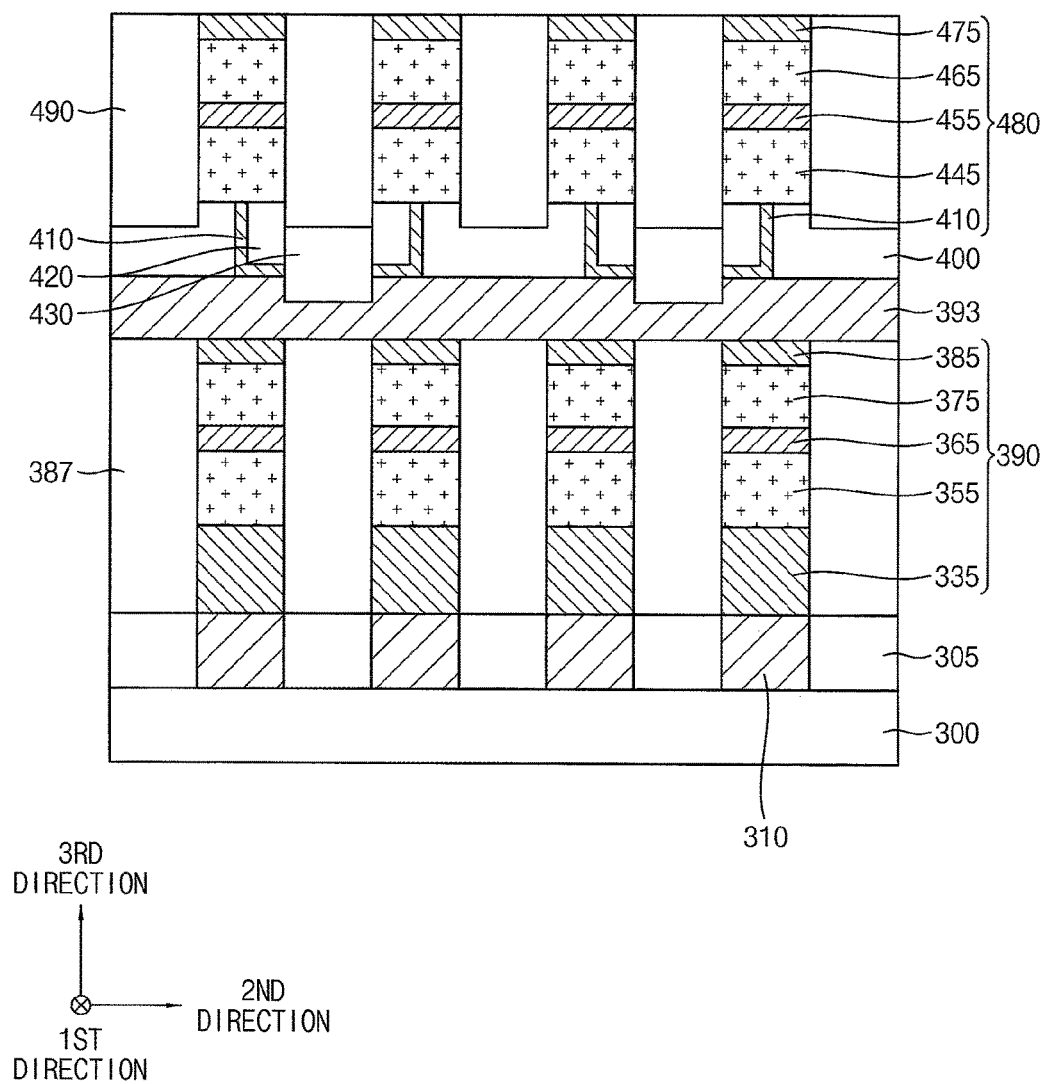

Referring to FIGS. 40A and 40B, the second upper electrode layer 470, the second selection material layer 460, the second intermediate electrode layer 450 and the second variable resistance material layer 440 may be sequentially etched along the second direction and the first direction.

The etching process along the second direction may be performed until an upper surface of the second lower electrode 410 may be exposed. In an example embodiment, by the etching process along the second direction, an upper portion of the second lower electrode 410 may be also partially etched.

The etching process along the first direction may be performed until an upper surface of the second filling insulation pattern 430 may be exposed. In an example embodiment, by the etching process along the first direction, upper portions of the second lower insulation layer 400 and the second filling insulation pattern 430 may be also partially etched.

By the etching process, a second variable resistance pattern 445, a second intermediate electrode 455, a second selection pattern 465 and a second upper electrode 475 sequentially stacked on the second lower electrode 410 may be formed. Additionally, a plurality of second memory cells 480 each including the second lower electrode 410, the second variable resistance pattern 445, the second intermediate electrode 455, the second selection pattern 465 and the second upper electrode 475 sequentially stacked may be formed.

A second insulation layer 490 may be formed of, e.g., silicon oxide on the second lower electrode 410, the second lower insulation layer 400, and the second filling insulation pattern 430 to cover sidewalls of the second memory cells 480.

Referring to FIGS. 30 and 31 again, a plurality of third conductive lines 495 each extending in the first direction to be electrically connected to the plurality of second upper electrodes 475 may be formed. A third insulation pattern 497 may be formed of, e.g., silicon oxide on the second insulation layer 490 to fill spaces between the third conductive lines 495.

Figure 41:
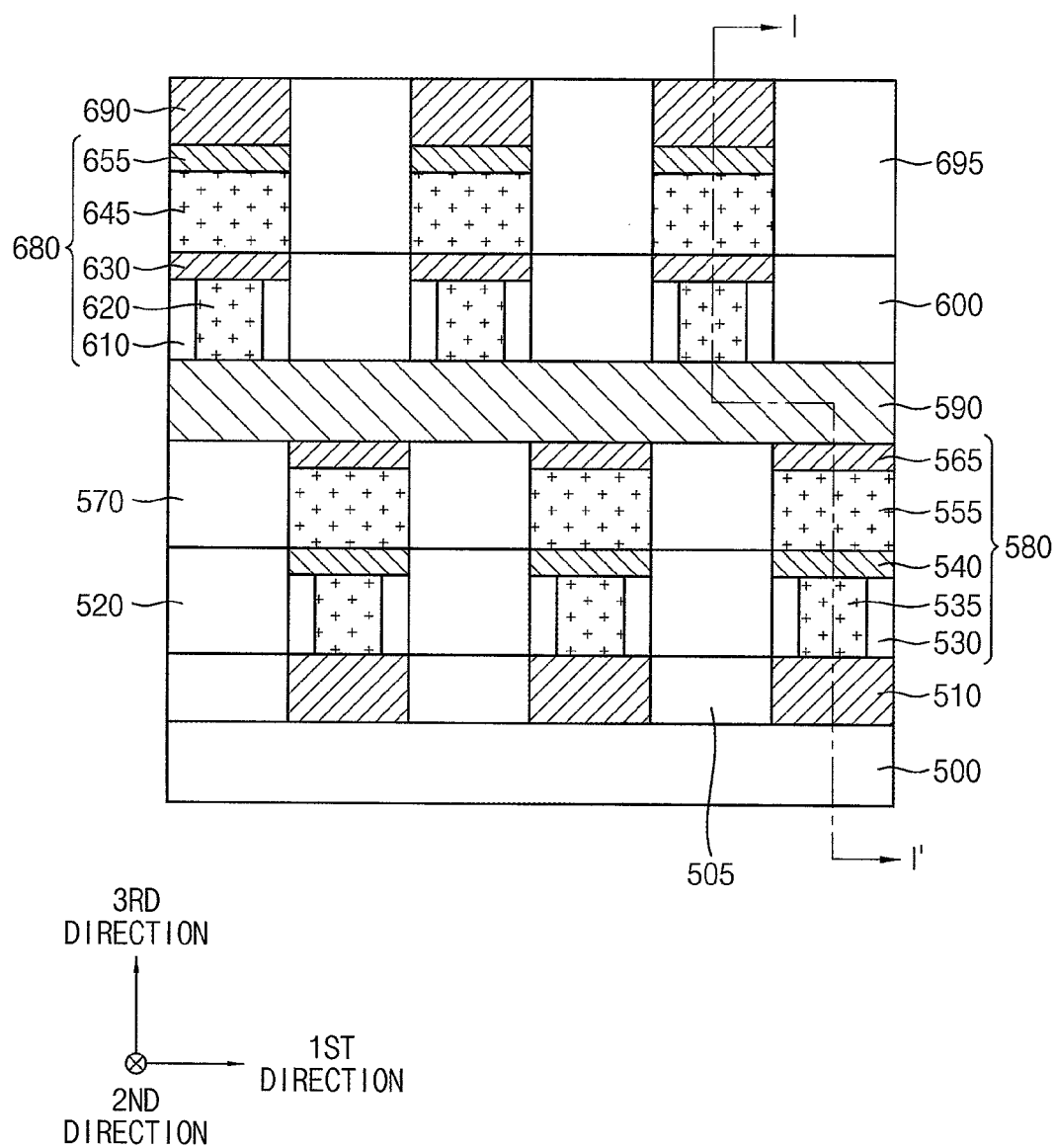
FIGS. 41 and 42 are cross-sectional views illustrating another variable resistance memory device in accordance with example embodiments.
Figure 42:
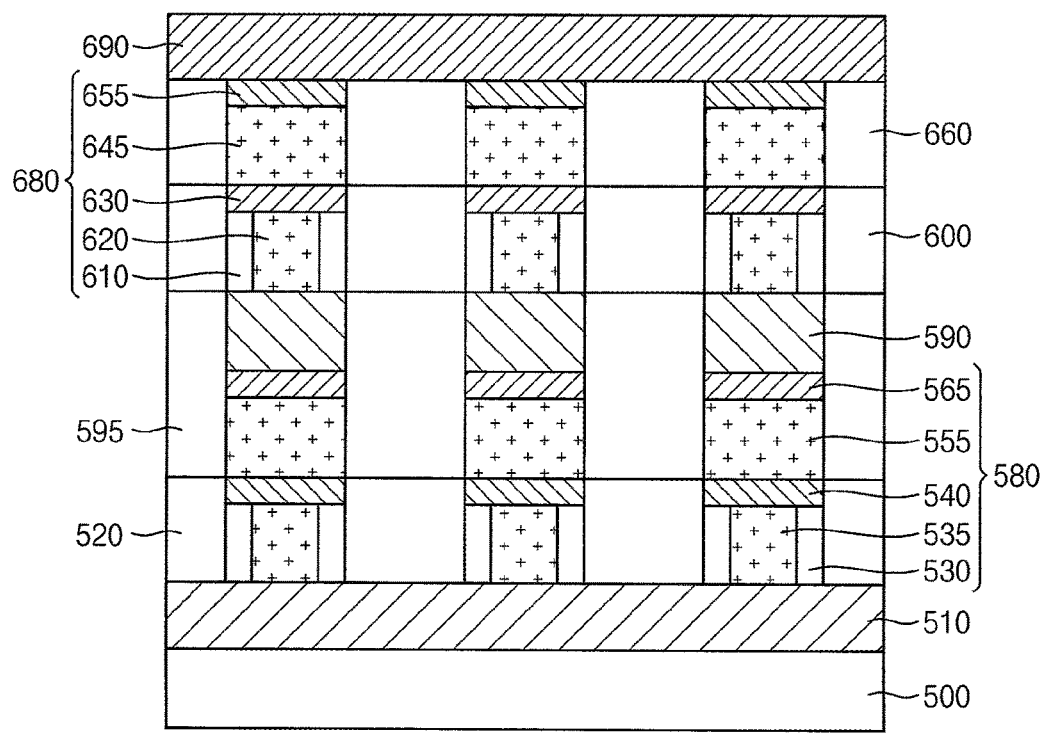
Figure 42:
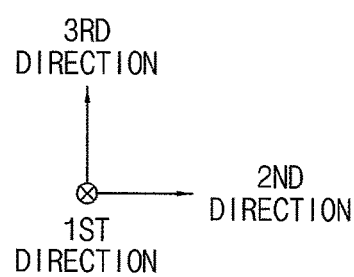

FIGS. 41 and 42 are cross-sectional views illustrating another variable resistance memory device in accordance with example embodiments. More particularly, FIG. 41 is a cross-sectional view of the variable resistance memory device taken along the first direction, and FIG. 42 is a cross-sectional view taken along the second direction, e.g., along a line I-I' of FIG. 41.

The variable resistance memory device may include elements the same as, substantially the same as, or similar to, those of the variable resistance memory device illustrated with reference to FIGS. 1 to 3. Thus, detailed descriptions on the common elements may be omitted below in the interest of brevity.

Referring to FIGS. 41 and 42, as illustrated with reference to FIGS. 1 to 3, a first conductive line 510, a second conductive line 590, and a third conductive line 690 may be spaced apart from each other and may cross each other in the third direction.

The first conductive line 510 may extend in the second direction, and a plurality of first conductive lines 510 may be spaced apart from each other in the first direction. The second conductive line 590 may extend in the first direction, and a plurality of second conductive lines 590 may be spaced apart from each other in the second direction. The third conductive line 690 may extend in the second direction, and a plurality of third conductive lines 690 may be spaced apart from each other in the first direction.

A first memory cell 580 may be formed at each area where the first and second conductive lines 510 and 590 overlap with each other, and a second memory cell 680 may be formed at each area where the second and third conductive lines 590 and 690 overlap with each other.

In example embodiments, each of the first and second memory cells 580 and 680 may have a structure that may be reverse to that of each of the first and second memory cells 180 and 280 of the variable resistance memory device shown in FIGS. 1 to 3. In the first and second memory cells 580 and 680, the selection pattern may be overlying the variable resistance pattern.

For example, the first memory cell 580 may include a first variable resistance pattern 535, a first intermediate electrode 540, a first selection pattern 555 and a first upper electrode 565 sequentially stacked on the first conductive line 510.

The second memory cell 680 may include a second variable resistance pattern 620, a second intermediate electrode 630, a second selection pattern 645 and a second upper electrode 655 sequentially stacked on the second conductive line 590.

The first variable resistance pattern 535 may have a structure and/or a shape that is the same as, substantially the same as, or similar to, that illustrated with reference to the FIGS. 15 and 16. In example embodiments, the first variable resistance pattern 535 may be surrounded by a first spacer 530, and may have a width and/or an area less than those of the first selection pattern 555 and/or the first intermediate electrode 540.

The second variable resistance pattern 620 may also have a structure and/or a shape that is the same as, substantially the same as, or similar to, that illustrated with reference to the FIGS. 15 and 16. In example embodiments, the second variable resistance pattern 620 may be surrounded by a second spacer 610, and may have a width and/or an area less than those of the second selection pattern 645 and/or the second intermediate electrode 630.

In example embodiments, as illustrated with reference to FIGS. 1 to 3, the first and second memory cells 580 and 680 may be disposed in a zigzag pattern in the first direction.

In an example embodiment, as illustrated with reference to FIGS. 13 and 14, the first and second memory cells 580 and 680 may partially overlap with each other in a plan view.

The first conductive lines 510 may be divided or insulated from each other by a first insulation pattern 505. The first memory cells 580 and the second conductive lines 590 may be divided or insulated from each other by a first lower insulation layer 520, a first insulating interlayer 570 and a second insulating interlayer 595. The second memory cells 680 and the third conductive lines 690 may be divided or insulated from each other by a second lower insulation layer 600, a third insulating interlayer 660 and a fourth insulating interlayer 695. The insulation layers and the insulating interlayers may include, e.g., silicon oxide.

FIGS. 43A and 43B to 50A and 50B are cross-sectional views illustrating stages of another method of manufacturing a variable resistance memory device, e.g., the variable resistance memory device shown in FIGS. 41 and 42, in accordance with example embodiments.

More particularly, FIGS. 43A, 44A, 45A, 46A, 47A, 48A, 49A and 50A are cross-sectional views taken along the first direction, and FIGS. 43B, 44B, 45B, 46B, 47B, 48B, 49B and 50B are cross-sectional views taken along the second direction, e.g., along a line I-I' of FIG. 41.

This method may include processes that are the same as, substantially the same as, or similar to, those illustrated with reference to FIGS. 4 to 11 or FIGS. 17 to 27, and detailed descriptions thereon are omitted herein.

Figure 43A:
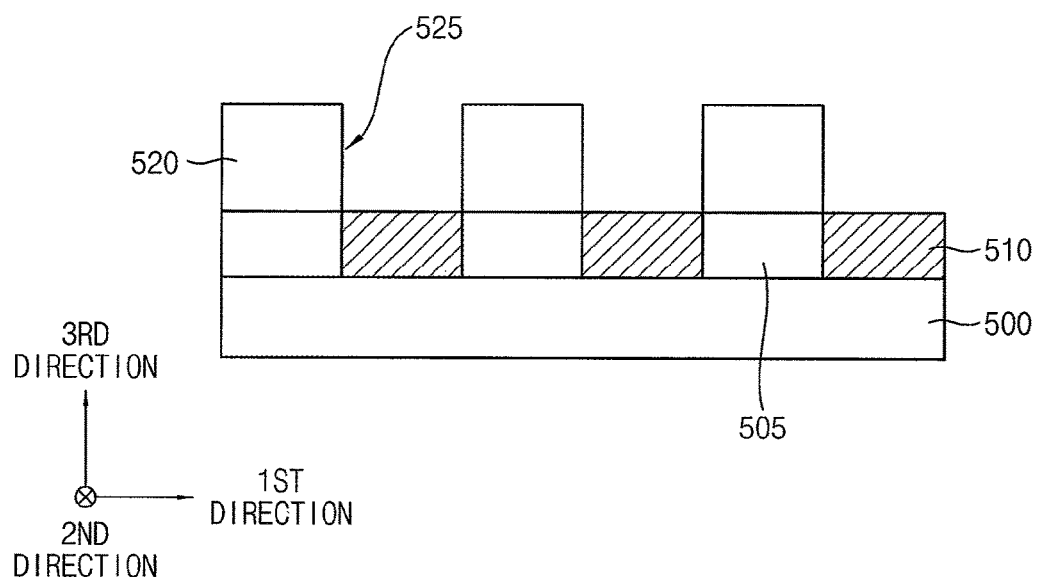
Figure 43B:
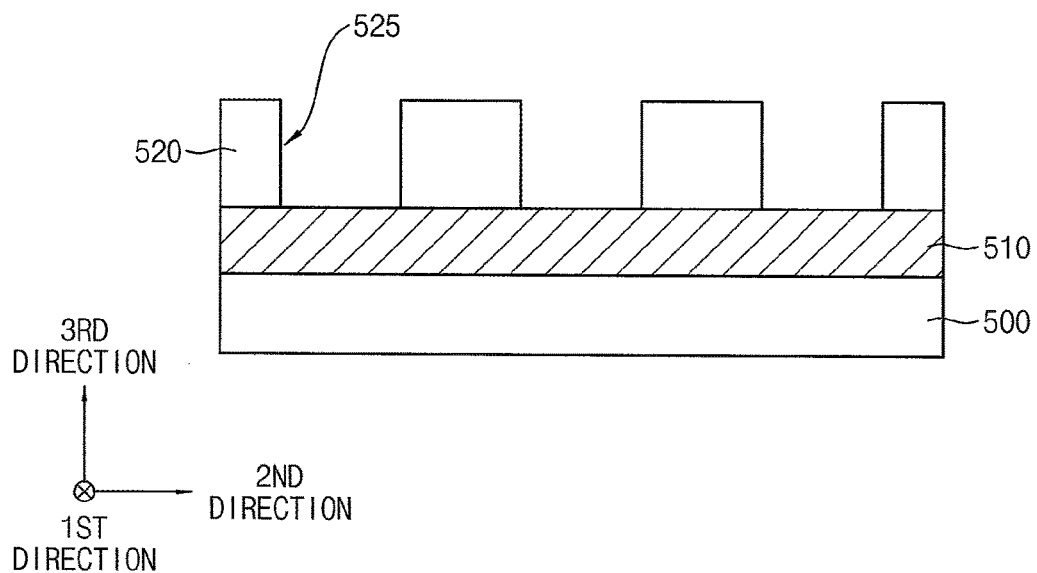

Referring to FIGS. 43A and 43B, a plurality of first conductive lines 510 each extending in the second direction may be formed on a substrate 500. A plurality of first insulation patterns 505 may be formed in the first direction on the substrate 500 to fill spaces between the first conductive lines 510, respectively.

A first lower insulation layer 520 may be formed on the first conductive lines 510 and the first insulation patterns 505. The first lower insulation layer 520 may be partially etched to form a first hole 525 exposing an upper surface of the first conductive line 510.

In example embodiments, a plurality of first holes 525 may be formed in the second direction on each of the first conductive lines 510.

Figure 44A:
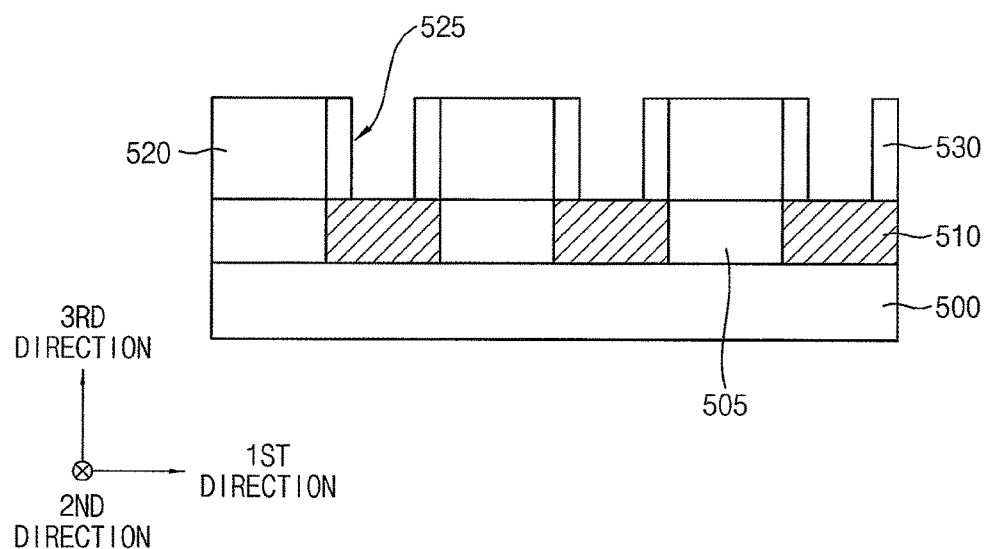
Figure 44B:
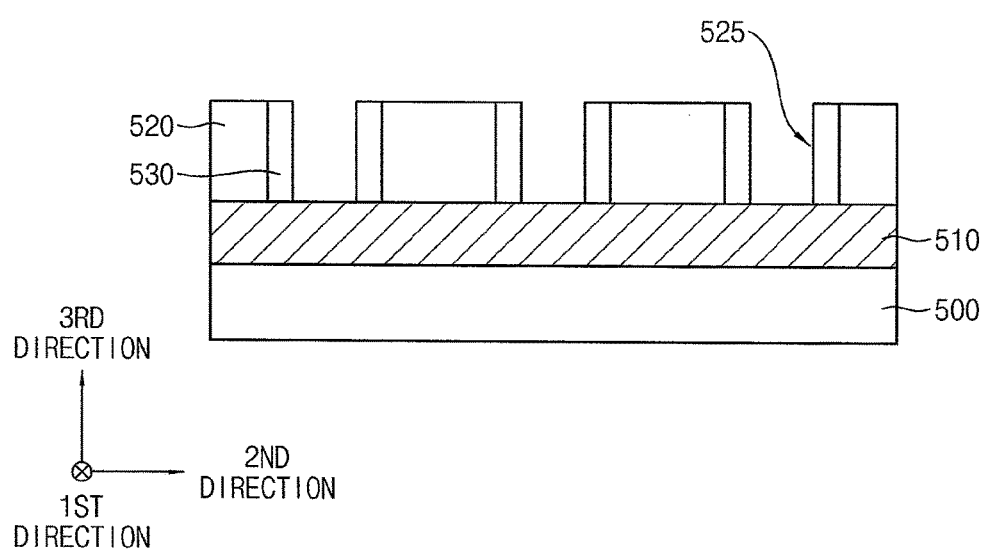

Referring to FIGS. 44A and 44B, a first spacer 530 may be formed on a sidewall of the first hole 525.

For example, a first spacer layer may be formed of, e.g., silicon nitride or silicon oxynitride on the exposed upper surface of the first conductive line 510, sidewalls of the first holes 525 and an upper surface of the first lower insulation layer 520. Portions of the first spacer layer on the upper surfaces of the first conductive line 510 and the first lower insulation layer 520 may be removed by an anisotropic etching process to form the first spacer 530.

Figure 45A:
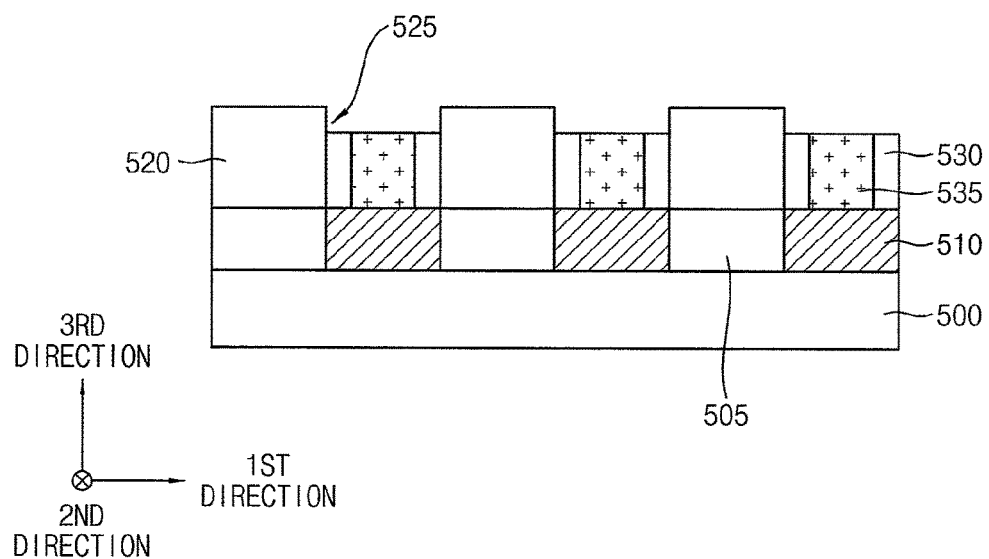
Figure 45B:
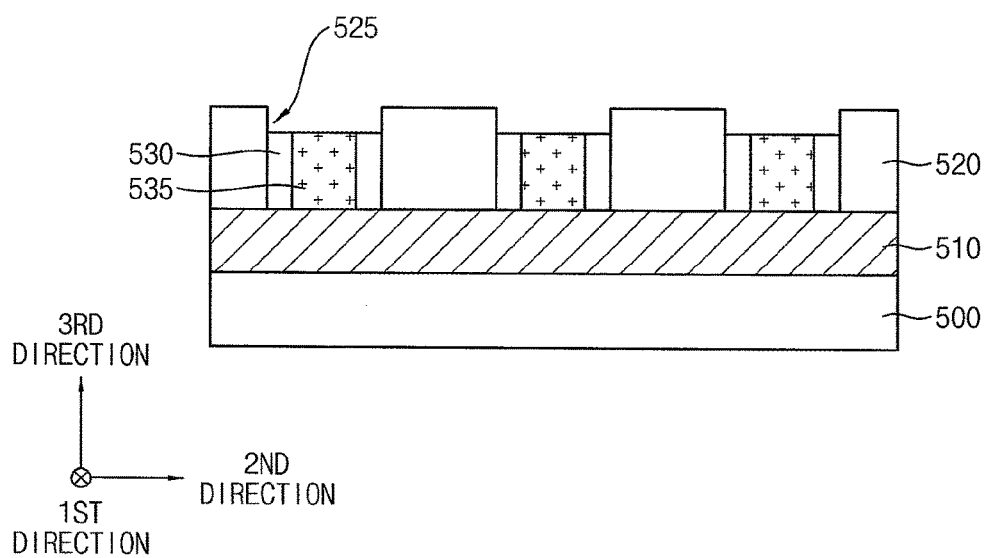

Referring to FIGS. 45A and 45B, a first variable resistance pattern 535 may be formed to partially fill the first hole 525.

For example, a first variable resistance material layer may be formed on the upper surfaces of the first conductive line 510 and the first lower insulation layer 520 to sufficiently fill the first hole 525. The first variable resistance material layer may be planarized until an upper surface of the first lower insulation layer 520 may be exposed by a CMP process. Portions of the first variable resistance material layer and the first spacer 530 at an upper portion of the first hole 525 may be removed by an etch back process. Thus, a first variable resistance pattern 535 of which a sidewall may be surrounded by the first spacer 530 may be formed.

Figure 46A:
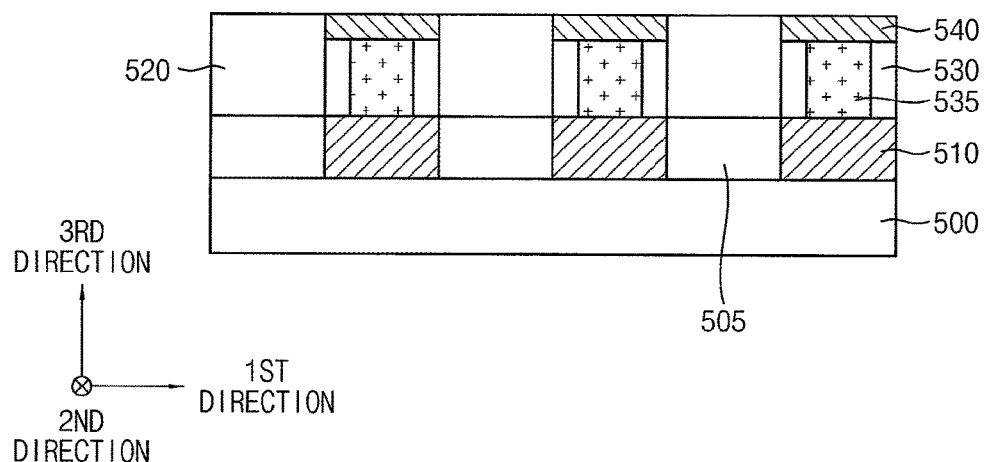
Figure 46B:
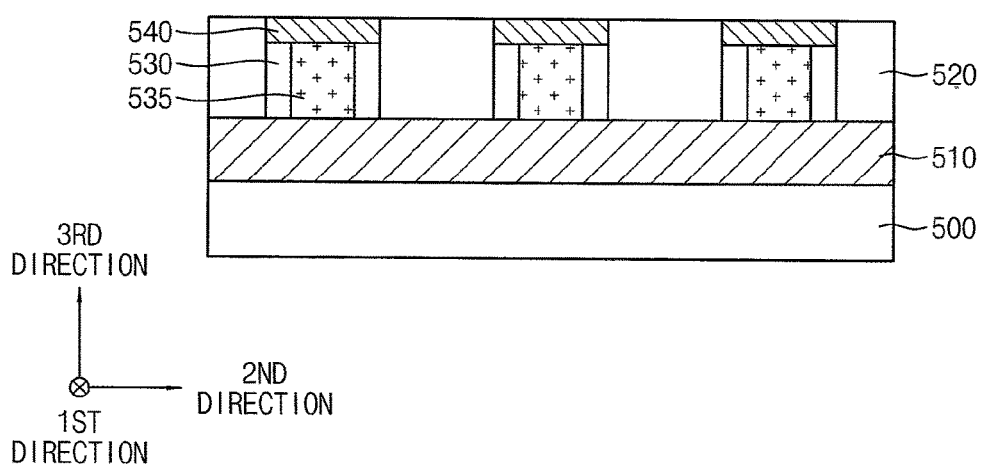

Referring to FIGS. 46A and 46B, a first intermediate electrode 540 may be formed at the upper portion of the first hole 525 to cover upper surfaces of the first spacer 530 and the first variable resistance pattern 535.

For example, a first intermediate electrode layer may be formed on the first variable resistance pattern 535, the first spacer 530, and the first lower insulation layer 520 to fill the upper portion of the first hole 525. The first intermediate electrode layer may be planarized until an upper surface of the first lower insulation layer 520 may be exposed by a CMP process to form the first intermediate electrode 540 filling the remaining portion of the first hole 525.

As illustrated above, the first variable resistance pattern 535 may be formed to have a reduced width and/or area by the first spacer 530 through a damascene process. The first intermediate electrode 540 may be self-aligned by the first hole 525.

Figure 47A:
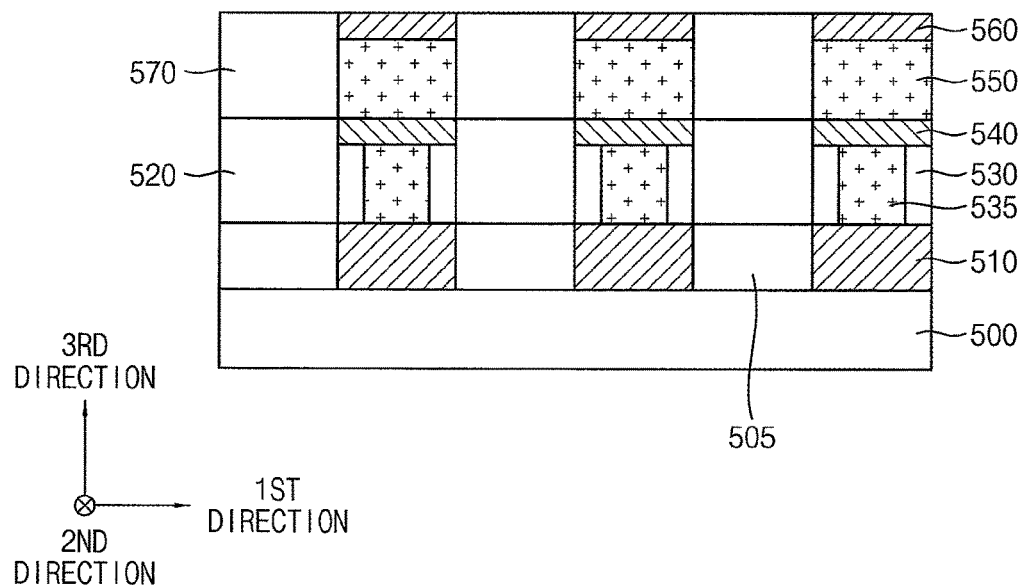
Figure 47B:
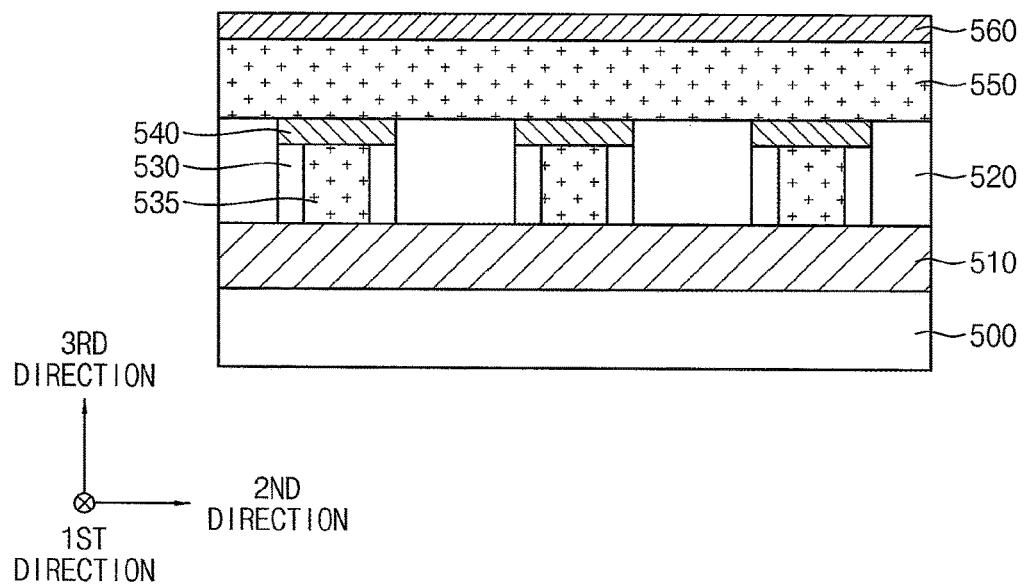

Referring to FIGS. 47A and 47B, a first selection material layer 550 and a first upper electrode layer 560 may be sequentially formed on the first lower insulation layer 520 and the first intermediate electrode 540. The first upper electrode layer 560 and the first selection material layer 550 may be etched along the second direction. By the etching process, each of the first upper electrode layer 560 and the first selection material layer 550 may be transformed into a line pattern extending in the second direction on the first intermediate electrode 510 and the first lower insulation layer 520.

A first insulating interlayer 570 may be formed on the first lower insulation layer 520 to fill spaces between the line patterns in the first direction.

Figure 48A:
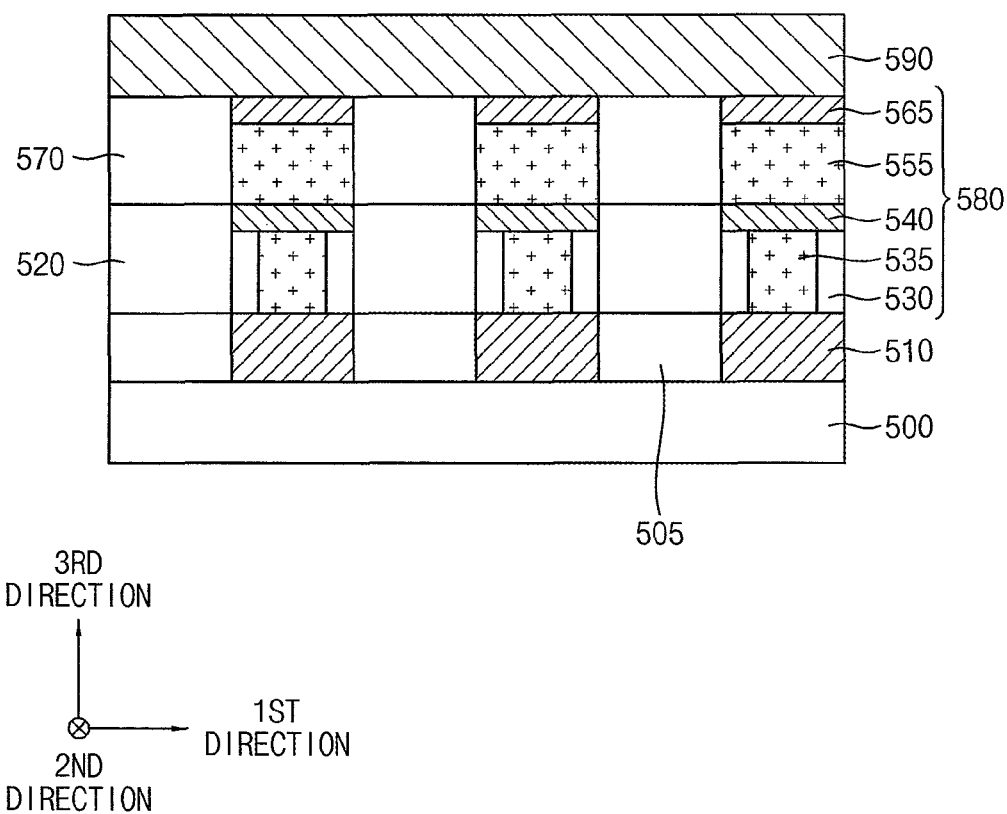
Figure 48B:
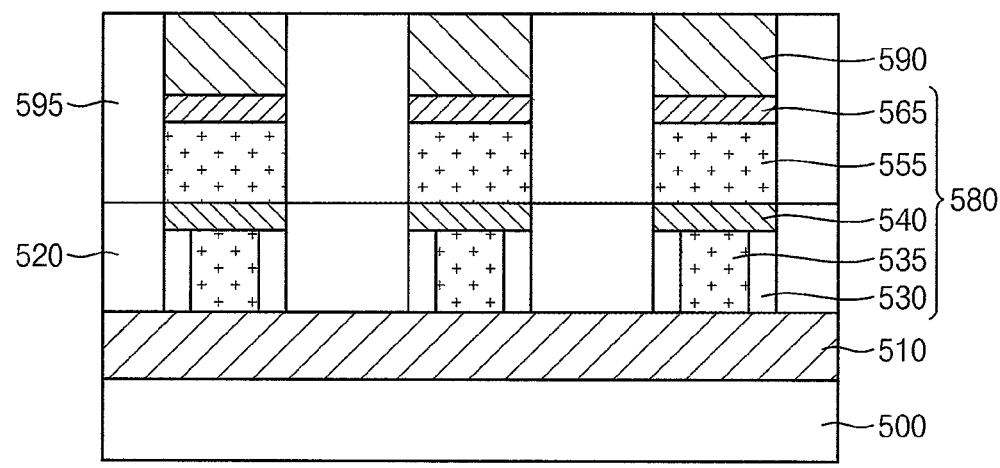
Figure 48B:
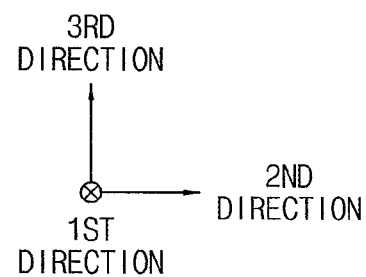

Referring to FIGS. 48A and 48B, a second conductive layer may be formed on the first insulating interlayer 570 and the first upper electrode layer 560. The second conductive layer may be etched to form a plurality of second conductive lines 590 each extending in the first direction.

The first upper electrode layer 560 and the first selection material layer 550 may be etched using the second conductive lines 590 as an etching mask to form a first upper electrode 565 and a first selection pattern 555, respectively.

A second insulating interlayer 595 may be formed between neighboring ones of the first upper electrodes 565 and between neighboring ones of the first selection patterns 555 to extend in the first direction. The first and second insulating interlayers 570 and 595 may cross each other, and may be merged with each other.

By the above processes, a first memory cell 580 including the first variable resistance pattern 535, the first intermediate electrode 540, the first selection pattern 555 and the first upper electrode 565 sequentially stacked may be formed in each area where the first and second conductive lines 510 and 590 overlap with each other in the third direction.

Figure 49A:
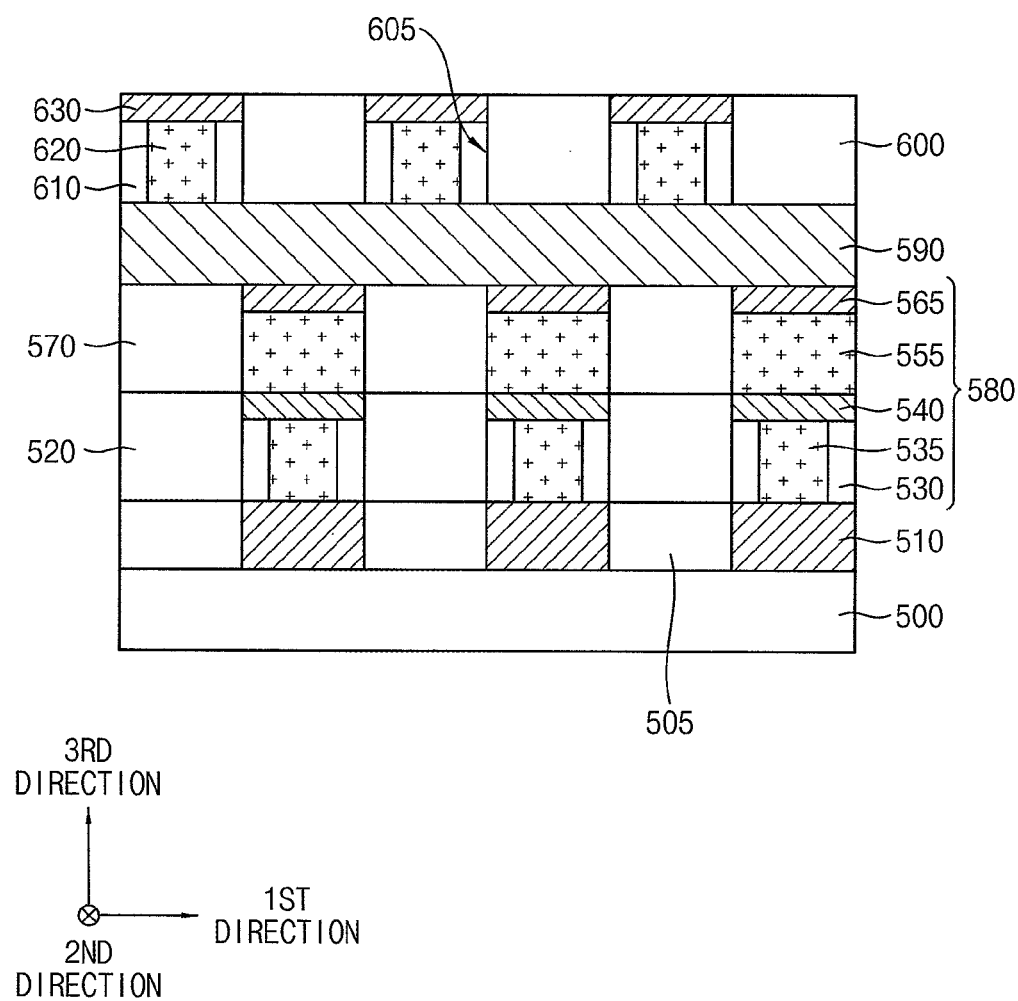
Figure 49B:
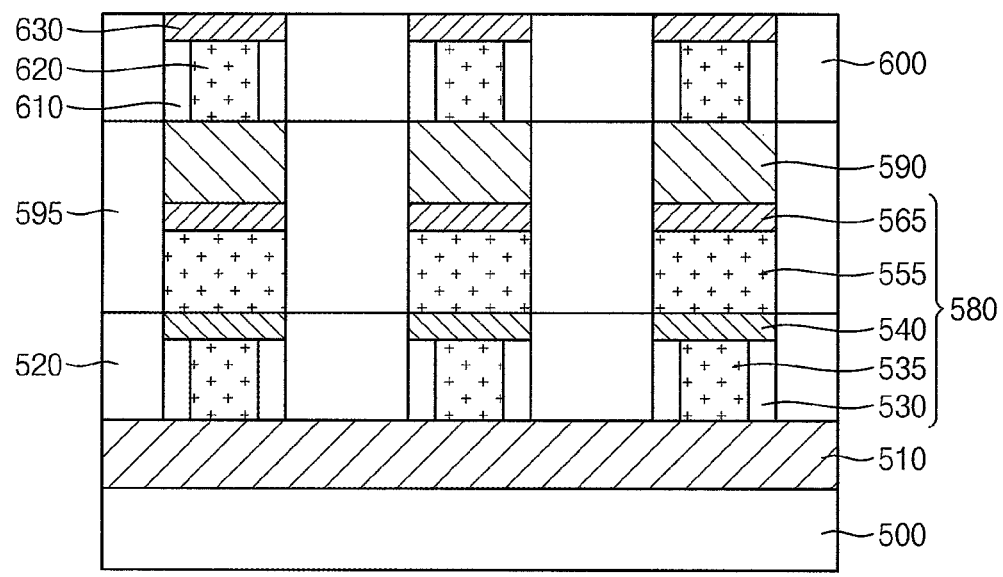
Figure 49B:
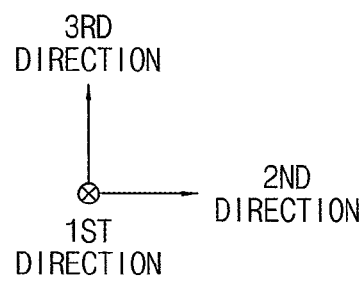

Referring to FIGS. 49A and 49B, a second lower insulation layer 600 may be formed on the second conductive line 590 and the second insulating interlayer 595. The second lower insulation layer 600 may be partially etched to form a second hole 605 partially exposing an upper surface of the second conductive line 590. A plurality of second holes 605 may be formed in the first direction on the second conductive line 590.

In example embodiments, the second holes 605 may be shifted from the first holes 525 in the first direction by a given distance.

Processes that are the same as, substantially the same as, or similar to, those illustrated with reference to FIGS. 44A and 44B to 46A and 46B may be performed. Thus, a second spacer 610 may be formed on a sidewall of the second hole 605, and a second variable resistance pattern 620 may be formed. A sidewall of the second variable resistance pattern 620 may be surrounded by the second spacer 610. A second intermediate electrode 630 may be formed at an upper portion of the second hole 605 to cover upper surfaces of the second spacer 610 and the second variable resistance pattern 620.

Figure 50A:
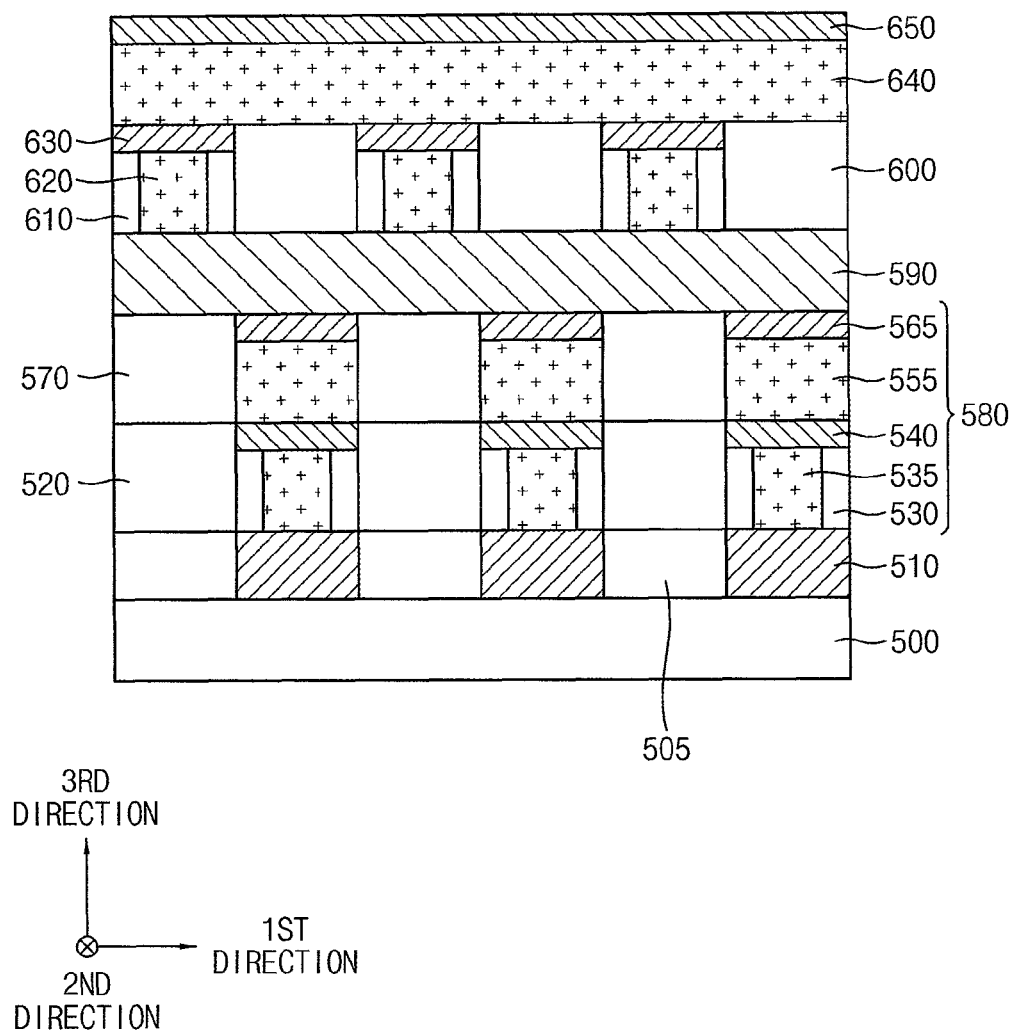
Figure 50B:
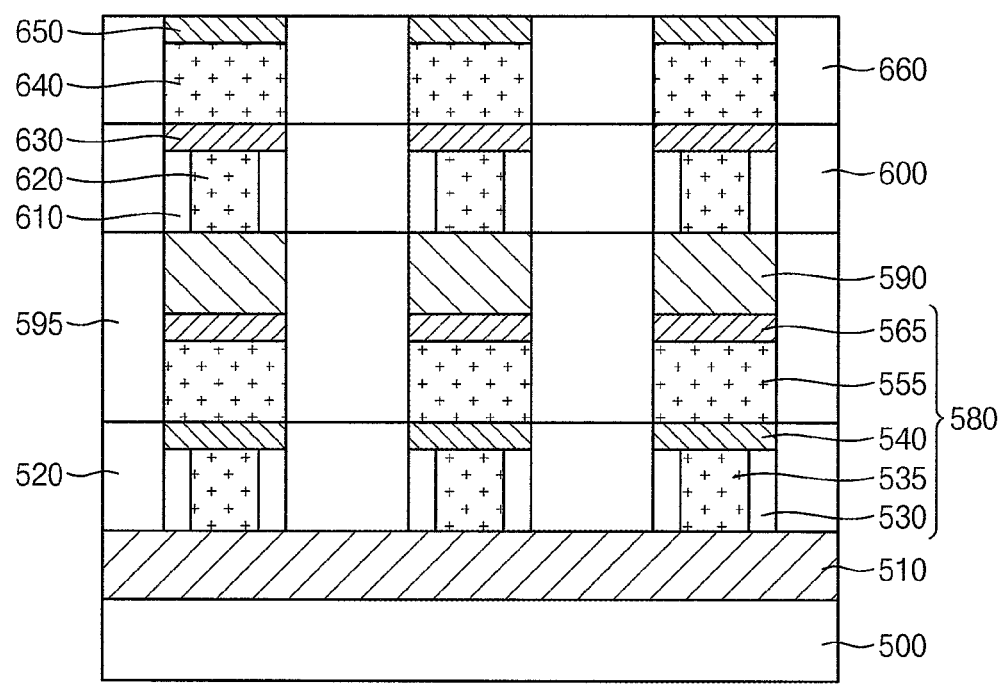
Figure 50B:
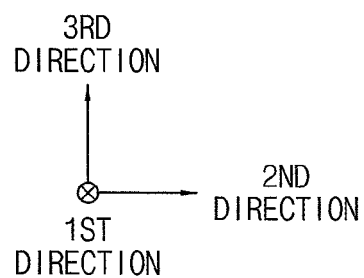

Referring to FIGS. 50A and 50B, a second selection material layer 640 and a second upper electrode layer 650 may be sequentially formed on the second lower insulation layer 600 and the second intermediate electrode 630. The second upper electrode layer 650 and the second selection material layer 640 may be etched along the first direction. By the etching process, each of the second upper electrode layer 650 and the second selection material layer 640 may be transformed into a line pattern extending in the first direction on the second intermediate electrode 630 and the second lower insulation layer 600.

A third insulating interlayer 660 may be formed on the second lower insulation layer to fill spaces between the line patterns.

Referring to FIGS. 41 and 42 again, a third conductive layer may be formed on the third insulating interlayer 660 and the second upper electrode layer 650. The third conductive layer may be etched to form a plurality of third conductive lines 690 each extending in the second direction.

The second upper electrode layer 650 and the second selection material layer 640 may be etched using the third conductive lines 690 as an etching mask to form a second upper electrode 655 and a second selection pattern 645, respectively.

A fourth insulating interlayer 695 may be formed between neighboring ones of the second upper electrodes 655 and between neighboring ones of the second selection patterns 645 to extend in the second direction. The third and fourth insulating interlayers 660 and 695 may cross each other, and may be merged with each other.

By the above processes, a second memory cell 680 including the second variable resistance pattern 620, the second intermediate electrode 630, the second selection pattern 645 and the second upper electrode 655 sequentially stacked may be formed in each area where the second and third conductive lines 590 and 690 overlap with each other in the third direction.

Figure 51:
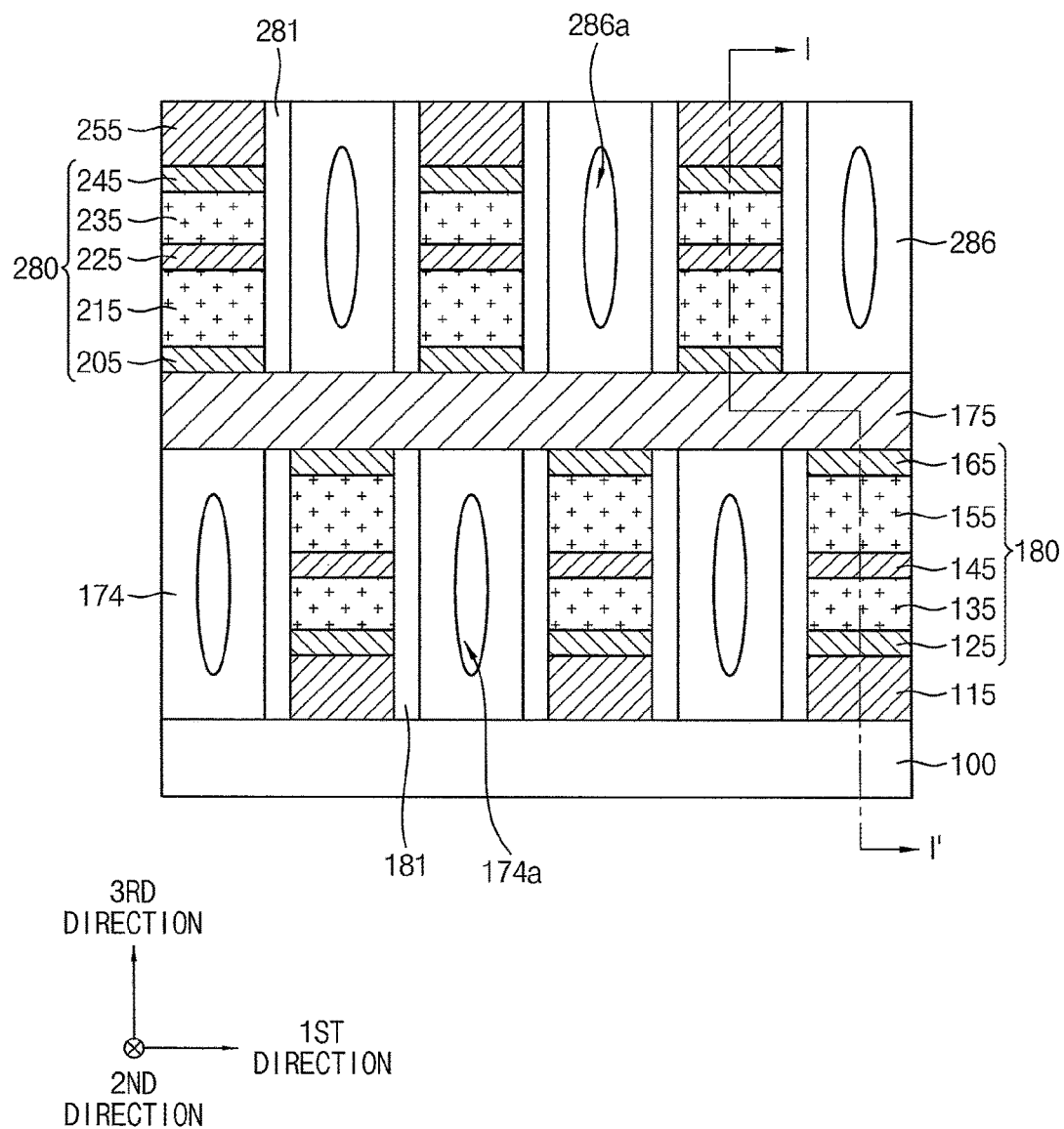
FIGS. 51 and 52 are cross-sectional views illustrating another variable resistance memory device in accordance with example embodiments.
Figure 52:
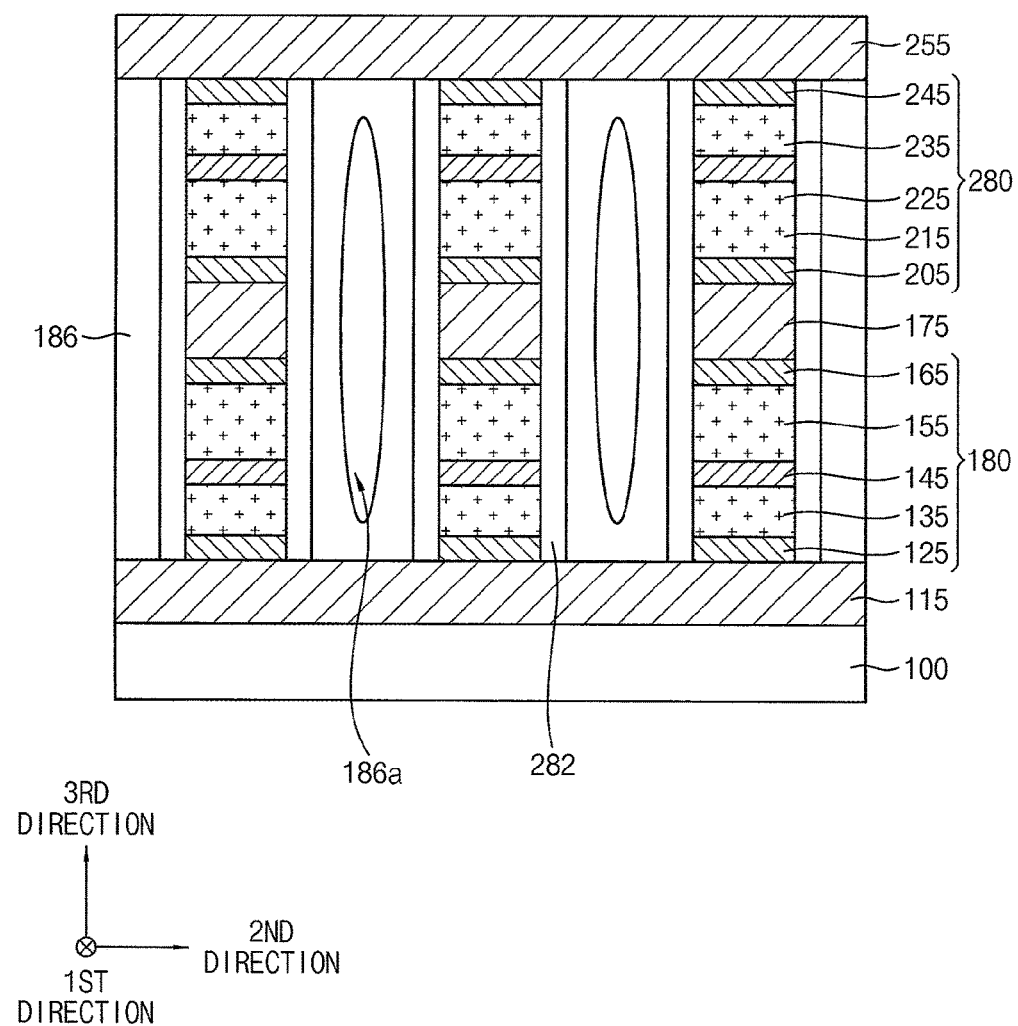

FIGS. 51 and 52 are cross-sectional views illustrating another variable resistance memory device in accordance with example embodiments. More particularly, FIG. 51 is a cross-sectional view of the variable resistance memory device taken along the first direction, and FIG. 52 is a cross-sectional view of the variable resistance memory device taken along a line I-I' of FIG. 51.

The variable resistance memory device may be substantially the same as or similar to that illustrated with reference to FIGS. 1 to 3, except that the variable resistance memory device may further include air gaps and spacers. Thus, like reference numerals refer to like elements, and detailed descriptions thereon may be omitted below in the interest of brevity.

Referring to FIGS. 51 and 52, a first cross-point cell array may be defined by the first memory cells 180 in areas where the first and second conductive lines 115 and 175 overlap with each other in the third direction. Additionally, a second cross-point cell array may be defined by the second memory cells 280 in areas where the second and third conductive lines 175 and 255 overlap with each other in the third direction.

The first insulation pattern 174 may extend in the second direction, and may divide or insulate the first memory cell columns of the first cross-point cell array from each other. In example embodiments, a first spacer 181 may be formed on each of opposite sidewalls of the first memory cell 180 and the first conductive line 115 in the first direction. The first insulation pattern 174 may be sandwiched by the opposite first spacers 181.

In example embodiments, a space between neighboring ones of the first memory cell columns may be narrowed by the first spacer 181, and thus a first air gap 174a may be formed in the first insulation pattern 174. The first air gap 174a may extend in the second direction between neighboring ones of the first memory cell columns in the first direction.

A second insulation pattern 186 may extend in the first direction, and may penetrate through the first and second cross-point cell arrays and the second conductive line 175. In an example embodiment, a second spacer 282 may be formed on each of opposite sidewalls of the first memory cell 180, the second memory cell 280 and the second conductive line 175 in the second direction. The second insulation pattern 186 may be sandwiched by the opposite second spacers 282.

In example embodiments, a space between neighboring ones of the first memory cell rows or a space between neighboring ones of the second memory cell rows may be narrowed by the second spacer 282, and thus a second air gap 186a may be formed in the second insulation pattern 186. The second air gap 186a may extend in the first direction, and may be commonly adjacent the first and second cross-point cell arrays in the third direction.

A third insulation pattern 286 may extend in the second direction, and may divide or insulate the second memory cell columns of the second cross-point cell array from each other. In example embodiments, a third spacer 281 may be formed on each of opposite sidewalls of the second memory cell 280 and the third conductive line 255 in the first direction. The third insulation pattern 286 may be sandwiched by the opposite third spacers 281.

In example embodiments, a space between neighboring ones of the second memory cell columns may be narrowed by the third spacer 281, and thus a third air gap 286a may be formed in the third insulation pattern 286. The third air gap 286a may extend in the second direction between neighboring ones of the second memory cell columns in the first direction.

The first to third air gaps 174a, 186a and 286a may cross each other or connected to each other. The first to third air gaps 174a, 186a and 286a may include, e.g., silicon nitride, silicon oxynitride, etc.

As illustrated above, according to one or more example embodiments, the thermal disturbance and/or interference in the horizontal direction in each cross-point cell array may be reduced and/or prevented by the air gaps. Additionally, the first and second memory cells 180 and 280 may have the zigzag layout, and thus the thermal disturbance in the vertical direction may be also reduced and/or prevented.

Accordingly, the variable resistance memory device may have improved and/or enhanced operational reliability.

Figure 53:
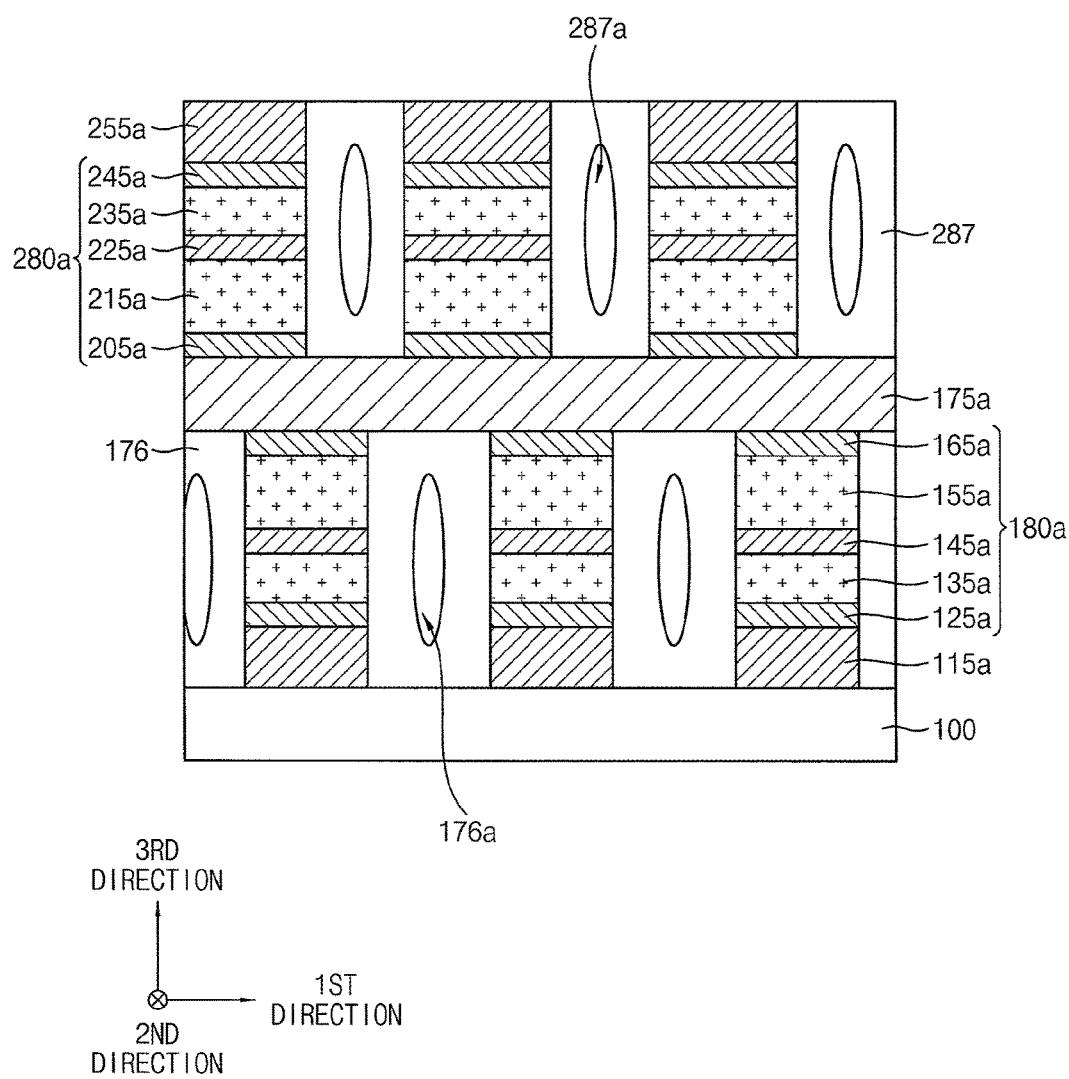

FIG. 53 is a cross-sectional view illustrating another variable resistance memory device in accordance with example embodiments.

The variable resistance memory device may be substantially the same as or similar to that illustrated with reference to FIGS. 13 and 14, except that the variable resistance memory device may further include air gaps. Thus, like reference numerals refer to like elements, and detailed descriptions thereon may be omitted below in the interest of brevity.

Referring to FIG. 53, as illustrated with reference with FIGS. 13 and 14, the first and second memory cells 180a and 280a may partially overlap with each other in a plan view. Thus, distances between the first and second memory cells 180a and 280a may be reduced when compared to those of FIGS. 51 and 52.

When the first insulation pattern 176 is formed, the first air gap 176a may be formed in the first insulation pattern 176 even with no spacers therein, by controlling the gap-filling conditions. When a third insulation pattern 287 is formed, a third air gap 287a may be formed in the third insulation pattern 287 to extend in the second direction.

As illustrated with reference to FIG. 52, the second air gap (not shown) may be further formed in the second insulation pattern (not shown) to extend in the first direction, which may be commonly adjacent the first and second cross-point cell arrays.

In the variable resistance memory device in accordance with example embodiments, the stacked memory cells of the cross-point cell arrays may be disposed to be shifted from each other, and thus the operational reliability of the memory cells may be improved and/or enhanced, and the characteristic distribution may be reduced. Accordingly, the variable resistance memory device may be effectively applied to one or more of PRAM devices, ReRAM devices, MRAM devices, etc.

In some example embodiments, one or more of the variable resistance patterns may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, one or more of the variable resistance patterns may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the one or more of the variable resistance patterns may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the one or more of the variable resistance patterns are described above as being formed primarily of ternary phase-change chalcogenide alloys, the chalcogenide alloy of the one or more of the variable resistance patterns may be selected from a binary phase-change chalcogenide alloy or a quaternary phase-change chalcogenide alloy. Example binary phase-change chalcogenide alloys may include one or more of Ga—Sb, In—Sb, In—Se, Sb2-Te3 or Ge—Te alloys; example quaternary phase-change chalcogenide alloys may include one or more of an Ag—In—Sb—Te, (Ge—Sn)—Sb—Te, Ge—Sb—(Se—Te) or Te81-Ge15-Sb2-S2 alloy, for example.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable resistance memory device, comprising:
   first conductive lines arranged in a first direction on a substrate, each of the first conductive lines extending in a second direction crossing the first direction, and the first and second directions being parallel to an upper surface of the substrate;
   second conductive lines arranged in the second direction on the first conductive lines, each of the second conductive lines extending in the first direction;
   third conductive lines arranged in the first direction on the second conductive lines, each of the third conductive lines extending in the second direction;
   first memory cells between the first and second conductive lines, the first memory cells at respective areas at which the first and second conductive lines overlap in a third direction, the third direction substantially perpendicular to the upper surface of the substrate, and each of the first memory cells including a first variable resistance pattern and a first selection pattern; and
   second memory cells between the second and third conductive lines, the second memory cells at respective areas at which the second and third conductive lines overlap in the third direction, and each of the second memory cells including a second variable resistance pattern and a second selection pattern,
   wherein a lower surface of the at least one of the second memory cells partially overlaps an upper surface of the closest one of the first memory cells in the third direction.

2. The variable resistance memory device of claim 1, wherein the second memory cells are shifted from the first memory cells by a width of each of the first memory cells.

3. The variable resistance memory device of claim 1, wherein
   a plurality of the first memory cells arranged in the first direction define a first memory cell row;
   a plurality of the second memory cells arranged in the first direction define a second memory cell row; and
   the plurality of the first memory cells of the first memory cell row are between the plurality of the second memory cells of the second memory cell row in a plan view.

4. The variable resistance memory device of claim 1, wherein
   each of the first memory cells further includes a first intermediate electrode between the first variable resistance pattern and the first selection pattern; and
   each of the second memory cells further includes a second intermediate electrode between the second variable resistance pattern and the second selection pattern.

5. The variable resistance memory device of claim 4, wherein
   the first variable resistance pattern has an area less than an area of the first intermediate electrode in a plan view; and
   the second variable resistance pattern has an area less than an area of the second intermediate electrode in the plan view.

6. The variable resistance memory device of claim 5, further comprising:

a spacer on a sidewall of each of the first and second variable resistance patterns.

7. The variable resistance memory device of claim 4, wherein
the first selection pattern has an area less than an area of the first intermediate electrode in a plan view; and
the second selection pattern has an area less than an area of the second intermediate electrode in the plan view.

8. The variable resistance memory device of claim 4, wherein
the first variable resistance pattern is on the first selection pattern; and
the second variable resistance pattern is on the second selection pattern.

9. The variable resistance memory device of claim 8, wherein
each of the first memory cells further includes a first upper electrode and a first lower electrode, the first upper electrode between the first variable resistance pattern and a corresponding one of the second conductive lines, and the first lower electrode between the first selection pattern and a corresponding one of the first conductive lines; and
each of the second memory cells further includes a second upper electrode and a second lower electrode, the second upper electrode between the second variable resistance pattern and a corresponding one of the third conductive lines, and the second lower electrode between the second selection pattern and a corresponding one of the second conductive lines.

10. The variable resistance memory device of claim 4, wherein
the first selection pattern is on the first variable resistance pattern; and
the second selection pattern is on the second variable resistance pattern.

11. The variable resistance memory device of claim 10, wherein
each of the first memory cells further includes a first upper electrode and a first lower electrode, the first upper electrode between the first selection pattern and a corresponding one of the second conductive lines, and the first lower electrode between the first variable resistance pattern and a corresponding one of the first conductive lines; and
each of the second memory cells further includes a second upper electrode and a second lower electrode, the second upper electrode between the second selection pattern and a corresponding one of the third conductive lines, and the second lower electrode between the second variable resistance pattern and a corresponding one of the second conductive lines.

12. A variable resistance memory device, comprising:
first conductive lines arranged in a first direction on a substrate, each of the first conductive lines extending in a second direction crossing the first direction, and the first and second directions being parallel to an upper surface of the substrate;
second conductive lines arranged in the second direction on the first conductive lines, each of the second conductive lines extending in the first direction;
third conductive lines arranged in the first direction on the second conductive lines, each of the third conductive lines extending in the second direction;
first memory cells between the first and second conductive lines, the first memory cells at respective areas at which the first and second conductive lines overlap in a third direction, the third direction substantially perpendicular to the upper surface of the substrate, and each of the first memory cells including a first variable resistance pattern and a first selection pattern; and
second memory cells between the second and third conductive lines, the second memory cells at respective areas at which the second and third conductive lines overlap in the third direction, and each of the second memory cells including a second variable resistance pattern and a second selection pattern; wherein
a portion of a lower surface of at least one of the second memory cells overlaps a portion of an upper surface of at least one of the first memory cells in the third direction, and
the overlapping portion of the upper surface of the at least one of the first memory cells is less than or equal to half of an area of each of the first memory cells in a plan view.

13. The variable resistance memory device of claim 12, wherein
each of the first memory cells further includes a first lower electrode contacting the first selection pattern or the first variable resistance pattern; and
each of the second memory cells further includes a second lower electrode contacting the second selection pattern or the second variable resistance pattern.

14. A variable resistance memory device comprising:
a plurality of memory cells arranged in a plurality of rows and columns on a surface of a substrate, the plurality of rows of memory cells arranged in a first direction parallel to the surface of the substrate and the plurality of columns of memory cells arranged in a second direction parallel to the surface of the substrate, at least a first of the plurality of rows of memory cells including a plurality of upper memory cells and a plurality of lower memory cells, the plurality of upper memory cells arranged at a first distance from the surface of the substrate in a third direction, and the plurality of lower memory cells arranged at a second distance from the surface of the substrate in the third direction; wherein
the first direction, the second direction and the third direction are perpendicular to one another,
the plurality of upper memory cells are partially overlapped not aligned with the plurality of lower memory cells in the third direction,
the first distance is greater than the second distance,
wherein the plurality of upper memory cells and the plurality of lower memory cells are arranged alternately in the second direction,
the plurality of upper memory cells are spaced apart from one another in the second direction by a width of a first of the plurality of lower memory cells, and
the plurality of lower memory cells are spaced apart from one another in the second direction by a width of a first of the plurality of upper memory cells.

15. The variable resistance memory device of claim 14, wherein the plurality of upper memory cells, at most, only partially overlap the plurality of lower memory cells in the third direction.

16. The variable resistance memory device of claim 14, further comprising:
a plurality of first conductive lines arranged in the second direction, each of the plurality of first conductive lines contacting a corresponding lower memory cell among the plurality of lower memory cells, and each of the plurality of first conductive lines extending in the first direction;

a second conductive line extending in the second direction between the plurality of upper memory cells and the plurality of lower memory cells, the second conductive line contacting the plurality of upper memory cells and the plurality of lower memory cells; and
a plurality of third conductive lines arranged in the second direction, each of the plurality of third conductive lines contacting a corresponding upper memory cell among the plurality of upper memory cells, and each of the plurality of third conductive lines extending in the first direction.

* * * * *